(12) United States Patent
Nomura et al.

(10) Patent No.: US 10,566,941 B2
(45) Date of Patent: Feb. 18, 2020

(54) INTEGRATED CIRCUIT AND METHOD OF MANUFACTURING INTEGRATED CIRCUIT

(71) Applicant: ROHM CO., LTD., Kyoto (JP)

(72) Inventors: Naohiro Nomura, Kyoto (JP); Sachito Horiuchi, Kyoto (JP); Kunihiko Iwamoto, Kyoto (JP)

(73) Assignee: ROHM CO., LTD., Tokyo (JP)

( * ) Notice: Subject to any disclaimer, the term of this patent is extended or adjusted under 35 U.S.C. 154(b) by 0 days.

(21) Appl. No.: 16/045,120

(22) Filed: Jul. 25, 2018

(65) Prior Publication Data

US 2019/0036500 A1 Jan. 31, 2019

(30) Foreign Application Priority Data

Jul. 26, 2017 (JP) ................................. 2017-144864

(51) Int. Cl.
*H03F 3/187* (2006.01)
*H03F 3/45* (2006.01)
*H03F 3/30* (2006.01)
*H01L 21/762* (2006.01)
*H01L 21/8249* (2006.01)

(52) U.S. Cl.
CPC ... *H03F 3/45183* (2013.01); *H01L 21/76227* (2013.01); *H01L 21/76229* (2013.01); *H01L 21/8249* (2013.01); *H03F 3/3022* (2013.01)

(58) Field of Classification Search
CPC .................................. H03F 3/187; H03F 3/45
USPC .................................................. 330/307, 255
See application file for complete search history.

(56) References Cited

U.S. PATENT DOCUMENTS

| | | | | | |
|---|---|---|---|---|---|
| 3,976,951 A | * | 8/1976 | Ishigaki | .................. | H01L 29/00 330/254 |
| 4,553,098 A | * | 11/1985 | Yoh | .......................... | G05F 3/245 257/369 |
| 5,159,260 A | * | 10/1992 | Yoh | .......................... | G11C 5/143 257/E27.06 |

FOREIGN PATENT DOCUMENTS

JP 2011172203 A 9/2011

* cited by examiner

*Primary Examiner* — Henry Choe
(74) *Attorney, Agent, or Firm* — Cantor Colburn LLP

(57) ABSTRACT

An integrated circuit having a plurality of miniaturized transistors, wherein the plurality of transistors include: high concentration transistors which include channel regions having impurity concentrations of a first concentration; and low concentration transistors which include channel regions having impurity concentrations of a second concentration lower than the first concentration.

32 Claims, 29 Drawing Sheets

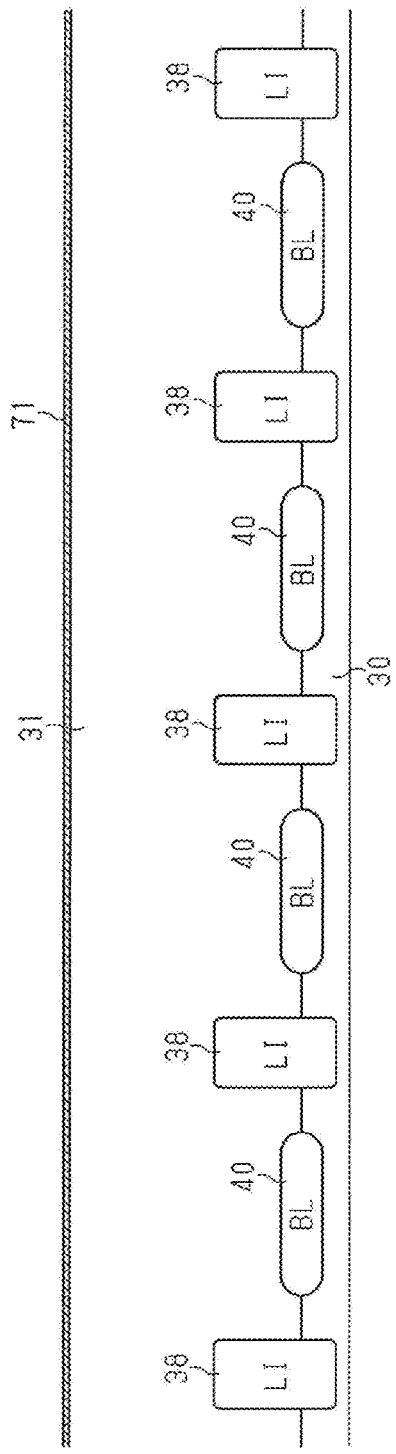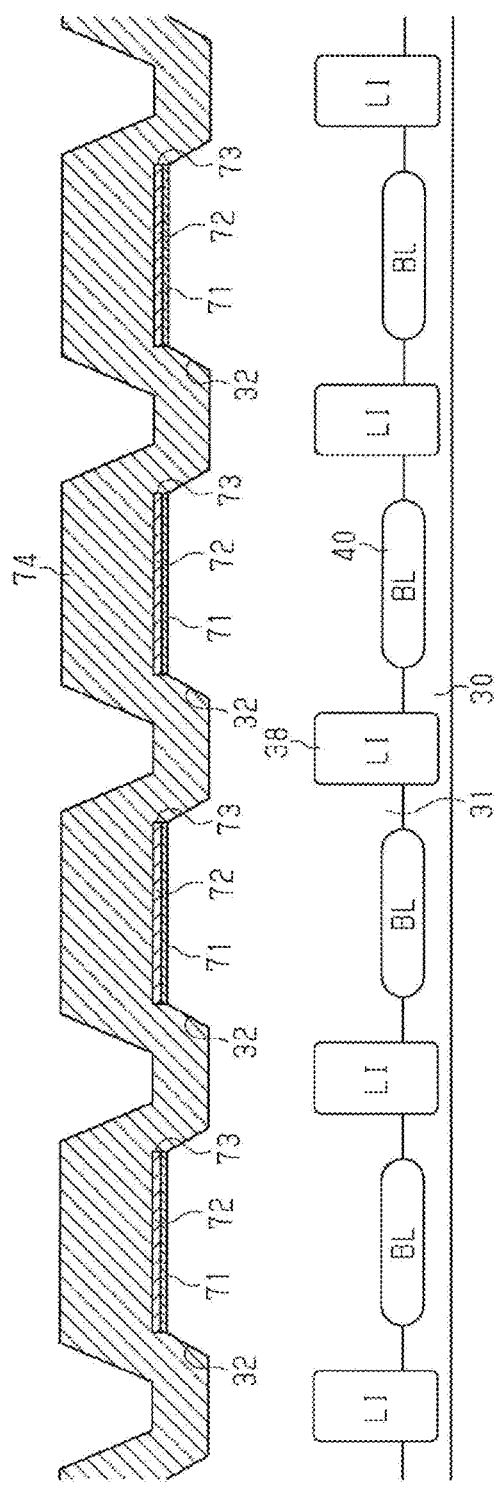

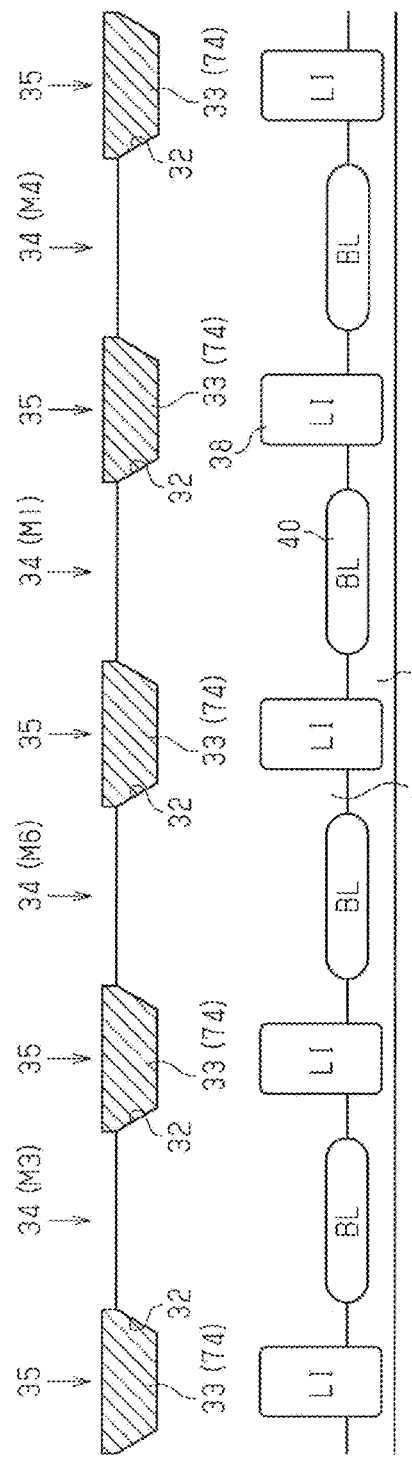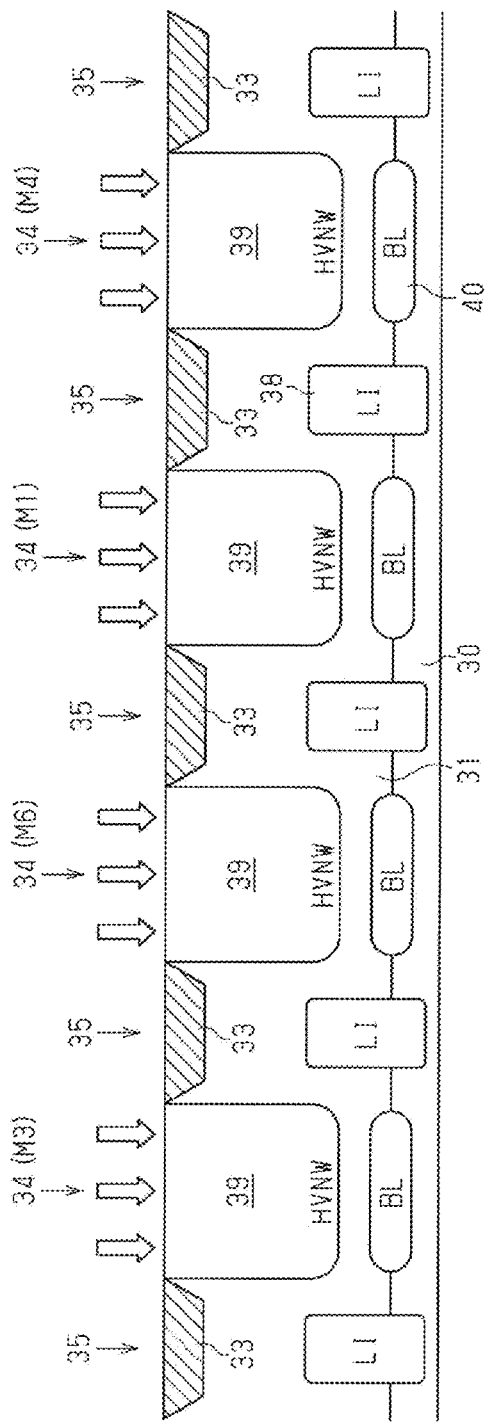

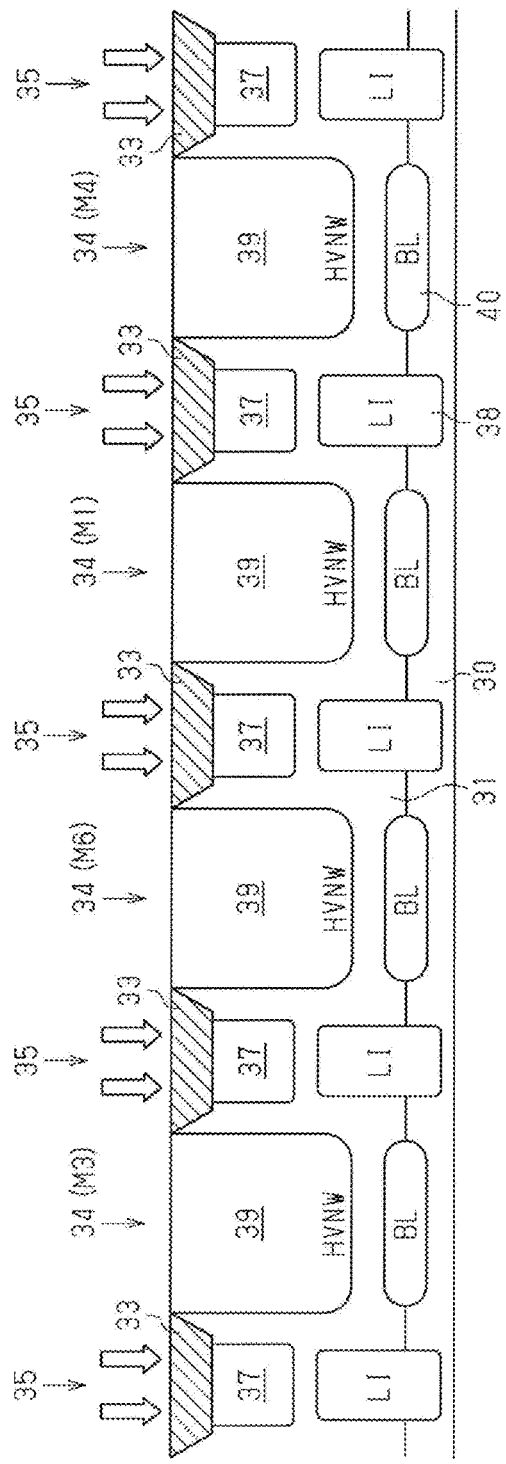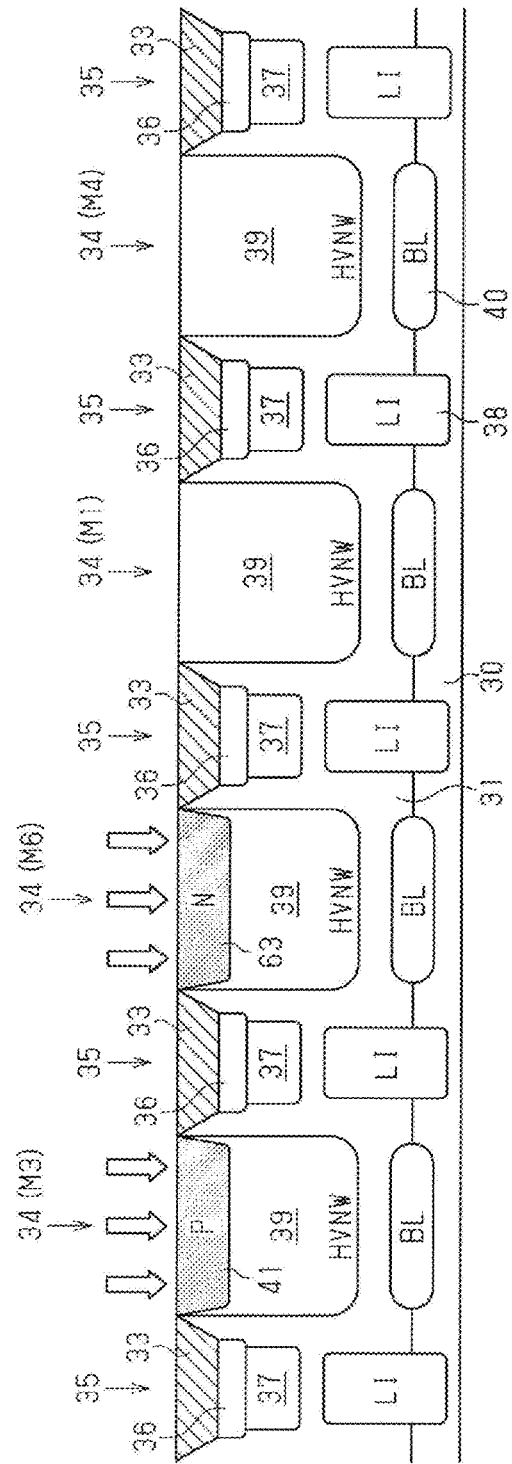

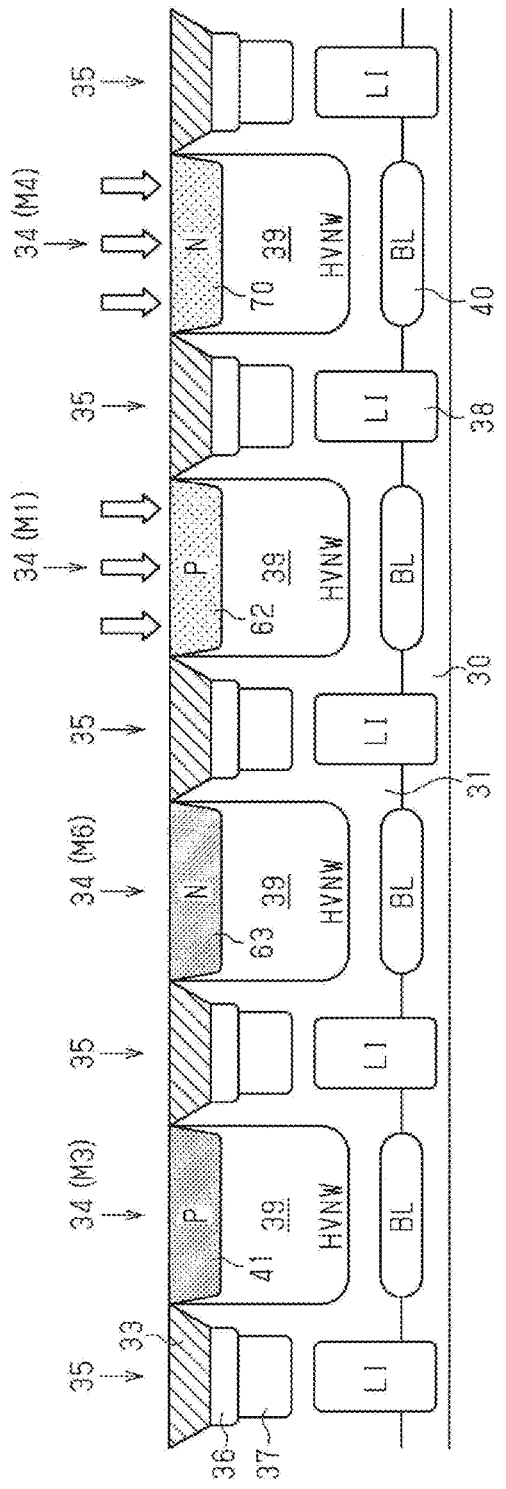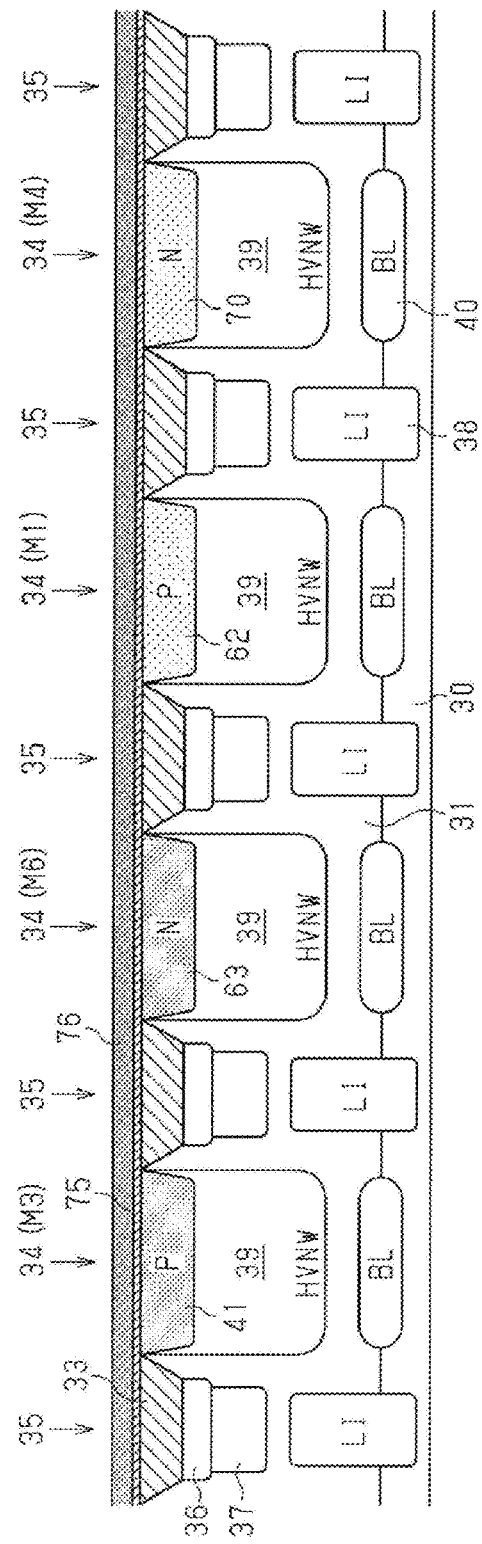

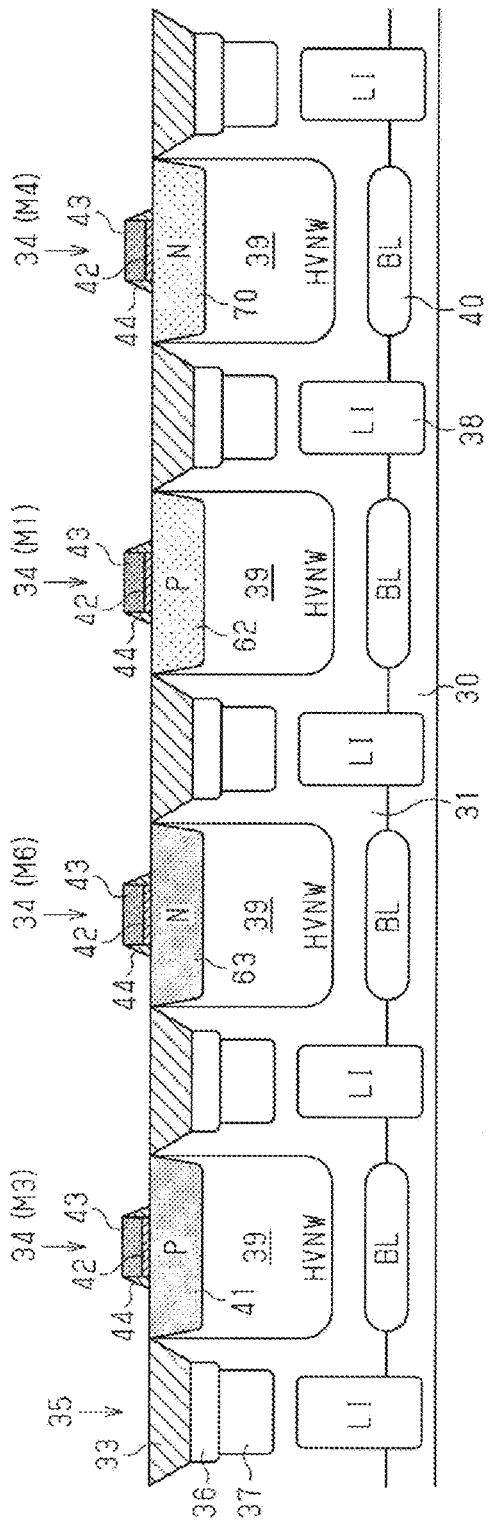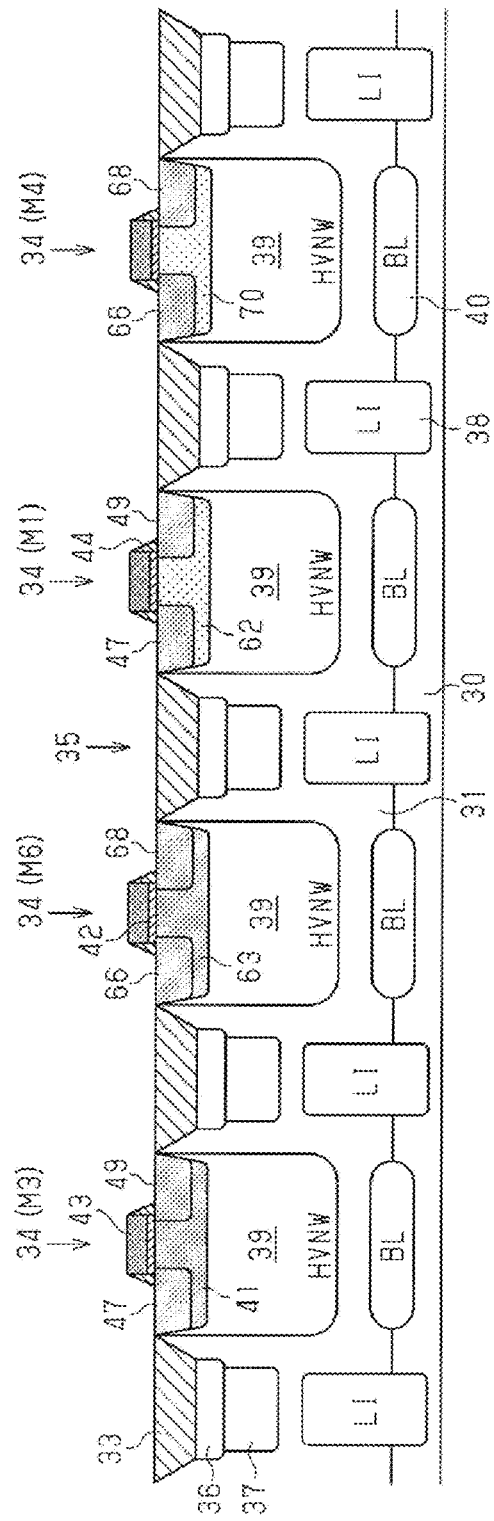

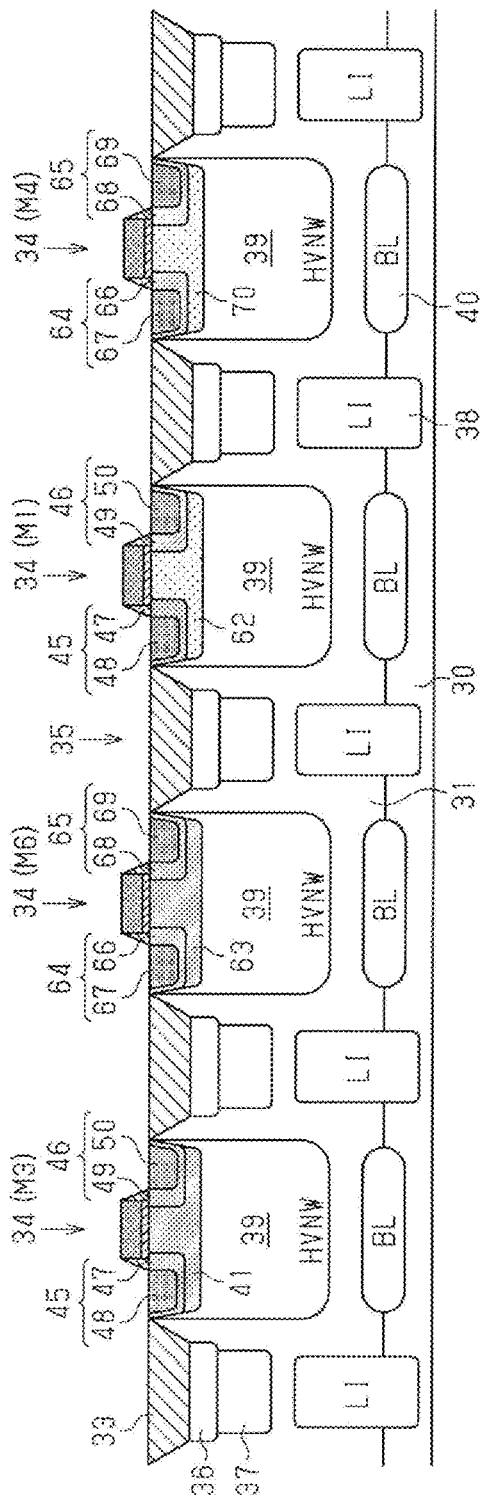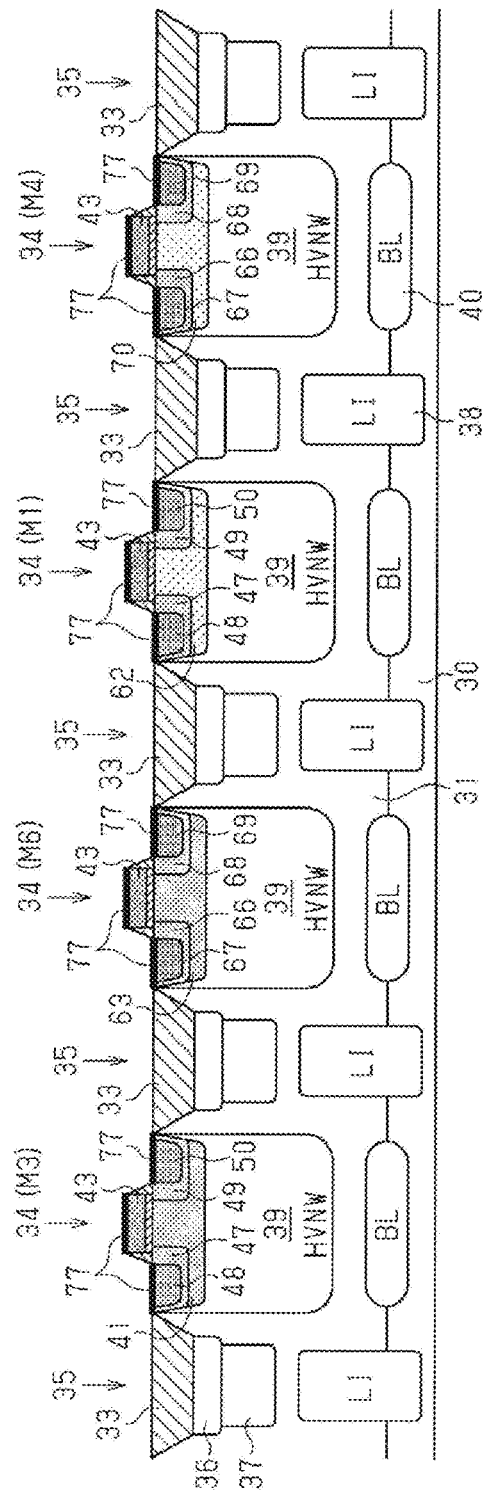

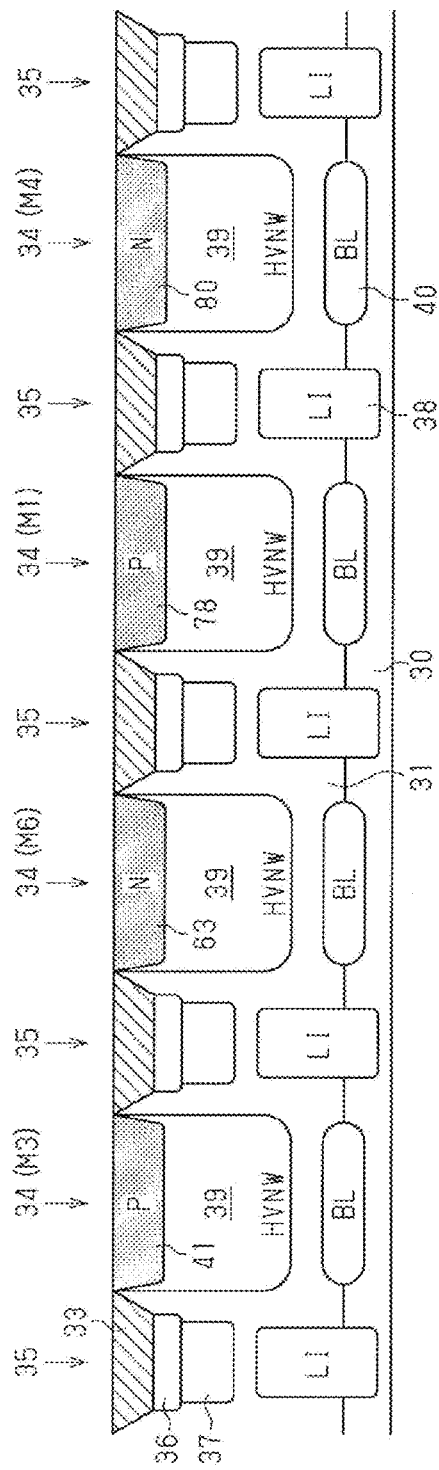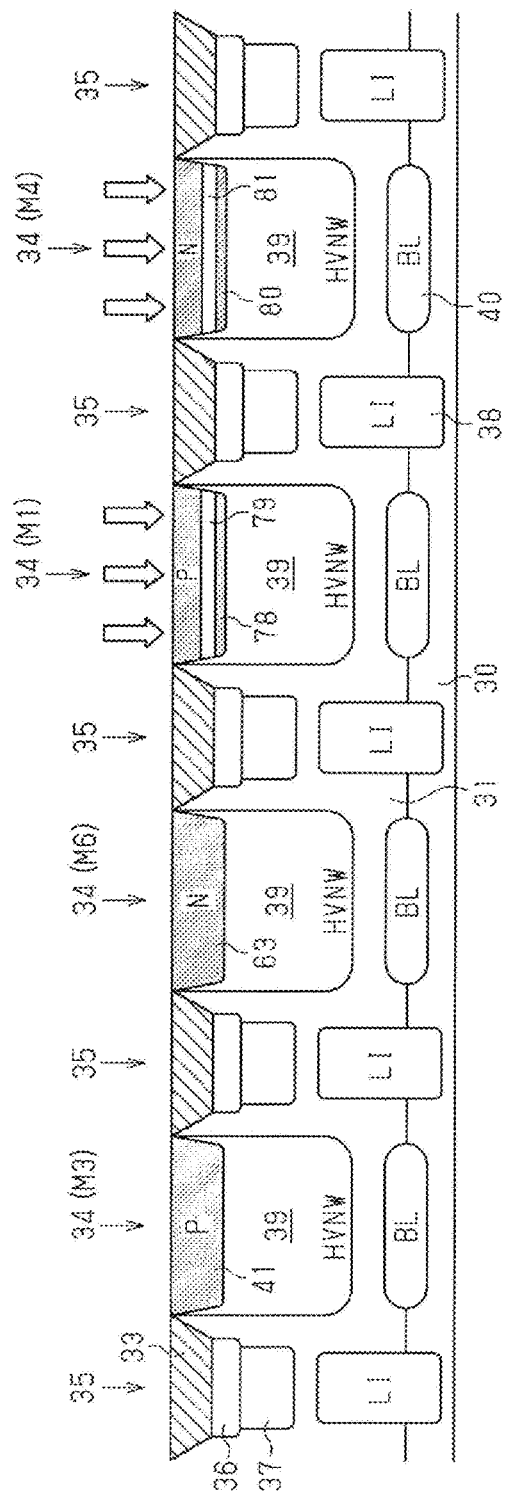

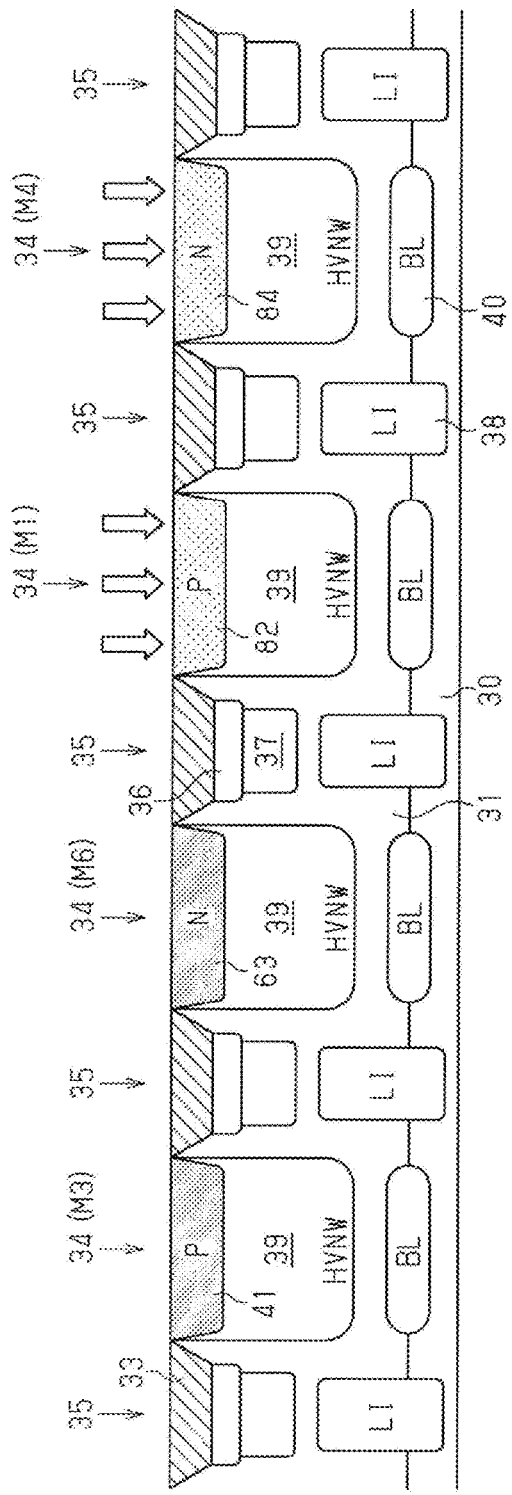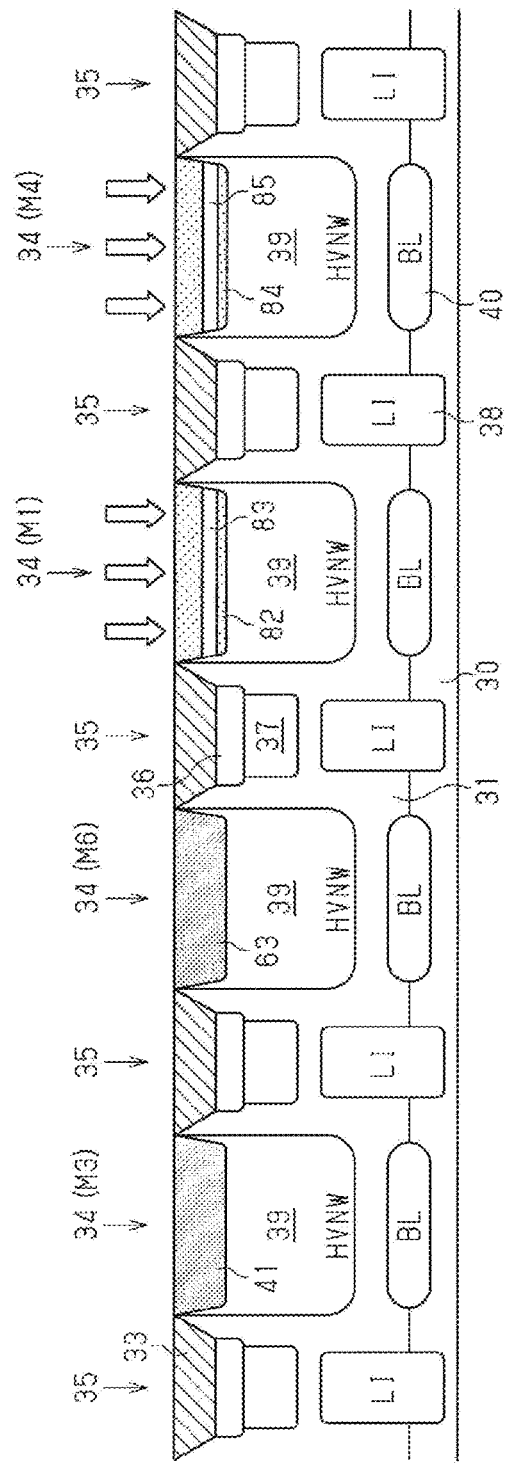

INTEGRATED CIRCUIT AND METHOD OF MANUFACTURING INTEGRATED CIRCUIT

CROSS-REFERENCE TO RELATED APPLICATION

The present application claims priority under 35 U.S.C. § 119 to Japanese Patent Application No. 2017-144864, filed on Jul. 26, 2017, the entire contents of which are incorporated herein by reference.

TECHNICAL FIELD

The present disclosure relates to an integrated circuit and a method of manufacturing an integrated circuit.

BACKGROUND

Integrated circuits such as operational amplifiers (OP Amps) are used in various electronic devices. For example, an operational amplifier described in the related art is used in a liquid crystal drive device.

Recently, transistors of integrated circuits have been miniaturized. A 1/f noise (flicker noise) of the integrated circuits may deteriorate according to the miniaturization of the transistors. Therefore, there is a desire for the improvement of the 1/f noise of the integrated circuits.

SUMMARY

Some embodiments of the present disclosure provide an integrated circuit capable of reducing a 1/f noise, and a method of manufacturing an integrated circuit.

According to one embodiment of the present disclosure, there is provided an integrated circuit comprising a plurality of miniaturized transistors, the plurality of transistors including: high concentration transistors which include channel regions having impurity concentrations of a first concentration; and low concentration transistors which include channel regions having impurity concentrations of a second concentration lower than the first concentration.

With this configuration, since the fluctuation of mobility can be suppressed by lowering the impurity concentrations of the channel regions in the transistors, it is possible to suppress the fluctuation of a drain current. Since the fluctuation of the drain current has a correlation with the magnitude of the 1/f noise of the integrated circuit, it is possible to reduce the 1/f noise of the integrated circuit by suppressing the fluctuation of the drain current.

In some embodiments, the low concentration transistors may be used for transistors which are more likely to be affected by a 1/f noise of the integrated circuit, among the plurality of transistors, than the high concentration transistors.

With this configuration, by lowering the impurity concentrations of the channel regions in transistors which are likely to be affected by the 1/f noise in the integrated circuit, the fluctuation of mobility of the transistors can be suppressed and the fluctuation of the drain current can be suppressed. Thus, it is possible to effectively reduce the 1/f noise of the integrated circuit.

In some embodiments, a shallow trench isolation (STI) structure may be used in the plurality of transistors.

In some embodiments, the integrated circuit may include an operational amplifier, the operational amplifier may include a differential pair, and transistors constituting the differential pair may be the low concentration transistors among the plurality of transistors.

With this configuration, by lowering the impurity concentrations of the channel regions in the transistors constituting the differential pair which are likely to be affected by the 1/f noise in the integrated circuit, it is possible to effectively reduce the 1/f noise of the integrated circuit.

In some embodiments, the operational amplifier may include a current mirror circuit, and transistors constituting the current mirror circuit may be the low concentration transistors among the plurality of transistors.

With this configuration, by lowering the impurity concentrations of the channel regions in the transistors constituting the current mirror circuit which are likely to be affected by the 1/f noise in the integrated circuit, it is possible to effectively reduce the 1/f noise of the integrated circuit.

In some embodiments, the transistors constituting the current mirror circuit may be enhancement type MOSFETs.

In some embodiments, the operational amplifier may include a last stage, and transistors constituting the last stage may be the high concentration transistors among the plurality of transistors.

With this configuration, by not lowering the impurity concentrations of the channel regions in the transistors of the last stage that contributes to a driving current of the integrated circuit, it is possible to suppress the fluctuation of a threshold value of the transistors.

In some embodiments, the operational amplifier may include a tail current source, and a transistor constituting the tail current source may be the high concentration transistor among the plurality of transistors.

In some embodiments, the transistor constituting the tail current source and the transistors constituting the last stage may be the high concentration transistors having the same conductivity type.

With this configuration, the step of forming a conductive region forming the channel region in the transistor constituting the tail current source and the step of forming a conductive region forming the channel regions in the transistors constituting the last stage may be performed in batches. Thus, it is possible to simplify the process of manufacturing the integrated circuit.

In some embodiments, the operational amplifier may include a constant current circuit, and transistors constituting a current source of the constant current circuit may be the low concentration transistors among the plurality of transistors.

With this configuration, by lowering the impurity concentrations of the channel regions in the transistors constituting the current source of the constant current circuit which are likely to be affected by the 1/f noise in the integrated circuit, it is possible to effectively reduce the 1/f noise of the integrated circuit.

In some embodiments, the transistors constituting the current source of the constant current circuit may be enhancement type MOSFETs.

In some embodiments, the transistors constituting the current source of the constant current circuit and the transistors constituting the differential pair may be the low concentration transistors having the same conductivity type.

With this configuration, the step of forming the conductive region forming the channel regions in the transistors constituting the current source of the constant current circuit and the step of forming conductive regions forming the channel regions in the transistors constituting the differential pair may be performed in batches. Thus, it is possible to simplify the process of manufacturing the integrated circuit.

In some embodiments, the differential pair may include a first differential pair and a second differential pair, the operational amplifier may further include a current switch that switches between a supply of current to the first differential pair and a supply of current to the second differential pair, and transistors constituting the current switch may be the low concentration transistor among the plurality of transistors With this configuration, by lowering the impurity concentrations of the channel regions in the transistors constituting the current switch which are likely to be affected by the 1/f noise in the integrated circuit, it is possible to effectively reduce the 1/f noise of the integrated circuit.

In some embodiments, the transistors constituting the current switch may be enhancement type MOSFETs.

In some embodiments, any one of the transistors constituting the current switch, transistors constituting the first differential pair, and transistors constituting the second differential pair may be the low concentration transistors having the same conductivity type.

With this configuration, the step of forming the conductive region forming the channel region in the transistor constituting the current switch and the step of forming the conductive region forming the channel regions in the transistors constituting the differential pair may be performed in batches. Thus, it is possible to simplify the process of manufacturing the integrated circuit.

In some embodiments, the second concentration may be about ½ or less of the first concentration. With this configuration, it is possible to effectively reduce the 1/f noise in the integrated circuit.

In some embodiments, the second concentration may be about 1/10 of the first concentration. With this configuration, it is possible to more effectively reduce the 1/f noise in the integrated circuit.

In some embodiments, the plurality of transistors may include buried channel type MOSFETs and surface channel type MOSFETs, and the buried channel type MOSFETs may be used for transistors which are more likely to be affected by the 1/f noise of the integrated circuit than the surface channel type MOSFETs.

With this configuration, the channel regions of the transistors which are likely to be affected by the 1/f noise in the integrated circuit can be suppressed from being affected by an interface between the gate insulating film and the semiconductor substrate by the buried channel. Therefore, the fluctuation of mobility of the transistors can be suppressed and the fluctuation of the drain current can be suppressed. Thus, it is possible to effectively reduce the 1/f noise of the integrated circuit.

In some embodiments, the integrated circuit may include an operational amplifier, the operational amplifier may include a differential pair, and transistors constituting the differential pair may be the buried channel type MOSFETs among the plurality of transistors.

With this configuration, by using the buried channel type MOSFETs for the transistors constituting the differential pair which are likely to be affected by the 1/f noise of the integrated circuit, the fluctuation of mobility of the MOSFETs may be suppressed. Thus, it is possible to effectively reduce the 1/f noise of the integrated circuit.

In some embodiments, the operational amplifier may include a current mirror circuit, and transistors constituting the current mirror circuit may be the buried channel type MOSFETs among the plurality of transistors.

With this configuration, by using the buried channel type MOSFETs for the transistors constituting the current mirror circuit which are likely to be affected by the 1/f noise of the integrated circuit, it is possible to effectively reduce the 1/f noise of the integrated circuit.

In some embodiments, the transistors constituting the current mirror circuit may be enhancement type MOSFETs.

In some embodiments, the operational amplifier may include a last stage, and transistors constituting the last stage may be the surface channel type MOSFETs among the plurality of transistors.

In some embodiments, the operational amplifier may include a tail current source, and a transistor constituting the tail current source may be the surface channel type MOSFET among the plurality of transistors.

In some embodiments, the operational amplifier may include a constant current circuit, and transistors constituting a current source of the constant current circuit may be the buried channel type MOSFETs among the plurality of transistors.

With this configuration, by using the buried channel type MOSFETs for the transistors constituting the current source of the constant current circuit which are likely to be affected by the 1/f noise of the integrated circuit, it is possible to effectively reduce the 1/f noise of the integrated circuit.

In some embodiments, the transistors constituting the current source of the constant current circuit may be enhancement type MOSFETs.

In some embodiments, the differential pair may include a first differential pair and a second differential pair, the operational amplifier may further include a current switch that switches between a supply of current to the first differential pair and a supply of current to the second differential pair, and transistors constituting the current switch may be the buried channel type MOSFETs among the plurality of transistors.

With this configuration, by using the buried channel type MOSFETs for the transistors constituting the current switch which are likely to be affected by the 1/f noise of the integrated circuit, it is possible to effectively reduce the 1/f noise of the integrated circuit.

According to another embodiment of the present disclosure, there is provided a method of manufacturing an integrated circuit including a plurality of transistors including a first transistor and a second transistor which are miniaturized, the method including: selectively performing an ion implantation such that impurity ions are implanted into a region where the first transistor is formed while no impurity ions are implanted into a region where the second transistor is formed in a semiconductor substrate, to form a first channel region in the region where the first transistor is formed; and selectively performing an ion implantation such that impurity ions are implanted into the region where the second transistor is formed while no impurity ions are implanted into the region where the first transistor is formed in the semiconductor substrate, to form a second channel region in the region where the second transistor is formed, wherein an impurity concentration of the first channel region is set lower than an impurity concentration of the second channel region.

With this configuration, since the fluctuation of mobility can be suppressed by lowering the impurity concentration of the first channel region in the first transistor, it is possible to suppress the fluctuation of the drain current. Since the fluctuation of the drain current has a correlation with the magnitude of the 1/f noise of the integrated circuit, it is possible to reduce the 1/f noise of the integrated circuit by suppressing the fluctuation of the drain current.

In some embodiments, the integrated circuit may include an operational amplifier, the operational amplifier may include a differential pair, the first transistor may include transistors constituting the differential pair, and the first channel region may include channel regions of the transistors constituting the differential pair.

With this configuration, by lowering the impurity concentrations of the channel regions in the transistors constituting the differential pair which are likely to be affected by the 1/f noise of the integrated circuit, it is possible to reduce the 1/f noise of the integrated circuit.

In some embodiments, the operational amplifier may include a current mirror circuit, the first transistor may include transistors constituting the current mirror circuit, and the first channel region may include channel regions of the transistors constituting the current mirror circuit.

With this configuration, by lowering the impurity concentrations of the channel regions in the transistors constituting the current mirror circuit which are likely to be affected by the 1/f noise of the integrated circuit, it is possible to reduce the 1/f noise of the integrated circuit.

In some embodiments, the operational amplifier may include a last stage, the second transistor may include transistors constituting the last stage, and the second channel region may include channel regions of the transistors constituting the last stage.

In some embodiments, the operational amplifier may include a tail current source, the second transistor may include a transistor constituting the tail current source, and the second channel region may include a channel region of the transistor constituting the tail current source.

With this configuration, since impurity ions can be implanted in batches into conductive regions forming the channel regions in the transistors constituting the last stage and the tail current source, it is possible to simplify the process of manufacturing the integrated circuit.

In some embodiments, the operational amplifier may include a constant current circuit, the first transistor may include transistors constituting a current source of the constant current circuit, and the first channel region may include channel regions in the transistors constituting the current source of the constant current circuit.

With this configuration, by lowering the impurity concentrations of the channel regions in the transistors constituting the current source of the constant current circuit which are likely to be affected by the 1/f noise of the integrated circuit, it is possible to effectively reduce the 1/f noise of the integrated circuit. In addition, when the transistors constituting the differential pair and the current source of the constant current circuit are transistors having the same conductivity type, impurity ions can be implanted in batches into the conductive regions forming the channel regions in the transistors constituting the differential pair and the current source of the constant current circuit. Thus, it is possible to simplify the process of manufacturing the integrated circuit.

In some embodiments, the differential pair may include a first differential pair and a second differential pair, the operational amplifier may further include a current switch that switches between a supply of current to the first differential pair and a supply of current to the second differential pair, the first transistor may include transistors constituting the current switch, and the first channel region may include channel regions in the transistors constituting the current switch.

With this configuration, by lowering the impurity concentrations of the channel regions in the transistors constituting the current switching portion which are likely to be affected by the 1/f noise of the integrated circuit, it is possible to effectively reduce the 1/f noise of the integrated circuit. In addition, when the transistors constituting the differential pair and the current switch are transistors having the same conductivity type, impurity ions can be implanted in batches into the conductive regions forming the channel regions in the transistors constituting the differential pair and the current switch. Thus, it is possible to simplify the process of manufacturing the integrated circuit.

In some embodiments, the method may further include implanting impurity ions into a region where some of the plurality of transistors are formed in the semiconductor substrate to form a buried channel layer.

With this configuration, by forming the buried channel type MOSFETs in some of the plurality of transistors, it is possible to reduce the 1/f noise of the integrated circuit.

In some embodiments, in the act of implanting impurity ions into the region where some of the plurality of transistors are formed in the semiconductor substrate to form the buried channel layer, the buried channel layer may be formed by implanting impurity ions into a region where the transistors constituting the differential pair and the current mirror circuit are formed.

With this configuration, since the buried channel layers can be formed in the transistors constituting the differential pair and the current mirror circuit which are likely to be affected by the 1/f noise of the integrated circuit, it is possible to effectively reduce the 1/f noise of the integrated circuit.

In some embodiments, in the act of implanting impurity ions into the region where some of the plurality of transistors is formed in the semiconductor substrate to form the buried channel layer, the buried channel layer may be formed by implanting impurity ions into a region where transistors constituting the current source of the constant current circuit are formed.

With this configuration, since the buried channel layers can be formed in the transistors constituting the current source of the constant current circuit which are likely to be affected by the 1/f noise of the integrated circuit, it is possible to effectively reduce the 1/f noise of the integrated circuit.

In some embodiments, in the act of implanting impurity ions into the region where some of the plurality of transistors are formed in the semiconductor substrate to form the buried channel layer, the buried channel layer may be formed by implanting impurity ions into a region where the transistors constituting the current switch are formed.

With this configuration, since the buried channel layers can be formed in the transistors constituting the current switch which are likely to be affected by the 1/f noise of the integrated circuit, it is possible to effectively reduce the 1/f noise of the integrated circuit.

BRIEF DESCRIPTION OF DRAWINGS

FIG. 3A is a cross-sectional view illustrating a process of manufacturing a first transistor, a third transistor, a fourth transistor, and a sixth transistor.

FIG. 3B is a cross-sectional view illustrating a next step of the process of manufacturing each transistor of FIG. 3A.

FIG. 3C is a cross-sectional view illustrating a next step of the process of manufacturing each transistor of FIG. 3B.

FIG. 3D is a cross-sectional view illustrating a next step of the process of manufacturing each transistor of FIG. 3C.

FIG. 3E is a cross-sectional view illustrating a next step of the process of manufacturing each transistor of FIG. 3D.

FIG. 3F is a cross-sectional view illustrating a next step of the process of manufacturing each transistor of FIG. 3E.

FIG. 3G is a cross-sectional view illustrating a next step of the process of manufacturing each transistor of FIG. 3F.

FIG. 3H is a cross-sectional view illustrating a next step of the process of manufacturing each transistor of FIG. 3G.

FIG. 3I is a cross-sectional view illustrating a next step of the process of manufacturing each transistor of FIG. 3H.

FIG. 3J is a cross-sectional view illustrating a next step of the process of manufacturing each transistor of FIG. 3I.

FIG. 3K is a cross-sectional view illustrating a next step of the process of manufacturing each transistor of FIG. 3J.

FIG. 3L is a cross-sectional view illustrating a next step of the process of manufacturing each transistor of FIG. 3K.

FIG. 8A is a cross-sectional view illustrating a process of manufacturing a first transistor, a third transistor, a fourth transistor, and a sixth transistor.

FIG. 8B is a cross-sectional view illustrating a next step of the process of manufacturing each transistor of FIG. 8A.

FIG. 11B is a cross-sectional view illustrating a next step of the process of manufacturing each transistor of FIG. 11A.

FIG. 11C is a cross-sectional view illustrating a next step of the process of manufacturing each transistor of FIG. 11B.

DETAILED DESCRIPTION

Figure 1:
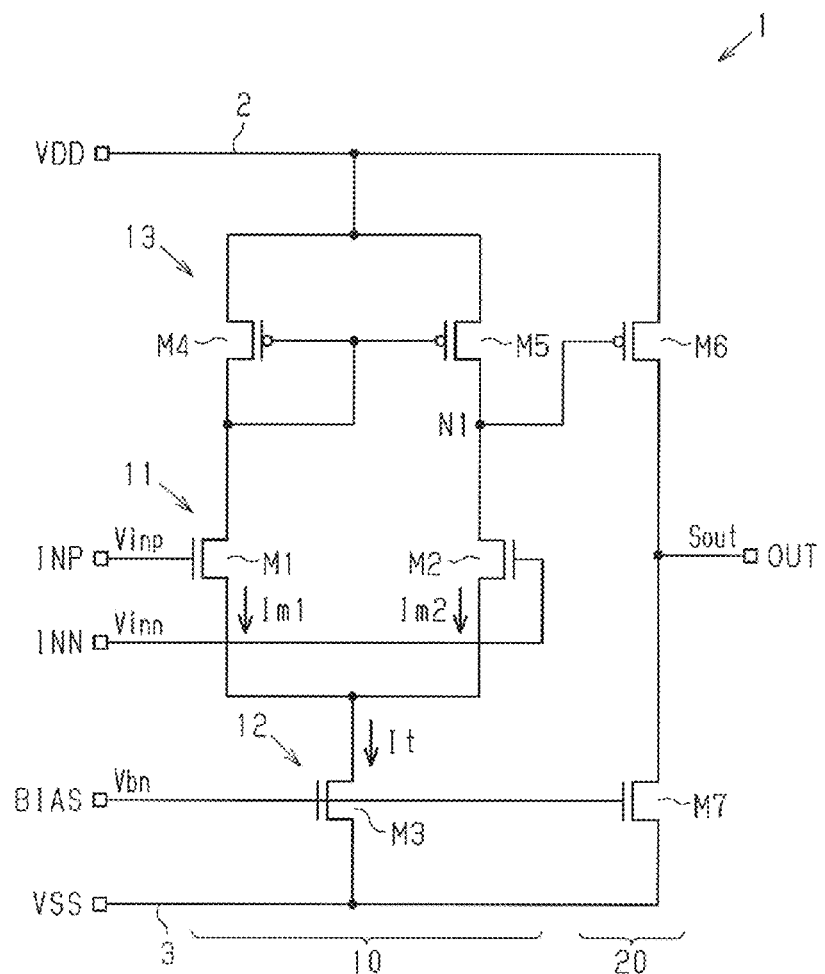
FIG. 1 is a circuit diagram of an operational amplifier in an integrated circuit according to a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Hereinafter, embodiments of an integrated circuit will be described with reference to the drawings. The embodiments described below are intended to exemplify the configuration or method for embodying the technical idea and not to limit the material, feature, structure, arrangement, dimension or the like of each component to the one set forth below. The embodiments described below may be differently modified within the scope of the accompanying claims.

In the present disclosure, "a state where a member A is connected to a member B" includes a case where the member A and the member B are physically directly connected or even a case where the member A and the member B are indirectly connected through any other member that does not affect an electrical connection state between the members A and B.

Similarly, "a state where a member C is installed between a member A and a member B" includes a case where the member A and the member C or the member B and the member C are indirectly connected through any other member that does not affect an electrical connection state between the members A and C or the members B and C, in addition to a case where the member A and the member C or the member B and the member C are directly connected.

(First Embodiment)

An integrated circuit includes a digital circuit such as a memory and a two-stage amplification operational amplifier (hereinafter, referred to as an "operational amplifier 1") illustrated in FIG. 1. The operational amplifier 1 is a circuit for amplifying a difference between two input voltages, and includes a differential amplification stage 10 as a first stage and an output stage 20 as a last stage. The operational amplifier 1 is integrated into a single semiconductor substrate. The operational amplifier 1 amplifies a potential difference between an inverting input terminal INN and a non-inverting input terminal INP to output an output signal Sout as a voltage signal from an output terminal OUT.

The differential amplification stage 10 includes a differential pair 11, a tail current source 12, and a current mirror circuit 13.

The differential pair 11 includes a first transistor M1 and a second transistor M2. In the present embodiment, the first transistor M1 and the second transistor M2 are N-channel MOSFETs. The first transistor M1 and the second transistor M2 may have either a depletion type structure or an enhancement type structure. In the present embodiment, the first transistor M1 and the second transistor M2 have an enhancement type structure. A gate of the first transistor M1 is connected to the non-inverting input terminal INP, and a gate of the second transistor M2 is connected to the inverting input terminal INN. A source of the first transistor M1 and the source of the second transistor M2 are commonly connected. The differential pair 11 generates differential currents Im1 and Im2 according to respective input voltages Vinn and Vinp of the inverting input terminal INN and the non-inverting input terminal INP.

The tail current source 12 includes a third transistor M3 connected to the source of each of the transistors M1 and M2. The third transistor M3 of the present embodiment is an N-channel MOSFET. A source of the third transistor M3 is connected to a second power line 3, through which a second power source voltage VSS is applied. A gate of the third transistor M3 is connected to a BIAS terminal. A bias voltage Vbn from a bias circuit (not shown) is input to the gate of the third transistor M3. The tail current source 12 supplies a tail current It based on the bias voltage Vbn.

The current mirror circuit 13 is an active load connected to the differential pair 11. The current mirror circuit 13 includes a fourth transistor M4 and a fifth transistor M5. The fourth transistor M4 and the fifth transistor M5 are enhancement type P-channel MOSFETs. A source of the fourth transistor M4 and a source of the fifth transistor M5 are connected to a first power line 2, through which a first power source voltage VDD is applied. A gate and a drain of the fourth transistor M4 are commonly connected to the drain of the first transistor M1. A gate of the fifth transistor M5 is connected to the gate of the fourth transistor M4 and a drain of the fifth transistor M5 is connected to the drain of the second transistor M2.

The output stage 20 is a source-grounded circuit using a sixth transistor M6 and a seventh transistor M7. The sixth transistor M6 is a P-channel MOSFET and the seventh transistor M7 is an N-channel MOSFET. A source of the sixth transistor M6 is connected to the first power line 2, and a drain of the sixth transistor M6 is connected to a drain of the seventh transistor M7. A gate of the sixth transistor M6 is connected to a node N1 between the fifth transistor M5 and the second transistor M2. A source of the seventh transistor M7 is connected to the second power line 3. A gate of the seventh transistor M7 is commonly connected to the gate of the third transistor M3 and is connected to the BIAS terminal. The bias voltage Vbn from the bias circuit is input to the gate of the seventh transistor M7.

In each of the transistors M1 to M7, the gate lengths of the first transistor M1 and the second transistor M2 constituting the differential pair 11 are shorter than the gate lengths of the fourth transistor M4 and the fifth transistor M5 constituting the current mirror circuit 13. Since fluctuation of mobility of the differential amplification stage 10 can be reduced by such a relationship of the gate lengths, 1/f noise of the output signal Sout can be reduced.

In addition, in the present embodiment, in order to further reduce the 1/f noise of the output signal Sout of the operational amplifier 1, impurity concentrations of the channel regions in some of the transistors M1 to M7 are set lower than impurity concentrations of the channel regions in the other transistors M1 to M7. That is, the plurality of transistors of the operational amplifier 1 include high concentration transistors which include channel regions having impurity concentrations of a first concentration and low concentration transistors which include channel regions having impurity concentrations of a second concentration lower than the first concentration. Specifically, the impurity concentrations of the channel regions in transistors which are likely to be affected by the 1/f noise of the output signal Sout among the transistors M1 to M7 are set lower than the impurity concentrations of the channel regions in transistors which are unlikely to be affected by the 1/f noise of the output signal Sout among the transistors M1 to M7. That is, the low concentration transistors are used for the transistors which are more likely to be affected by the 1/f noise of the operational amplifier 1, among the plurality of transistors, than the high concentration transistors, and the high concentration transistors are used for the transistors which are more unlikely to be affected by the 1/f noise of the operational amplifier 1, among the plurality of transistors, than the low concentration transistors. Specifically, in the operational amplifier 1, the portions which are likely to be affected by the 1/f noise of the output signal Sout are a portion of the differential amplification stage 10, and the portion which is unlikely to be affected by the 1/f noise of the output signal Sout is the output stage 20. More specifically, in the differential amplification stage 10, the differential pair 11 and the current mirror circuit 13 are likely to be affected by the 1/f noise of the output signal Sout, and the tail current source 12 is unlikely to be affected by the 1/f noise of the output signal Sout.

In the present embodiment, the impurity concentrations of the channel regions in the transistors of the differential pair 11 and the current mirror circuit 13 in the differential amplification stage 10 are set lower than the impurity concentrations of the channel regions in the transistors of the tail current source 12 and the output stage 20. That is, the transistors constituting the differential pair 11 and the current mirror circuit 13 are low concentration transistors, and the transistors constituting the tail current source 12 and the output stage 20 are high concentration transistors. Specifically, the impurity concentrations of the channel regions in the first transistor M1, the second transistor M2, the fourth transistor M4, and the fifth transistor M5 are set lower than the impurity concentrations of the channel regions in the third transistor M3, the sixth transistor M6, and the seventh transistor M7. That is, the first transistor M1, the second transistor M2, the fourth transistor M4 and the fifth transistor M5 are low concentration transistors, and the third transistor M3, the sixth transistor M6 and the seventh transistor M7 are high concentration transistors.

In addition, the operational amplifier 1 achieves a high degree of integration by manufacturing each of the transistors M1 to M7 by a miniaturization technology of a semiconductor process. In each of the transistors M1 to M7, a shallow trench isolation (STI) structure is used as a device isolation structure.

Figure 2A:
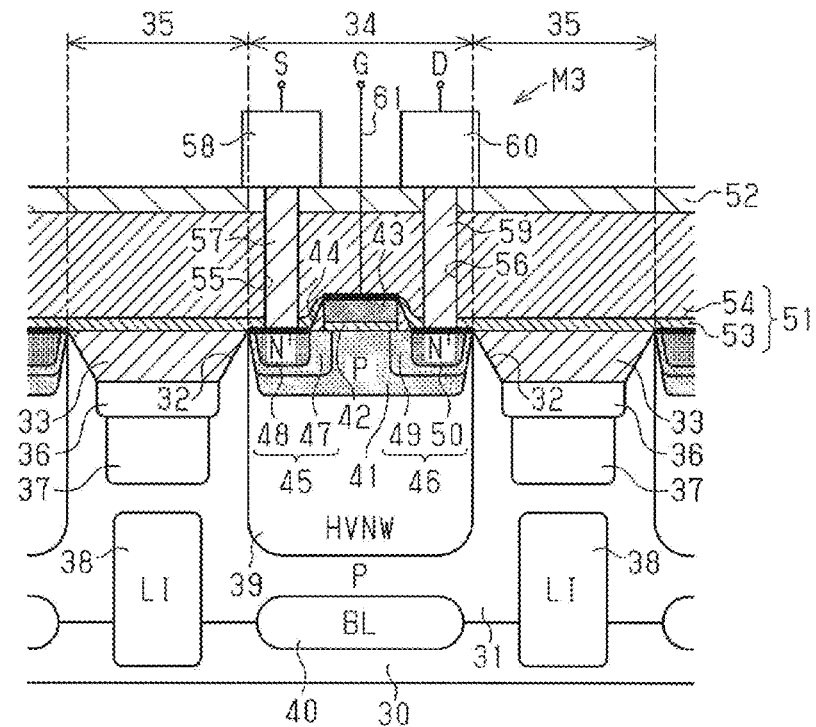
FIG. 2A is a cross-sectional view of a third transistor constituting a tail current source of the operational amplifier.

As illustrated in FIG. 2A, the third transistor M3 which is the N-channel MOSFET is formed in a P-type epitaxial layer 31 grown on a P-type silicon substrate 30 as a semiconductor substrate. Shallow trenches 32 for isolating the P-type epitaxial layer 31 into a plurality of regions are formed in a surface layer portion of the P-type epitaxial layer 31. Silicon oxide films 33 are buried in the trenches 32. The width of the trenches 32 (the silicon oxide films 33) is, for example, 0.22 µm. In addition, an active region isolated (STI) by the trenches 32 is formed in the P-type epitaxial layer 31. The active region illustrated in FIG. 2A is a device forming region 34 where the third transistor M3 is formed. On the other hand, the regions corresponding to the trenches 32 are device isolation regions 35. Each device isolation region 35 includes a P-type well layer 36 and a P-type drift layer 37. The P-type well layer 36 is installed so as to be adjacent to the bottom portion of the trench 32. The P-type drift layer 37 is installed on the silicon substrate 30 side with respect to the P-type well layer 36 so as to be adjacent to the P-type well layer 36. Accordingly, more reliable device isolation may be achieved. In addition, a P-type buried layer (LI) 38 is formed on the silicon substrate 30 side at a distance from the P-type drift layer 37 in the depth direction in the device isolation region 35. The P-type buried layer 38 is formed at a boundary between the silicon substrate 30 and the P-type epitaxial layer 31.

The device forming region 34 has a deep N-type well layer 39 (HVNW) and an N-type buried layer (BL) 40. The N-type well layer 39 is a high pressure-resistant well region, and is isolated by the device isolation regions 35. The N-type buried layer 40 is formed on the silicon substrate 30 side at a distance from the N-type well layer 39 in the depth direction in the device forming region 34. The N-type buried layer 40 is formed at the boundary between the silicon substrate 30 and the P-type epitaxial layer 31.

A P-type well layer 41 is formed in the surface layer portion of the N-type well layer 39 so as to be surrounded by the N-type well layer 39. The P-type well layer 41 is a region doped with a P-type impurity. As the P-type impurity, it may be possible to use, for example, boron (B) or the like. The P-type well layer 41 is a region doped with a P-type impurity such that the P-type impurity concentration is, for example, 1E+17 to 1E+18 cm$^{-3}$.

A gate insulating film 42 is formed on the surface of the P-type well layer 41. The gate insulating film 42 is formed of, for example, a silicon oxide film. The thickness of the gate insulating film 42 is, for example, 1 to 20 nm.

A gate electrode 43 is formed on the gate insulating film 42. The gate electrode 43 is made of, for example, Si, Co, Hf, Zr, Al, Ti, Ta, Mo or the like and also includes an alloy thereof. Further, the thickness of the gate electrode 43 is, for example, 50 to 250 nm. In addition, a sidewall 44 that surrounds a sidewall of the gate electrode 43 over the entire circumference is formed on the surface of the P-type well layer 41. The sidewall 44 is made of, for example, silicon oxide, silicon nitride, or a stacked structure thereof.

In the P-type well layer 41, an N-type source region 45 and an N-type drain region 46 are respectively formed on one side (the left side in FIG. 2A) and on the other side (the right side in FIG. 2A) including a region (channel region) facing the gate insulating film 42.

In the present embodiment, the channel region of the third transistor M3 is arranged below the gate insulating film 42 in the P-type well layer 41 and between the source region 45 and the drain region 46. In the present embodiment, the channel region of the third transistor M3 includes an interface between the P-type well layer 41 and the gate insulating film 42. Also, the impurity concentration of the channel region of the third transistor M3 is equal to the impurity concentration of the P-type well layer 41.

The source region 45 has a structure in which an N-type impurity is double-diffused at low a concentration and at a high concentration. The source region 45 has an N$^-$ type low concentration source region 47 where an N-type impurity is diffused at a low concentration and an N$^+$ type high concentration source region 48 where an N-type impurity is diffused at a high concentration.

The low concentration source region 47, which is a region doped with an N-type impurity such that the N-type impurity concentration is, for example, 5E+17 to 5E+18 cm$^{-3}$, widens from the surface of the P-type well layer 41 in the depth direction and is formed such that a portion thereof faces one side edge portion of the gate insulating film 42 in the width direction. The depth of the low concentration source region 47 is, for example, 100 to 400 nm.

The high concentration source region 48, which is a region doped with an N-type impurity such that the N-type impurity concentration is, for example, 5E+19 to 5E+20 cm$^{-3}$, widens from the surface of the P-type well layer 41 in the depth direction and is formed in a self-aligned manner with the sidewall 44. The depth of the high concentration source region 48 is, for example, 50 to 200 nm.

The drain region 46 has a structure in which an N-type impurity concentration is double-diffused at a low concentration and at a high concentration. The drain region 46 has an N$^-$ type low concentration drain region 49 where an N type impurity is diffused at a low concentration and an N$^+$ type high concentration drain region 50 where an N type impurity is diffused at a high concentration.

The low concentration drain region 49, which is a region doped with an N-type impurity such that the N type impurity concentration is, for example, 5E+17 to 5E+18$^{-3}$, widens from the surface of the P-type well layer 41 in the depth direction and is formed such that a portion thereof faces the other side edge portion of the gate insulating film 42 in the width direction. The depth of the low concentration drain region 49 is, for example, is equal to the depth of the low concentration source region 47.

The high concentration drain region 50, which is a region doped with an N-type impurity such that the N-type impurity concentration is, for example, 5E+19 to 5E+20 cm$^{-3}$, widens from the surface of the P-type well layer 41 in the depth direction and is formed in a self-aligned manner with the sidewall 44. The depth of the high concentration drain region 50 is equal to the depth of the high concentration source region 48.

A first insulating layer 51 and a second insulating layer 52 as insulating films are sequentially stacked on the silicon substrate 30.

The first insulating layer 51 has a film 53 formed on the surface of the P-type epitaxial layer 31 and the side surface of the sidewall 44, and a first interlayer insulating film 54 formed on the film 53. The film 53 is made of, for example, silicon nitride (SiN). The first interlayer insulating film 54 is made of, for example, silicon oxide ($SiO_2$). The thickness of the film 53 is, for example, 10 to 100 nm, and the thickness of the first interlayer insulating film 54 is, for example, 300 to 500 nm.

The second insulating layer 52 is a single layer film made of silicon oxide ($SiO_2$). The thickness of the second insulating layer 52 is, for example, 100 to 300 nm.

In portions of the first insulating layer 51 and the second insulating layer 52, which face the source region 45 and the drain region 46, a source contact hole 55 and a drain contact hole 56 that successively penetrate them are formed.

A source contact plug 57 is buried in the source contact hole 55. The source contact plug 57 has a stacked structure of W/TiN/Ti and is in contact with the source region 45. In addition, a source wiring 58 integrated with the source contact plug 57 and having a stacked structure of Al/TiN/Ti is formed on the second insulating layer 52.

A drain contact plug 59 is buried in the drain contact hole 56. The drain contact plug 59 is made of aluminum and is in contact with the drain region 46. Further, a drain wiring 60 integrated with the drain contact plug 59 and made of aluminum and is formed on the second insulating layer 52. In addition, a gate wiring 61 is connected to the gate electrode 43. The seventh transistor M7 also has the same configuration as the third transistor M3.

Figure 2B:
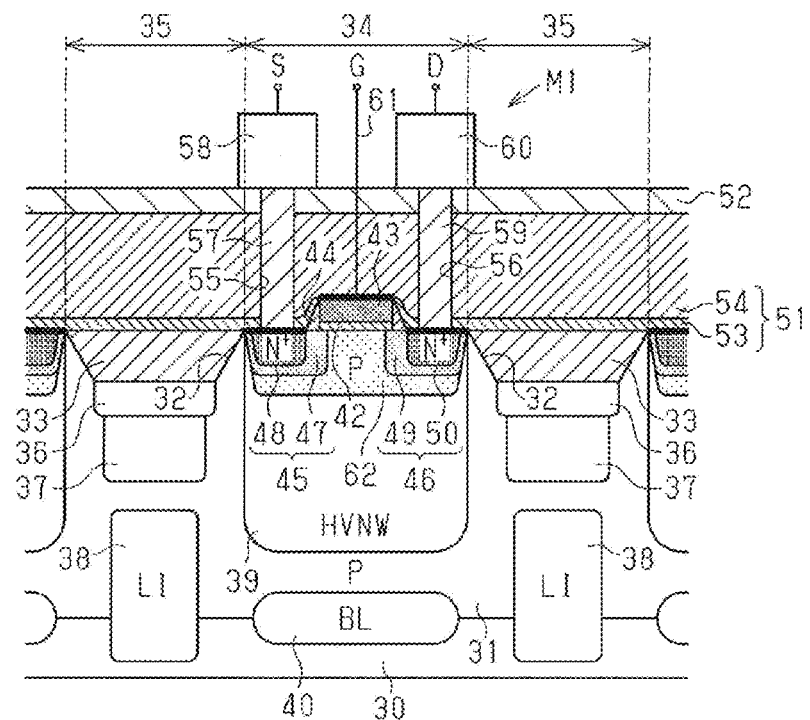
FIG. 2B is a cross-sectional view of a first transistor constituting a differential pair of the operational amplifier.

As illustrated in FIG. 2B, similar to the third transistor M3, the first transistor M1, which is the N-channel MOSFET, is formed in the surface layer portion of the P-type epitaxial layer 31. An active region isolated (STI) by the trenches 32 in the P-type epitaxial layer 31 illustrated in FIG. 2B is a device forming region 34 where the first transistor M1 is formed. The first transistor M1 has the same structure as the third transistor M3 except for the impurity concentration of the P-type well layer.

A P-type well layer 62 of the first transistor M1 is formed in the device forming region 34 where the first transistor M1 is formed in the P-type epitaxial layer 31. A depth and a width of the P-type well layer 62 are substantially equal to the depth and the width of the P-type well layer 41 of the third transistor M3. On the other hand, the P-type impurity concentration of the P-type well layer 62 is lower than the P-type impurity concentration of the P-type well layer 41 of the third transistor M3. Specifically, the P-type impurity concentration of the P-type well layer 41 of the third transistor M3 is a P-type impurity concentration based on the scaling rule (proportional reduction rule). The P-type impurity concentration of the P-type well layer 62 of the first transistor M1 is lower than the P-type impurity concentration based on the scaling rule. In some embodiments, the P-type impurity concentration of the P-type well layer 62 may be as low as possible within a range where the device characteristics do not excessively deviate due to a reduction in the P-type impurity concentration. In one example, the P-type impurity concentration of the P-type well layer 62 is about ½ or less of the P-type impurity concentration of the P-type well layer 41 of the third transistor M3. In some embodiments, the P-type impurity concentration of the P-type well layer 62 may be about 1/10 of the P-type impurity concentration of the P-type well layer 41 of the third transistor M3. The P-type impurity concentration of the P-type well layer 62 of the present embodiment is 1E+16 to 1E+17 $cm^{-3}$.

In the present embodiment, the channel region of the first transistor M1 is arranged below the gate insulating film 42 in the P-type well layer 62 and between the source region 45 and the drain region 46. In the present embodiment, the channel region of the first transistor M1 includes an interface between the P-type well layer 62 and the gate insulating film 42. Further, the impurity concentration of the channel region of the first transistor M1 is equal to the impurity concentration of the P-type well layer 62. The second transistor M2 also has the same configuration as the first transistor M1.

Figure 2C:
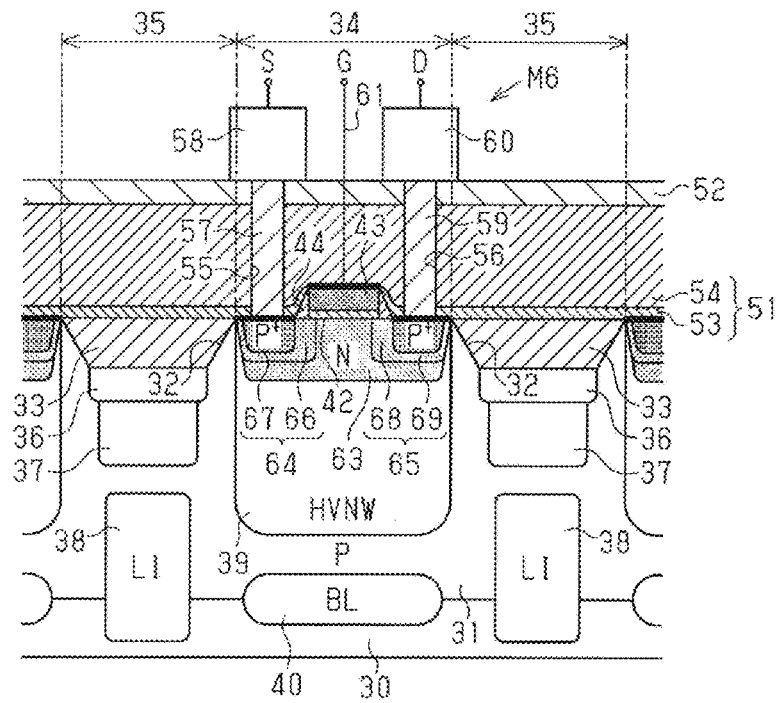
FIG. 2C is a cross-sectional view of a sixth transistor constituting an output stage of the operational amplifier.

As illustrated in FIG. 2C, similar to the third transistor M3, the sixth transistor M6, which is the P-channel MOSFET, is formed in the surface layer portion of the P-type epitaxial layer 31. An active region isolated (STI) by the trenches 32 in the P-type epitaxial layer 31 illustrated in FIG. 2C is a device forming region 34 where the sixth transistor M6 is formed.

An N-type well layer 63 is installed in the device forming region 34. The N-type well layer 63 is formed so as to be surrounded by the N-type well layer 39 in the surface layer portion of the N-type well layer 39. The N-type well layer 63 is a region doped with an N-type impurity. As the N type impurity, it may be possible to use, for example, phosphorus (P) or the like. The N-type well layer 63 is a region doped with an N-type impurity such that the N-type impurity concentration is, for example, 1E+17 to 1E+18 $cm^{-3}$.

Similar to the third transistor M3, a gate insulating film 42 is formed on the surface of the N-type well layer 63, and a gate electrode 43 is formed on the gate insulating film 42. The material and the thickness of the gate insulating film 42 and the gate electrode 43 are equal to those of the gate insulating film 42 and the gate electrode 43 of the third transistor M3. A sidewall 44 that surrounds a sidewall of the gate electrode 43 over the entire circumference is also formed on the surface of the N-type well layer 63. The sidewall 44 is made of, for example, silicon oxide.

In the N-type well layer 63, a P-type source region 64 and a P-type drain region 65 are respectively formed on one side (the left side in FIG. 2C) and the other side (the right side in FIG. 2C) including a region (channel region) facing the gate insulating film 42.

In the present embodiment, the channel region of the sixth transistor M6 is arranged below the gate insulating film 42 in the N-type well layer 63 and between the source region 64 and the drain region 65. In the present embodiment, the channel region of the sixth transistor M6 includes an interface between the N-type well layer 63 and the gate insulating film 42. The impurity concentration of the channel region of the sixth transistor M6 is also equal to the impurity concentration of the N-type well layer 63.

The source region 64 has a structure in which a P-type impurity concentration is double-diffused at a low concentration and at a high concentration. Specifically, it has a $P^-$ type low concentration source region 66 where a $P^-$ type impurity is diffused at a low concentration and a $P^+$ type high concentration source region 67 where a P-type impurity is diffused at a high concentration.

The low concentration source region 66, which is a region doped with a P-type impurity such that the P-type impurity concentration is, for example, 5E+17 to 5E+18 $cm^{-3}$, widens from the surface of the N-type well layer 63 in the depth direction and is formed such that a portion thereof faces one side edge portion of the gate insulating film 42 in the width direction. A depth of the low concentration source region 66 is, for example, 50 to 300 nm.

The high concentration source region 67, which is a region doped with a P-type impurity such that the P-type impurity concentration is, for example, 1E+19 to 1E+20 cm$^{-3}$, widens from the surface of N-type well layer 63 in the depth direction and is formed in a self-aligned manner with the sidewall 44. A depth of the high concentration source region 67 is, for example, 50 to 150 nm.

The drain region 65 has a structure in which the P-type impurity concentration is double-diffused at a low concentration and at a high concentration. The drain region 65 has a P$^-$ type low concentration drain region 68 where a P-type impurity is diffused at a low concentration and a P$^+$ type high concentration drain region 69 where a P-type impurity is diffused at a high concentration.

The low concentration drain region 68, which is a region doped with a P-type impurity such that the P-type impurity concentration is, for example, 5E+17 to 5E+18 cm$^{-3}$, widens from the surface of N-type well layer 63 in the depth direction and is formed such that a portion thereof faces the other side edge portion of the gate insulating film 42 in the width direction. A depth of the low concentration drain region 68 is equal to, for example, the depth of the low concentration source region 66.

The high concentration drain region 69, which is a region doped with a P-type impurity such that the P-type impurity concentration is, for example, 1E+19 to 1E+20 cm$^{-3}$, widens from the surface of the N-type well layer 63 in the depth direction and is formed in a self-aligned manner with the sidewall 44. A depth of the high concentration drain region 69 is equal to the depth of the high concentration source region 67.

A first insulating layer 51 and a second insulating layer 52 as insulating films are sequentially stacked on the P-type epitaxial layer 31. In the first insulating layer 51 and the second insulating layer 52, a source contact hole 55 and a drain contact hole 56 are formed, and a source contact plug 57 and a drain contact plug 59 are buried, respectively. The first insulating layer 51, the second insulating layer 52, the source contact hole 55, the drain contact hole 56, the source contact plug 57, and the drain contact plug 59 of the sixth transistor M6 have the same structure as the first insulating layer 51, the second insulating layer 52, the source contact hole 55, the drain contact hole 56, the source contact plug 57, and the drain contact plug 59 of the third transistor M3.

Figure 2D:
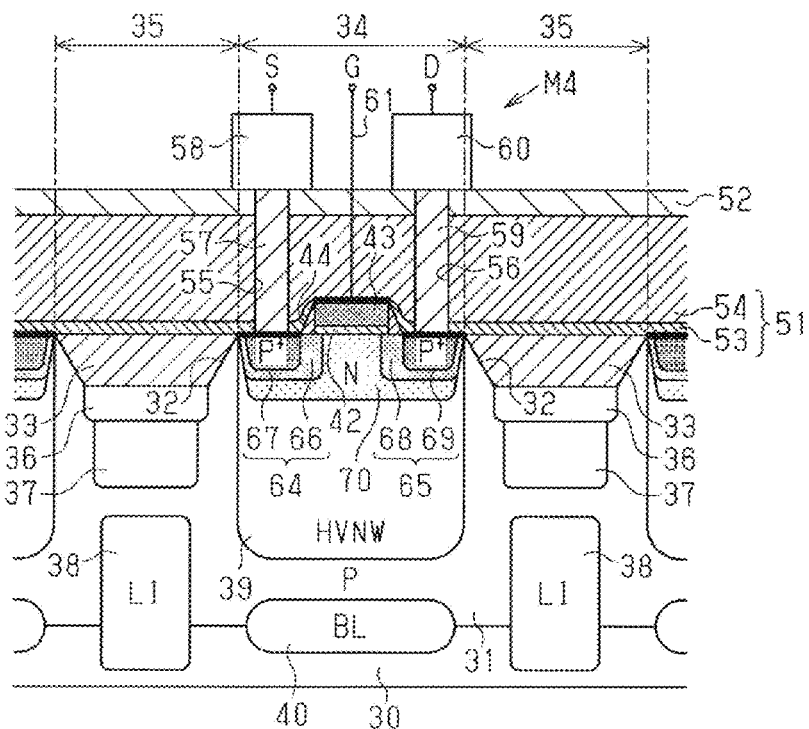
FIG. 2D is a cross-sectional view of a fourth transistor constituting a current mirror circuit of the operational amplifier.

As illustrated in FIG. 2D, similar to the sixth transistor M6, the fourth transistor M4, which is the P-channel MOSFET, is formed in the surface layer portion of the P-type epitaxial layer 31. The fourth transistor M4 has the same structure as the sixth transistor M6 except for the impurity concentration of the N-type well layer.

An N-type well layer 70 of the fourth transistor M4 is formed in the device forming region 34 where the fourth transistor M4 is formed in the P-type epitaxial layer 31. A depth and a width of the N-type well layer 70 are substantially equal to the depth and the width of the N-type well layer 63 of the sixth transistor M6. On the other hand, the N type impurity concentration of the N-type well layer 70 is lower than the N type impurity concentration of the N-type well layer 63 of the sixth transistor M6. Specifically, the N type impurity concentration of the N-type well layer 63 of the sixth transistor M6 is an N type impurity concentration based on the scaling rule (proportional reduction rule). The N-type impurity concentration of the N-type well layer 70 of the fourth transistor M4 is lower than the N-type impurity concentration based on the scaling rule. In some embodiments, the N-type impurity concentration of the N-type well layer 70 may be as low as possible within a range where the device characteristics do not excessively deviate due to a reduction in the N-type impurity concentration. The express a range in which the device characteristics do not excessively deviate refers to, for example, a concentration higher than the upper limit value of the N-type impurity concentration at which a threshold voltage is deviated and thus the function of the current mirror circuit 13 may not be established. In one example, the N-type impurity concentration of the N-type well layer 70 is about ½ or less of the N-type impurity concentration of the N-type well layer 63 of the sixth transistor M6. In some embodiments, the N-type impurity concentration of the N-type well layer 70 may be about 1/10 of the N-type impurity concentration of the N-type well layer 63 of the sixth transistor M6. The P-type impurity concentration of the N-type well layer 70 of the present embodiment is 1E+16 to 1E+17 cm$^{-3}$.

In the present embodiment, the channel region of the fourth transistor M4 is arranged below the gate insulating film 42 in the N-type well layer 70 and between the source region 64 and the drain region 65. In the present embodiment, the channel region of the fourth transistor M4 includes an interface between the N-type well layer 70 and the gate insulating film 42. Further, the impurity concentration of the channel region of the fourth transistor M4 is equal to the impurity concentration of the N-type well layer 70. The fifth transistor M5 also has the same structure as fourth transistor M4.

[Method of Manufacturing a Transistor]

A method of manufacturing a first transistor M1, a third transistor M3, a fourth transistor M4, and a sixth transistor M6 will be described with reference to FIGS. 3A to 3M. Further, in FIGS. 3A to 3M, it is assumed that the first transistor M1, the third transistor M3, the fourth transistor M4, and the sixth transistor M6 are formed to be adjacent to each other for convenience of description.

Figure 3M:
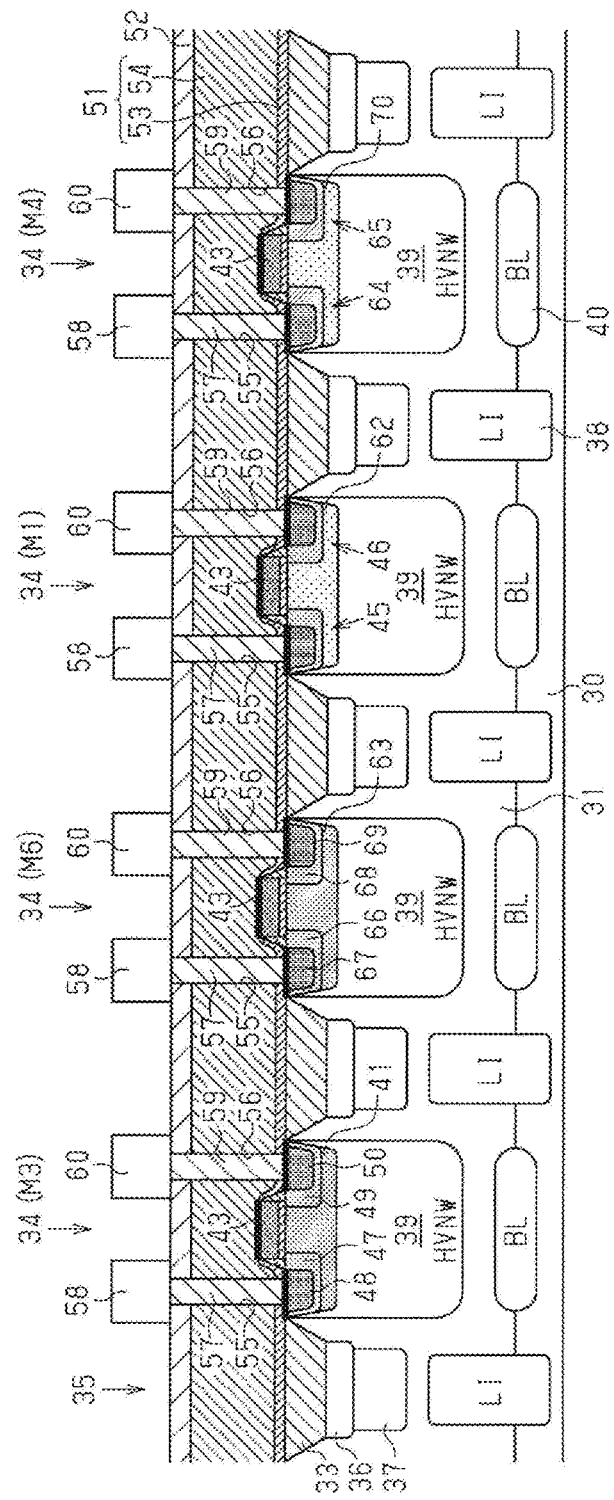
FIG. 3M is a cross-sectional view illustrating a next step of the process of manufacturing each transistor of FIG. 3L.

The method of manufacturing these transistors includes an epitaxial layer forming step (FIG. 3A), an isolation forming step (FIGS. 3B and 3 C), a well forming step (FIGS. 3D to 3 G), a gate forming step (FIGS. 3H and 3I), a source/drain forming step (FIGS. 3J to 3L), and a wiring step (FIG. 3M).

As illustrated in FIG. 3A, a P-type silicon substrate 30 is prepared and a thermal oxidation film 71 is formed on a surface of the silicon substrate 30 by, for example, a thermal oxidation method. Subsequently, an ion implantation for N-type buried layers 40 is performed on the surface of the silicon substrate 30. For example, arsenic ions are implanted as N-type impurity ions. Thereafter, a drive process (heat treatment) is performed to activate the implanted ions. Subsequently, an ion implantation for P-type buried layers 38 is performed. For example, boron ions are implanted as P-type impurity ions.

Further, a P-type epitaxial layer 31 is grown on the silicon substrate 30. Specifically, a silicon crystal is epitaxially grown while adding a P-type impurity (for example, boron). A thickness of the P-type epitaxial layer 31 is, for example, about 5 μm. The N-type impurity and the P-type impurity implanted into the silicon substrate 30 are diffused into the silicon substrate 30 and the P-type epitaxial layer 31 by heat generated during the epitaxial growth. Thus, the P-type buried layers 38 and the N-type buried layers 40 are formed at the boundary between the silicon substrate 30 and the P-type epitaxial layer 31.

As illustrated in FIG. 3B, nitride films 72 are formed so as to cover the entire region of the thermal oxide films 71 by, for example, a chemical vapor deposition (CVD) method. Openings 73 for exposing regions where the trenches 32 are to be formed in the nitride films 72 and the thermal oxide films 71 are selectively formed by, for example, photolithography and etching. Subsequently, unnecessary portions of the P-type epitaxial layer 31 are removed by etching using the nitride films 72 and the thermal oxide films 71 as a mask to form trenches 32. Subsequently, thin liner oxide films (not shown) are formed on the side surfaces and bottom surfaces of the trenches 32 by, for example, a thermal oxidation method. Subsequently, an insulating film 74 (silicon oxide film) made of silicon oxide is formed so as to cover the entire region of the nitride films 72 by burying the trenches 32 by, for example, a CVD method.

Next, as illustrated in FIG. 3C, silicon oxide films 33, which are insulators, are buried in the trenches 32. Thus, device isolation regions 35 are formed to partition device forming regions 34 for forming the first transistor M1, the third transistor M3, the fourth transistor M4, and the sixth transistor M6. Then, the nitride films 72 and the thermal oxide films 71 are sequentially removed by etching.

As illustrated in FIG. 3D, a high pressure-resistant N-type well layer 39 is formed in each of the device forming regions 34 for forming the first transistor M1, the third transistor M3, the fourth transistor M4, and the sixth transistor M6. Specifically, N-type impurity ions are implanted into each of the device forming regions 34.

As illustrated in FIG. 3E, a P-type drift layer 37 is formed in each of the device isolation regions 35. Specifically, P-type impurity ions are implanted into each of the device isolation regions 35. For example, boron ions are used as the P-type impurity ions. Thereafter, annealing is performed as the heat treatment to activate the implanted N-type impurity ions and P-type impurity ions.

As illustrated in FIG. 3F, a P-type well layer 41 is formed in the surface layer portion of the N-type well layer 39 of the device forming region 34 corresponding to the third transistor M3, and an N-type well layer 63 is formed in the surface layer portion of the device forming region 34 corresponding to the sixth transistor M6. That is, as illustrated in FIG. 3F, a step of forming a channel region in a region where the third transistor M3 is formed and a region where the sixth transistor M6 is formed in the silicon substrate 30 as the semiconductor substrate is a second step. Specifically, an ion implantation mask (not shown) having an opening that exposes the device forming region 34 of the third transistor M3 is formed so as to cover the device forming regions 34 and the device isolation regions 35 of the first transistor M1, the fourth transistor M4, and the sixth transistor M6. Then, P-type impurity ions are implanted through the opening of this ion implantation mask. That is, by selectively performing the ion implantation such that the impurity ions are implanted into the region where the third transistor M3 is formed in the silicon substrate 30 as the semiconductor substrate while no impurity ions are implanted into the regions where the first transistor M1, the fourth transistor M4, and the sixth transistor M6 are formed, the channel region is formed in the region where the third transistor M3 is formed. For example, boron ions are used as the P-type impurity ions. Next, an ion implantation mask (not shown) having an opening that exposes the device forming region 34 of the sixth transistor M6 is formed so as to cover the device forming regions 34 and the device isolation regions 35 of the first transistor M1, the third transistor M3, and the fourth transistor M4. Then, N-type impurity ions are implanted through the opening of this ion implantation mask. That is, by selectively performing the ion implantation such that impurity ions are implanted into the region where the sixth transistor M6 is formed in the silicon substrate 30 while no impurity ions are implanted into the regions where the first transistor M1, the third transistor M3, and the fourth transistor M4 are formed, the channel region is formed in the region where the sixth transistor M6 is formed. For example, arsenic ions and phosphorus ions are used as the N-type impurity ions. In the present embodiment, the N-type well layer 63 of the sixth transistor M6 is formed after the formation of the P-type well layer 41 of the third transistor M3, but the P-type well layer 41 of the third transistor M3 may also be formed after the formation of the N-type well layer 63 of the sixth transistor M6.

As illustrated in FIG. 3G, a P-type well layer 62 is formed in the surface layer portion of the N-type well layer 39 of the first transistor M1, and an N-type well layer 70 is formed in the surface layer portion of the N-type well layer 39 of the fourth transistor M4. That is, as illustrated in FIG. 3G, a step of forming channel regions in the region where the first transistor M1 is formed and the region where the fourth transistor M4 is formed in the silicon substrate 30 as the semiconductor substrate is a first step. Specifically, an ion implantation mask (not shown) having an opening that exposes the device forming region 34 of the first transistor M1 is formed so as to cover the device forming regions 34 and the device isolation regions 35 of the third transistor M3, the fourth transistor M4, and the sixth transistor M6. Then, P-type impurity ions are implanted through the opening of this ion implantation mask. That is, by selectively performing the ion implantation such that impurity ions are implanted into the region where the first transistor M1 is formed in the silicon substrate 30 as the semiconductor substrate while no impurity ions are implanted into the regions where the third transistor M3, the fourth transistor M4, and the sixth transistor M6 are formed, the channel region is formed in the region where the third transistor M3 is formed. For example, boron ions are used as the P-type impurity ions. Here, the ion implantation is performed such that the P-type impurity concentration of the P-type well layer 41 of the first transistor M1 is lower than the P-type impurity concentration of the P-type well layer 41 of the third transistor M3. For example, the ion implantation is performed such that the P-type impurity concentration of the P-type well layer 62 of the first transistor M1 is about ½ of the P-type impurity concentration of the P-type well layer 41 of the third transistor M3. In some embodiments, the ion implantation may be performed such that the P-type impurity concentration of the P-type well layer 62 of the first transistor M1 is about ⅒ of the P-type impurity concentration of the P-type well layer 41 of the third transistor M3.

Subsequently, an ion implantation mask (not shown) having an opening that exposes the device forming region 34 of the fourth transistor M4 is formed so as to cover the device forming regions 34 and the device isolation regions 35 of the first transistor M1, the third transistor M3, and the sixth transistor M6. Then, N-type impurity ions are implanted through the opening of this ion implantation mask. That is, by selectively performing the ion implantation such that impurity ions are implanted into the region where the fourth transistor M4 is formed in the silicon substrate 30 as the semiconductor substrate while no impurity ions are implanted into the regions where the first transistor M1, the third transistor M3, and the sixth transistor M6 are formed, the channel region is formed in the region where the fourth transistor M4 is formed. For example, arsenic ions and phosphorus ions are used as the N-type impurity ions. Here, the ion implantation is performed such that the N-type impurity concentration of the N-type well layer 70 of the fourth transistor M4 is lower than the N-type impurity concentration of the N-type well layer 63 of the sixth transistor M6. For example, the ion implantation is performed such that the N-type impurity concentration of the N-type well layer 70 of the fourth transistor M4 is about ½ or less of the N-type impurity concentration of the N-type well layer 63 of the sixth transistor M6. In some embodiments, the ion implantation is performed such that the N-type impurity concentration of the N-type well layer 70 of the fourth transistor M4 is about ¹/₁₀ of the N-type impurity concentration of the N-type well layer 63 of the sixth transistor M6. In the present embodiment, the N-type well layer 70 of the fourth transistor M4 is formed after the formation of the P-type well layer 62 of the first transistor M1, but the P-type well layer 62 of the first transistor M1 may also be formed after the formation of the N-type well layer 70 of the fourth transistor M4. That is, in the present embodiment, the first step is performed after the second step, but the second step may also be performed after the first step.

As illustrated in FIG. 3H, a thermal oxide film 75 is formed on the surface of the P-type epitaxial layer 31 in the device forming regions 34 by, for example, a thermal oxidation method. Subsequently, a polysilicon film 76 is formed so as to cover the thermal oxide film 75 and the silicon oxide film 33.

As illustrated in FIG. 3I, unnecessary portions of the thermal oxide film 75 and the polysilicon film 76 are removed to form gate insulating films 42 and gate electrodes 43 patterned into a predetermined shape in the device forming regions 34 of the first transistor M1, the third transistor M3, the fourth transistor M4, and the sixth transistor M6 by, for example, photolithography and etching. Subsequently, a stacked film (not shown) of a nitride film and an oxide film is formed on the P-type epitaxial layer 31 by, for example, a CVD method, and is then selectively etched to form a sidewall 44 on the side surface of each of the gate electrodes 43.

As illustrated in FIG. 3J, low concentration source regions 47 and low concentration drain regions 49 are formed in the device forming regions 34 of the first transistor M1 and the third transistor M3, and low concentration source regions 66 and low concentration drain regions 68 are formed in the device forming regions 34 of the fourth transistor M4 and the sixth transistor M6. Specifically, an ion implantation mask (not shown) having an opening that exposes the device forming regions 34 of the first transistor M1 and the third transistor M3 is formed so as to cover the device forming regions 34 and the device isolation regions 35 of the fourth transistor M4 and the sixth transistor M6. Then, N-type impurity ions are implanted through the opening of the ion implantation mask. Next, the ion implantation mask is removed and an ion implantation mask (not shown) having an opening that exposes the device forming regions 34 of the fourth transistor M4 and the sixth transistor M6 is formed so as to cover the device forming regions 34 and the device isolation regions 35 of the first transistor M1 and the third transistor M3. Then, P-type impurity ions are implanted through the opening of this ion implantation mask. For example, $BF_2$ ions are used as the P-type impurity ions. In the present embodiment, the low concentration source regions 66 and the low concentration drain regions 68 are formed after the low concentration source regions 47 and the low concentration drain regions 49 are formed, but the low concentration source regions 47 and the low concentration drain regions 49 may also be formed after the low concentration source regions 66 and the low concentration drain regions 68 are formed.

As illustrated in FIG. 3K, high concentration source regions 48 and high concentration drain regions 50 are formed in the device forming regions 34 of the first transistor M1 and the third transistor M3, and high concentration source regions 67 and high concentration drain regions 69 are formed in the device forming regions of the fourth transistor M4 and the sixth transistor M6. Specifically, an ion implantation mask (not shown) having an opening that exposes the device forming regions 34 of the first transistor M1 and the third transistor M3 is formed so as to cover the device forming regions 34 and the device isolation regions 35 of the fourth transistor M4 and the sixth transistor M6. Then, N-type impurity ions are implanted through the opening of the ion implantation mask. Subsequently, the ion implantation mask is removed and an ion implantation mask (not shown) having an opening that exposes the device forming regions 34 of the fourth transistor M4 and the sixth transistor M6 is formed so as to cover the device forming regions 34 and the device isolation regions 35 of the first transistor M1 and the third transistor M3. Then, P-type impurity ions are implanted through the opening of the ion implantation mask. For example, boron ions are used as the P-type impurity ions. In the present embodiment, the high concentration source regions 67 and the high concentration drain regions 69 are formed after the formation of the high concentration source regions 48 and the high concentration drain regions 50, but the high concentration source regions 48 and the high concentration drain regions 50 may also be formed after the formation of the high concentration source regions 67 and the high concentration drain regions 69.

As illustrated in FIG. 3L, silicide layers 77 are formed on surfaces of the high concentration source regions 48, the high concentration drain regions 50 and the gate electrodes 43 formed in the device forming regions 34 of the first transistor M1 and the third transistor M3. Also, silicide layers 77 are formed on surfaces of the high concentration source regions 67, the high concentration drain regions 69 and the gate electrodes 43 formed in the device forming regions 34 of the fourth transistor M4 and the sixth transistor M6. Specifically, a cobalt film (not shown) is formed on the surface of the P-type epitaxial layer 31 by, for example, a PVD method, followed by heat treatment. Accordingly, the cobalt films of the high concentration source regions 48 and 67, the high concentration drain regions 50 and 69, and the gate electrode 43 in each device forming region 34 are modified into the silicide layers 77, while the cobalt film on the silicon oxide film 33 in each device isolation region 35 remains cobalt. Then, the cobalt on each silicon oxide film 33 is selectively removed by, for example, chemical treatment.

As illustrated in FIG. 3M, a first insulating layer 51, a second insulating layer 52, a source wiring 58, and a drain wiring 60 are formed. Specifically, a nitride film and an oxide film are successively stacked on the P-type epitaxial layer 31 by, for example, a CVD method such that a film 53 and a first interlayer insulating film 54 are formed. Then, the first interlayer insulating film 54 is polished by, for example, a CMP process. Subsequently, the second insulating layer 52 as a silicon oxide film is formed to be stacked on the first interlayer insulating film 54. Next, a source contact hole 55 and a drain contact hole 56 are formed in the second insulating layer 52 and the first insulating layer 51 in each device forming region 34 by photolithography and etching, and Ti/TiN/Al which are materials of the source contact plug 57, the drain contact plug 59, the source wiring 58, and the drain wiring 60 are deposited on the second insulating layer 52. Then, a stacked film of Ti/TiN/Al is patterned by photolithography and etching to form the source contact plug 57, the drain contact plug 59, the source wiring 58, and the drain wiring 60. In addition, a gate wiring 61 (not shown in FIG. 3M) is formed. Accordingly, the first transistor M1, the third transistor M3, the fourth transistor M4, and the sixth transistor M6 are manufactured.

Further, the second transistor M2 is manufactured in the same manner as the first transistor M1, the fifth transistor M5 is manufactured in the same manner as the fourth transistor M4, and the seventh transistor M7 is manufactured in the same manner as the third transistor M3. In addition, the first transistor M1 and the second transistor M2 are simultaneously formed, the fourth transistor M4 and the fifth transistor M5 are simultaneously formed, and the third transistor M3 and the seventh transistor M7 are simultaneously formed.

Figure 4A:
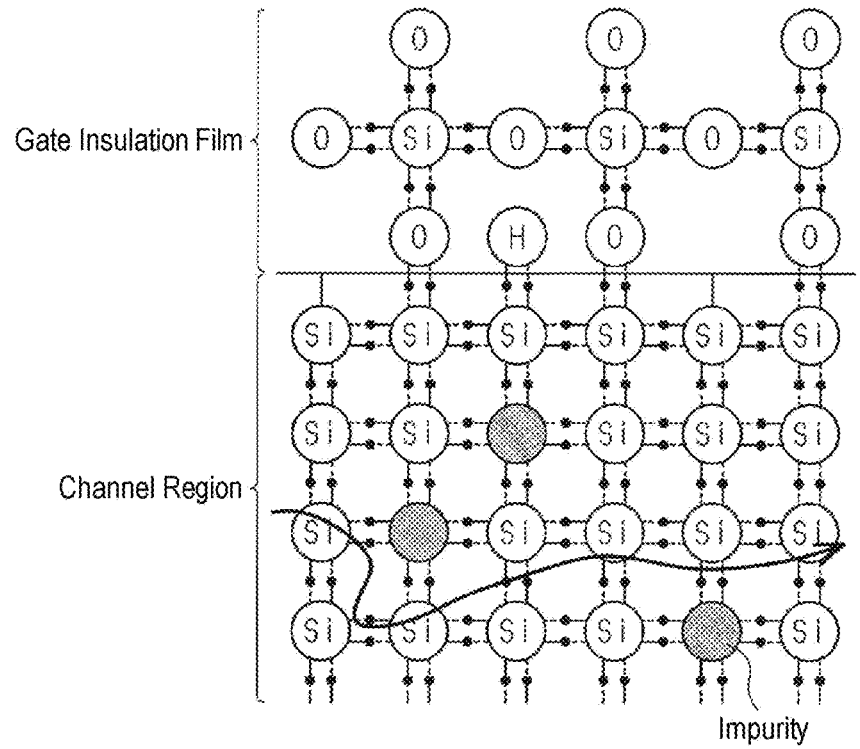
FIG. 4A is a schematic diagram illustrating an operation of the present embodiment.
Figure 4B:
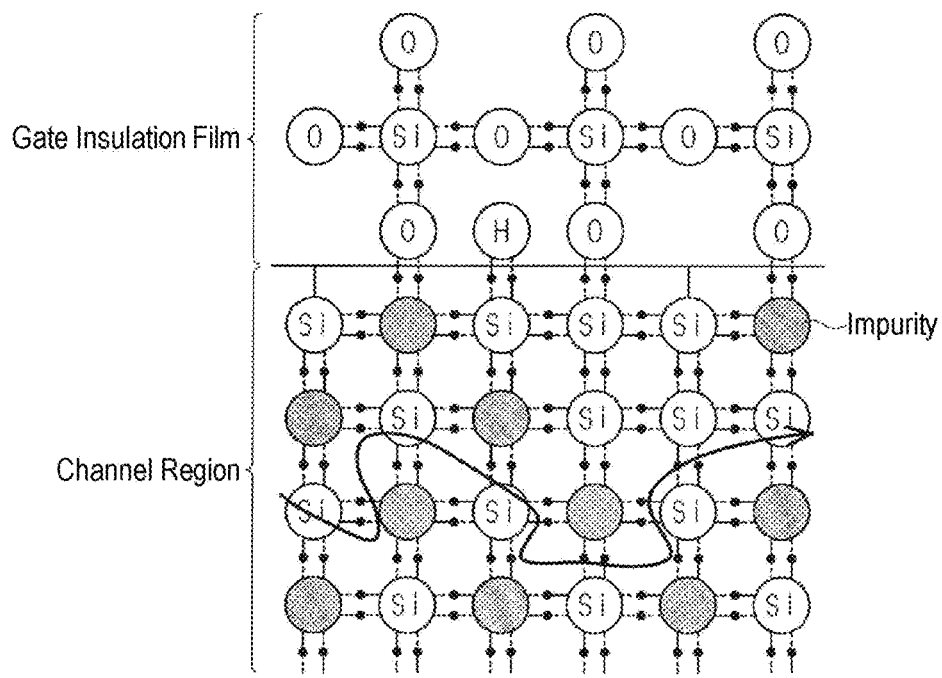
FIG. 4B is a schematic diagram illustrating an operation of a comparative example.

An operation and effects of the present embodiment will be described with reference to FIGS. 4A, 4B, and 5. FIGS. 4A and 4B are diagrams schematically illustrating the atomic arrangement at the interface between the gate electrode 43 and the channel region, in which FIG. 4A illustrates an example of electron movement when the impurity concentration of the channel region is low, and FIG. 4B illustrates an example of electron movement when the impurity concentration of the channel region is high. In other words, FIG. 4B illustrates an example of electron movement in the channel region of the high concentration transistor that includes a channel region having an impurity concentration of a first concentration, and FIG. 4A illustrates an example of movement of electrons in the channel region of the low concentration transistor that includes a channel region having an impurity concentration of a second concentration lower than the first concentration. Further, shaded circles in FIGS. 4A and 4B are impurities.

In order to improve a degree of logic integration of the integrated circuit, miniaturization of the transistors is carried out. For example, a size of a minimum dimension of each of the transistors M1 to M7 may be 0.05 to 10 μm, and is, for example, 0.13 μm, in the present embodiment. According to this miniaturization of the transistors, the 1/f noise (flicker noise) of the output signal of the integrated circuit may become large.

The inventors of the present disclosure have focused on the fact that the 1/f noise of the output signal is caused by the fluctuation of the drain current, and fluctuation of the drain current is caused by fluctuation of mobility of the transistors. In addition, the present inventions have paid attention to the impurity concentration of the channel region as a factor of the fluctuation of mobility.

More specifically, as illustrated in FIGS. 4A and 4B, since the electrons move while being scattered by impurities, movement trajectory of electrons (the arrow in FIG. 4B) when the impurity concentration of the channel region is high becomes more complicated than movement trajectory of electrons (the arrow in FIG. 4A) when the impurity concentration of the channel region is low. Therefore, the fluctuation of mobility when the impurity concentration of the channel region becomes larger than fluctuation of mobility when the impurity concentration of the channel region is low.

In particular, when miniaturizing a transistor, it is generally assumed that the impurity concentration of the channel region is increased based on the scaling rule in order to suppress a short channel effect of each transistor. Then, the scattering by impurities is likely to occur, and the fluctuation of mobility is likely to be large.

Therefore, the inventors of the present disclosure have recognized that the fluctuation of mobility was reduced by making the impurity concentration of the channel region in some of a plurality of transistors constituting the integrated circuit lower than the impurity concentration of the channel region in the other transistors. That is, the inventors of the present disclosure have recognized that the fluctuation of mobility was reduced by including a high concentration transistor that includes the channel region having the impurity concentration of the first concentration and a low concentration transistor that includes the channel region having the impurity concentration of the second concentration lower than the first concentration, in the plurality of transistors of the integrated circuit.

Further, in the present embodiment, the impurity concentrations of the P-type well layer 41 and the N-type well layer 63 of the third transistor M3, the sixth transistor M6 and the seventh transistor M7 which are unlikely to be affected by the 1/f noise of the output signal Sout of the operational amplifier 1 among the transistors M1 to M7 are set to be relatively high. On the other hand, in the present embodiment, the impurity concentrations of the P-type well layer 62 and the N-type well layer 70 of the first transistor M1, the second transistor M2, the fourth transistor M4 and the fifth transistor M5 which are likely to be affected by the 1/f noise of the output signal Sout of the operational amplifier 1 among the transistors M1 to M7 are set to a relatively low impurity concentration without depending on the scaling rule. Specifically, the impurity concentrations (the second concentration) of the P-type well layer 62 and the N-type well layer 70 of the first transistor M1, the second transistor M2, the fourth transistor M4 and the fifth transistor M5 are set to about ⅒ of the impurity concentrations (the first concentration) of the P-type well layer 41 and the N-type well layer 63 of the third transistor M3, the sixth transistor M6 and the seventh transistor M7. Accordingly, the fluctuation of mobility of the transistors which are likely to be affected by the 1/f noise of the output signal Sout is reduced.

Figure 5:
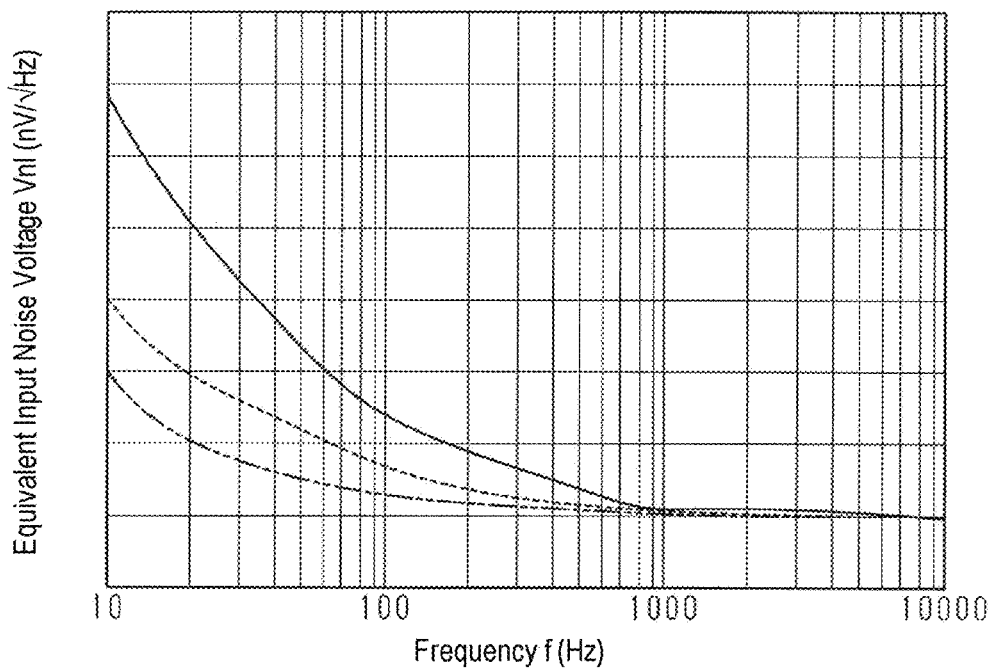
FIG. 5 is a graph illustrating a relationship between a frequency and an equivalent input noise voltage.

The solid line in FIG. 5 indicates an equivalent input noise voltage when the impurity concentrations of the P-type well layer 62 and the N-type well layer 70 of the first transistor M1, the second transistor M2, the fourth transistor M4 and the fifth transistor M5 are equal to the impurity concentrations of the P-type well layer 41 and the N-type well layer 63 of the third transistor M3, the transistor M6 and the seventh transistor M7. The dashed line in FIG. 5 indicates an equivalent input noise voltage when the impurity concentrations of the P-type well layer 62 and the N-type well layer 70 of the first transistor M1, the second transistor M2, the fourth transistor M4 and the fifth transistor M5 are about ½ of the impurity concentrations of the P-type well layer 41 and the N-type well layer 63 of the third transistor M3, the sixth transistor M6 and the seventh transistor M7. The two-dot chain line in FIG. 5 indicates an equivalent input noise voltage when the impurity concentrations of the P-type well layer 62 and the N-type well layer 70 of the first transistor M1, the second transistor M2, the fourth transistor M4 and the fifth transistor M5 are about ⅒ of the impurity concentrations of the P type well layer 41 and the N type well layer 63 of the third transistor M3, the sixth transistor M6 and the seventh transistor M7. As illustrated in FIG. 5, it can be seen that as the impurity concentrations of the P-type well layer 62 and the N-type well layer 70 of the first transistor M1, the second transistor M2, the fourth transistor M4 and the fifth transistor M5 become lower, the equivalent input noise voltage, namely the 1/f noise of the output signal Sout, is reduced.

According to the present embodiment, the following effects may be achieved.

(1-1) The impurity concentration of the P-type well layer 62 of the first transistor M1 and the second transistor M2 constituting the differential pair 11 of the operational amplifier 1 is lower than the impurity concentration of the N-type well layer 63 of the sixth transistor M6 constituting the output stage 20 as the last stage of the operational amplifier 1 and that of the P-type well layer 41 of the seventh transistor M7. With this configuration, by lowering the impurity concentration of the P-type well layer 62 of each of the transistors M1 and M2 constituting the differential pair 11 which are likely to be affected by the 1/f noise of the output signal Sout in the operational amplifier 1, the fluctuation of mobility can be suppressed and the fluctuation of the drain current can be suppressed. Thus, it is possible to effectively reduce the 1/f noise of the operational amplifier 1.

On the other hand, by relatively increasing the impurity concentration of the N-type well layer 63 of the sixth transistor M6 of the last stage which contributes to the driving current of the operational amplifier 1 and the impurity concentration of the P-type well layer 41 of the seventh transistor M7, it is possible to suppress a variation in a threshold value of each of the transistors M6 and M7. This makes it possible to promote stabilization of operation of the operational amplifier 1.

More specifically, the plurality of transistors included in the operational amplifier 1 includes transistors that require a stable threshold value. When the low concentration transistors such as the transistors M1 and M2 are used for such transistors for which the stable threshold value is required, there is a possibility that operation of the operational amplifier 1 becomes unstable.

To this end, in the present embodiment, since both the low concentration transistors such as the transistors M1 and M2 and the high concentration transistors such as the transistors M6 and M7 exist in the operational amplifier 1, it is possible to promote stabilization of operation of the operational amplifier 1 while effectively reducing the 1/f noise.

(1-2) The impurity concentration of the N-type well layer 70 of the fourth transistor M4 and the fifth transistor M5 constituting the current mirror circuit 13 of the operational amplifier 1 is lower than the impurity concentration of the N-type well layer 63 of the sixth transistor M6 and the P-type well layer 41 of the seventh transistor M7 constituting the output stage 20 as the last stage of the operational amplifier 1. With this configuration, by lowering the impurity concentration of the N-type well layer 70 of each of the transistors M4 and M5 constituting the current mirror circuit 13 which are likely to be affected by the 1/f noise of the output signal Sout in the operational amplifier 1, the fluctuation of mobility can be suppressed and the fluctuation of the drain current can be suppressed. Thus, it is possible to effectively reduce the 1/f noise of the operational amplifier 1.

(1-3) The third transistor M3 constituting the tail current source 12 and the seventh transistor M7 constituting the output stage 20 are MOSFETs having the same conductivity type (N-channel MOSFETs), and the P-type well layer 41 of the third transistor M3 and the P-type well layer 41 of the seventh transistor M7 have the same impurity concentration. With this configuration, since the step of forming the P-type well layer 41 of the third transistor M3 and the step of forming the P-type well layer 41 of the seventh transistor M7 can be performed in batches, it is possible to simplify the process of manufacturing the operational amplifier 1.

Figure 6:
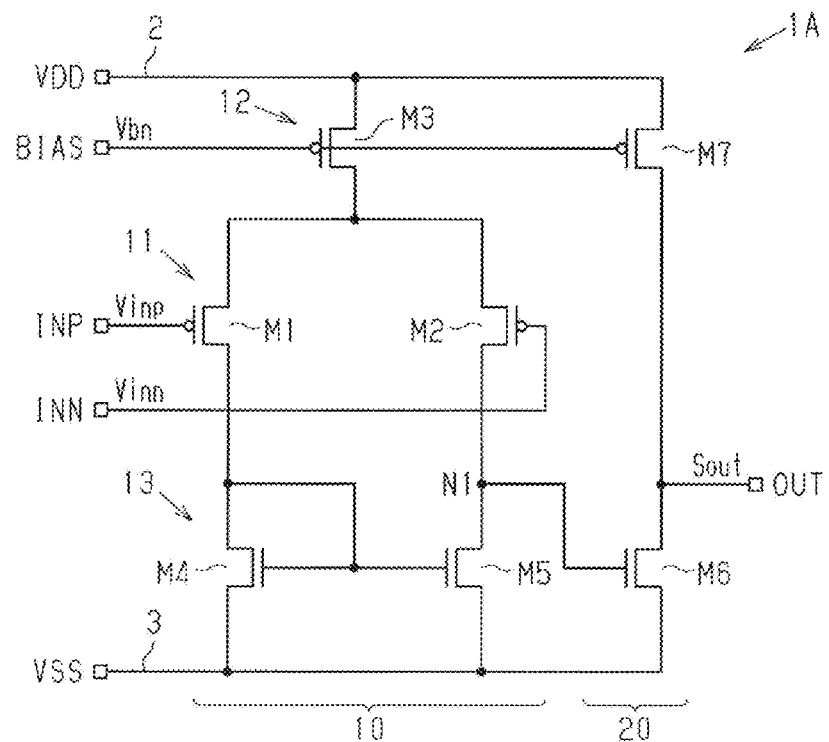
FIG. 6 is a circuit diagram of an operational amplifier according to an exemplary modification of the first embodiment of the present disclosure.

The operational amplifier 1 illustrated in FIG. 1 may also be modified like an operational amplifier 1A illustrated in FIG. 6. In the operational amplifier 1A, types of transistors M1 to M7 are mainly different.

The first transistor M1 and the second transistor M2 of the differential pair 11 and the third transistor M3 of the tail current source 12 are P-channel MOSFETs. A source of the third transistor M3 is connected to a first power line 2, and a drain of the third transistor M3 is connected to sources of the first transistor M1 and the second transistor M2.

The fourth transistor M4 and the fifth transistor M5 of the current mirror circuit 13 are N-channel MOSFETs. Sources of the fourth transistor M4 and the fifth transistor M5 are connected to a second power line 3, a drain of the fourth transistor M4 is connected to a drain of the first transistor M1, and a drain of the fifth transistor M5 is connected to a drain of the second transistor M2.

In the output stage 20, the sixth transistor M6 is an N-channel MOSFET, and the seventh transistor M7 is a P-channel MOSFET. A source of the sixth transistor M6 is connected to the second power line 3, and a source of the seventh transistor M7 is connected to the first power line 2.

In the operational amplifier 1A, similar to the operational amplifier 1 of the present embodiment, the impurity concentrations of the P-type well layer 62 and the N-type well layer 70 of the first transistor M1, the second transistor M2, the fourth transistor M4 and the fifth transistor M5 are set lower than the impurity concentrations of the P-type well layer 41 and the N-type well layer 63 of the third transistor M3, the sixth transistor M6 and the seventh transistor M7. Even in the operational amplifier 1A having such a configuration, the same effects as those of the operational amplifier 1 of the present embodiment may be achieved.

(Second Embodiment)

An operational amplifier 1 according to a second embodiment of the present disclosure will be described with reference to FIG. 1 and FIGS. 7A to 9B. The operational amplifier 1 of the present embodiment differs from the operational amplifier 1 of the first embodiment in the structure of transistors devised to reduce the 1/f noise of the output signal Sout of the operational amplifier 1.

Figure 7A:
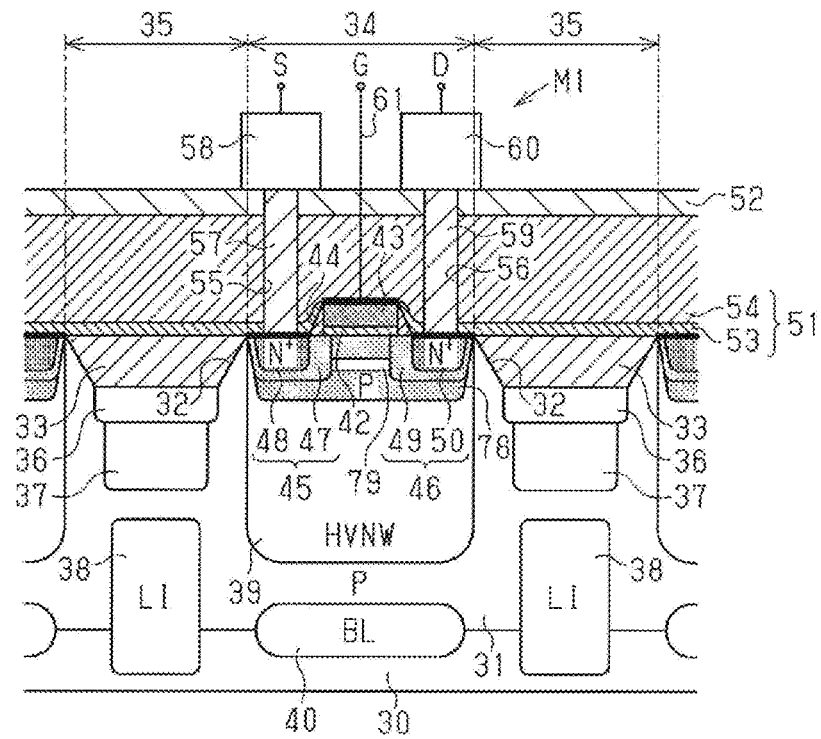
FIG. 7A is a cross-sectional view of a first transistor constituting a differential pair of the operational amplifier in an integrated circuit according to a second embodiment of the present disclosure.

As illustrated in FIG. 7A, a first transistor M1 of the present embodiment has the same structure as the third transistor M3 of the first embodiment except that it is modified to have a buried channel type. That is, a P-type impurity concentration of a P-type well layer 78 in the first transistor M1 of the present embodiment is different from the P-type impurity concentration of the P-type well layer 62 (see FIG. 2B) in the first transistor M1 of the first embodiment, and is equal to the P-type impurity concentration of the P-type well layer 41 (see FIG. 2A) of the third transistor M3.

A buried channel layer 79 is formed in a region (channel region) facing the gate insulating film 42 in the P-type well layer 78. The buried channel layer 79 is a region (layer) having the same conductivity type as that of the source region 45 and the drain region 46. That is, the buried channel layer 79 is an N-type region (layer) that is the same as the source region 45 and the drain region 46 doped with an N-type impurity. The buried channel layer 79 is formed inside the P-type well layer 78. Specifically, the buried channel layer 79 is formed at a position spaced downward from the interface between the P-type well layer 78 and the gate insulating film 42.

As described above, in the present embodiment, the channel region (the buried channel layer 79) of the first transistor M1 is arranged below the gate insulating film 42 in the P-type well layer 78 and between the source region 45 and the drain region 46. In the present embodiment, the channel region (the buried channel layer 79) of the first transistor M1 includes no interface between the P-type well layer 78 and the gate insulating film 42. In addition, a total impurity concentration of the channel region (the buried channel layer 79) of the first transistor M1 is higher than the impurity concentration of the P-type well layer 78. Further, the second transistor M2 has the same configuration as the first transistor M1.

Figure 7B:
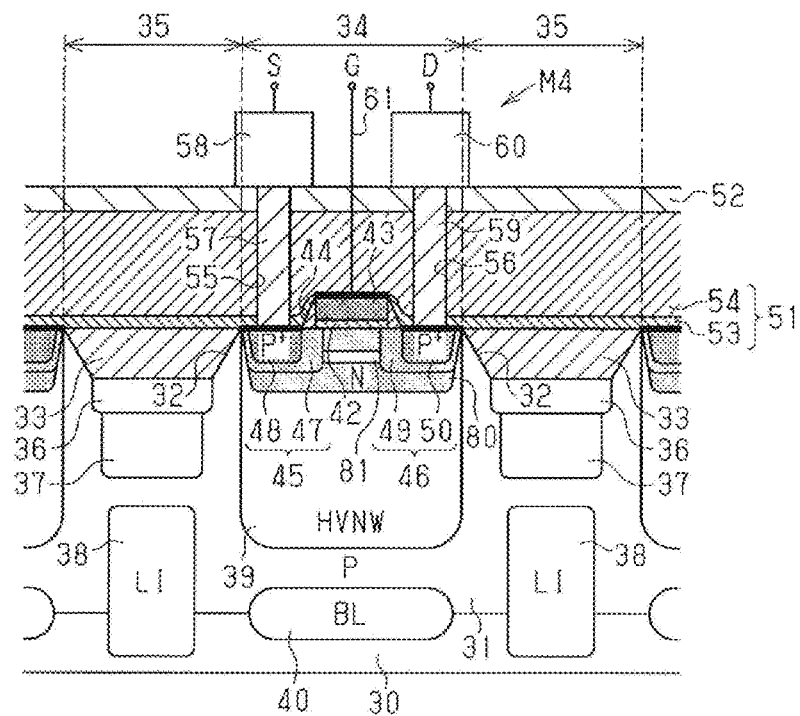
FIG. 7B is a cross-sectional view of a fourth transistor constituting a current mirror circuit of the operational amplifier.

As illustrated in FIG. 7B, the fourth transistor M4 has the same structure as the sixth transistor M6 except that it is modified to have a buried channel type. That is, the N-type impurity concentration of the N-type well layer 80 in the fourth transistor M4 of the present embodiment is different from the N-type impurity concentration of the N-type well layer 70 (see FIG. 2D) in the fourth transistor M4 of the first embodiment and is equal to the N-type impurity concentration of the N-type well layer 63 (see FIG. 2C) of the sixth transistor M6.

A buried channel layer 81 is formed in a region (channel region) facing the gate insulating film 42 in the N-type well layer 80. The buried channel layer 81 is a region (layer) having the same conductivity type as that of the source region 64 and the drain region 65. That is, the buried channel layer 81 is a P-type region (layer) that is the same as the source region 64 and the drain region 65 doped with a P-type impurity. The buried channel layer 81 is formed inside the N-type well layer 80. Specifically, the buried channel layer 81 is formed at a position spaced downward from the interface between the N-type well layer 80 and the gate insulating film 42.

As described above, in the present embodiment, the channel region (the buried channel layer 81) of the fourth transistor M4 is arranged below the gate insulating film 42 in the N-type well layer 80 and between the source region 64 and the drain region 65. In the present embodiment, the channel region (the buried channel layer 81) of the fourth transistor M4 includes no interface between the N-type well layer 80 and the gate insulating film 42. Further, a total impurity concentration of the channel region (the buried channel layer 81) of the fourth transistor M4 is higher than the impurity concentration of the N-type well layer 80. Also, the fifth transistor M5 has the same configuration as the fourth transistor M4.

[Method of Manufacturing a Transistor]

A method of manufacturing a first transistor M1, a third transistor M3, a fourth transistor M4, and a sixth transistor M6 will be described with reference to FIGS. 8A and 8B. Further, in FIGS. 8A and 8B, for convenience of description, it is assumed that the first transistor M1, the third transistor M3, the fourth transistor M4, and the sixth transistor M6 are formed to be adjacent to each other. The method of manufacturing a transistor according to the present embodiment is different from the method of manufacturing a transistor according to the first embodiment in a step of forming a well. In the following description, the well forming step will be mainly described.

In the well forming step, a step of forming a high pressure-resistant N-type well layer 39 in a device forming region 34 of a P-type epitaxial layer 31 and a step of forming a P-type drift layer 37 in the device isolation region 35 of the P-type epitaxial layer 31 are similar to those in the first embodiment.

As illustrated in FIG. 8A, a P-type well layer 78 is formed in a surface layer portion of an N-type well layer 39 of the first transistor M1 and a P-type well layer 41 is formed in the surface layer portion of the N-type well layer 39 of the third transistor M3. An N-type well layer 80 is formed in the surface layer portion of the N-type well layer 39 of the fourth transistor M4 and an N-type well layer 63 is formed in the surface layer portion of the N-type well layer 39 of the sixth transistor M6. Specifically, an ion implantation mask (not shown) having an opening that exposes the device forming regions 34 of the first transistor M1 and the third transistor M3 is formed so as to cover the device forming regions 34 and the device isolation regions 35 of the fourth transistor M4 and the sixth transistor M6. Then, P-type impurity ions are implanted through the opening of this ion implantation mask. For example, boron ions are used as the P-type impurity ions. Next, the ion implantation mask is removed and an ion implantation mask (not shown) having an opening that exposes the device forming regions 34 of the fourth transistor M4 and the sixth transistor M6 is formed so as to cover the device forming regions 34 and the device isolation regions 35 of the first transistor M1 and the third transistor M3. Then, N-type impurity ions are implanted through the opening of the ion implantation mask. For example, arsenic ions and phosphorus ions are used as the N-type impurity ions. In this manner, the P-type impurity concentration of the P-type well layer 78 of the first transistor M1 and the impurity concentration of the P-type well layer 41 of the third transistor M3 are equal to each other, and the impurity concentration of the N-type well layer 80 of the fourth transistor M4 and the impurity concentration of the N-type well layer 63 of the sixth transistor M6 are equal to each other.

As illustrated in FIG. 8B, a buried channel layer 79 is formed in the P-type well layer 78 of the first transistor M1 and a buried channel layer 81 is formed in the N-type well layer 80 of the fourth transistor M4. Specifically, an ion implantation mask (not shown) having an opening that exposes the device forming region 34 of the first transistor M1 is formed so as to cover the device forming regions 34 and the device isolation regions 35 of the third transistor M3, the fourth transistor M4, and the sixth transistor M6. Then, N-type impurity ions are implanted through the opening of this ion implantation mask. For example, phosphorus ions are used as the N-type impurity ions. Accordingly, the buried channel layer 79 is formed. Next, the ion implantation mask is removed and an ion implantation mask (not shown) having an opening that exposes the device forming region 34 of the fourth transistor M4 is formed so as to cover the device forming regions 34 and the device isolation regions 35 of the first transistor M1, the third transistor M3, and the sixth transistor M6. Then, P-type impurity ions are implanted through the opening of this ion implantation mask. Accordingly, the buried channel layer 81 is formed. Thereafter, the ion implantation mask is removed. Then, as in the first embodiment, the first transistor M1, the third transistor M3, the fourth transistor M4, and the sixth transistor M6 are manufactured through a gate forming step, a source/drain forming step, and a wiring step.

Further, the second transistor M2 is manufactured in the same manner as the first transistor M1, the fifth transistor M5 is manufactured in the same manner as the fourth transistor M4, and the seventh transistor M7 is manufactured in the same manner as the third transistor M3. In addition, the first transistor M1 and the second transistor M2 are simultaneously formed, the fourth transistor M4 and the fifth transistor M5 are simultaneously formed, and the third transistor M3 and the seventh transistor M7 are simultaneously formed.

An operation of the present embodiment will be described with reference to FIGS. 9A and 9B. Further, the hatched circles in FIGS. 9A and 9B are impurities.

The inventors of the present disclosure have focused on the influence due to the roughness of the interface as a factor of the fluctuation of mobility of the transistors.

Figure 9A:
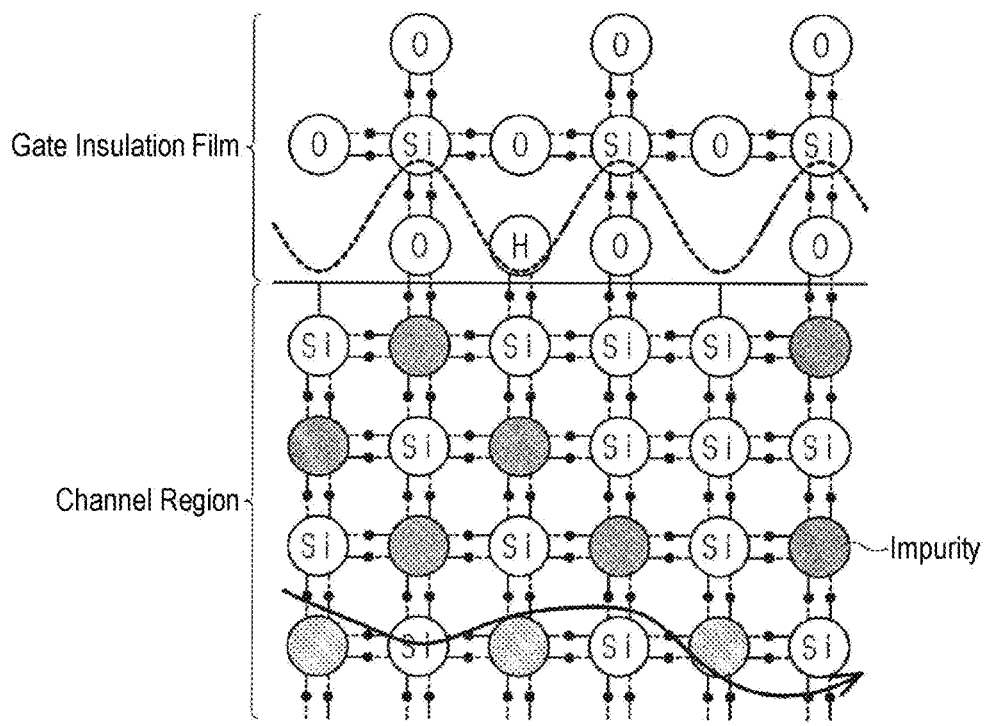
FIG. 9A is a schematic diagram illustrating an operation of the present embodiment.
Figure 9B:
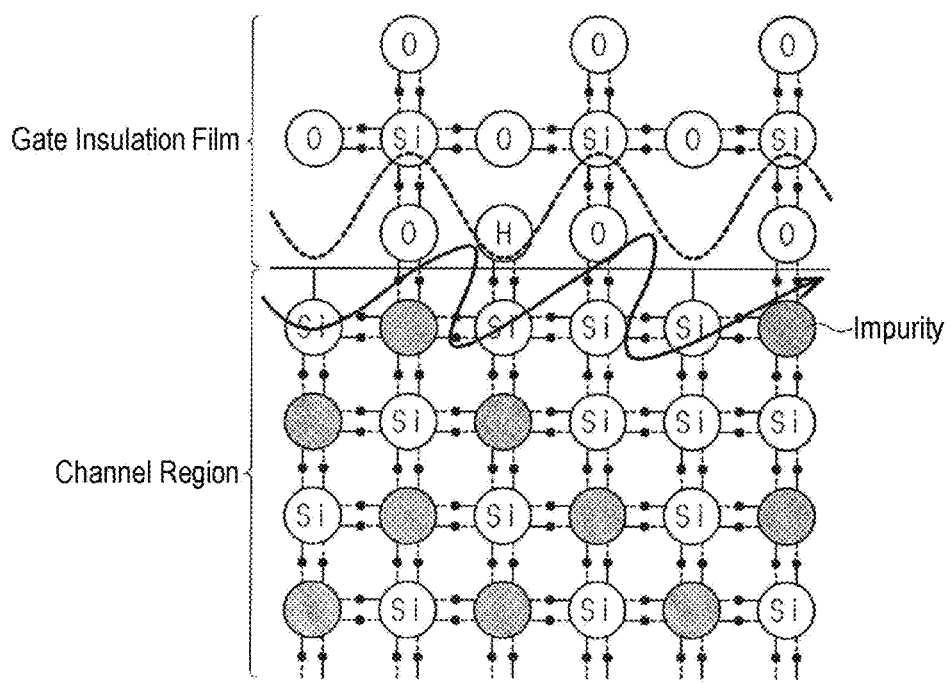
FIG. 9B is a schematic diagram illustrating an operation of a comparative example.

More specifically, as illustrated in FIGS. 9A and 9B, in the surface channel type MOSFETs, electrons move near the interface between the P-type well layer and the gate insulating film in the channel region (the arrow in FIG. 9B), and in the buried channel type MOSFETs, electrons move in a region below the interface between the P-type well layer and the gate insulating film (the arrow in FIG. 9A). Here, since the interface between the P-type well layer and the gate insulating film is uneven as indicated by the broken line in FIG. 9B, electrons are scattered and moved in the surface channel type MOSFET. It is also likely to be affected by trapping and detrapping due to the defect level at the interface between the P-type well layer and the gate insulating film. On the other hand, in the buried channel type MOSFETs, since electrons move in a region apart from the interface between the P-type well layer and the gate insulating film in the channel region, it is unlikely to be affected by the interface when the electrons move. Therefore, the fluctuation of mobility of the buried channel type MOSFETs becomes smaller than the fluctuation of mobility of the surface channel type MOSFETs.

Therefore, the inventors of the present disclosure have recognized that the fluctuation of mobility was reduced by using some of the plurality of transistors constituting the integrated circuit as the buried channel type MOSFETs and using the other transistors as the surface channel type MOSFETs. More specifically, the buried channel type MOSFETs are used for the transistors which are likely to be affected by the 1/f noise of the integrated circuit among the plurality of transistors constituting the integrated circuit, and the surface channel type MOSFETs are used for the transistors which are unlikely to be affected by the 1/f noise of the integrated circuit.

In the present embodiment, the surface channel type MOSFETs are used for the third transistor M3, the sixth transistor M6, and the seventh transistor M7 which are unlikely to be affected by the 1/f noise of the output signal Sout of the operational amplifier 1 among the transistors M1 to M7. Further, the buried channel type MOSFETs are used for the first transistor M1, the second transistor M2, the fourth transistor M4, and the fifth transistor M5 which are likely to be affected by the 1/f noise of the output signal Sout of the operational amplifier 1 among the transistors M1 to M7. Accordingly, it is possible to reduce the 1/f noise of the output signal Sout in order to reduce the fluctuation of mobility of the transistors which are likely to be affected by the 1/f noise of the output signal Sout.

(Third Embodiment)

An operational amplifier 1 according to a third embodiment of the present disclosure will be described with reference to FIG. 1, FIG. 10A, FIG. 10B, and FIGS. 11A to 11C. The operational amplifier 1 according to the present embodiment differs from the operational amplifier 1 according to the first embodiment in the structure of transistors devised to reduce the 1/f noise of the output signal Sout of the operational amplifier 1.

Figure 10A:
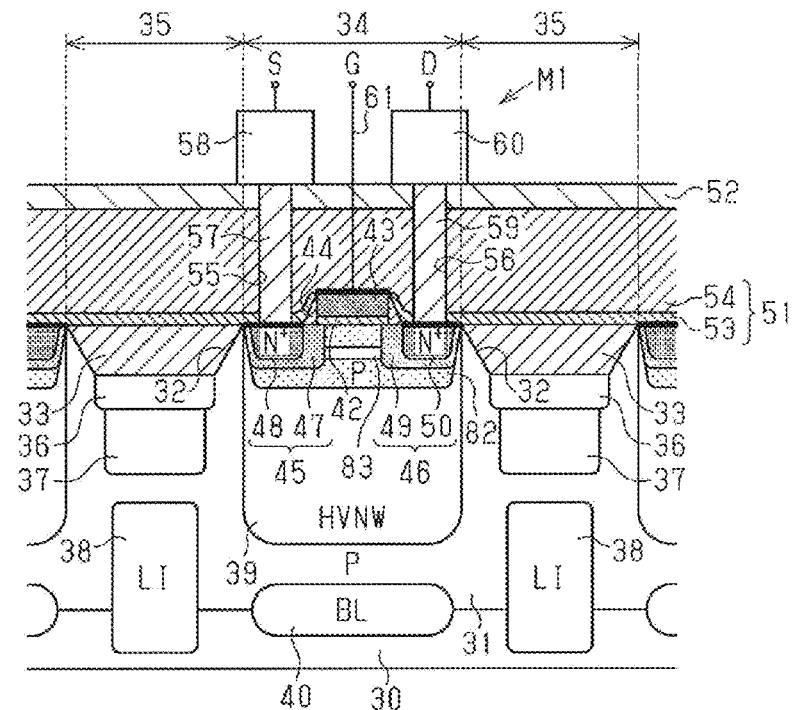
FIG. 10A is a cross-sectional view of a first transistor constituting a differential pair of the operational amplifier in an integrated circuit according to a third embodiment of the present disclosure.

As illustrated in FIG. 10A, a first transistor M1 of the present embodiment is a combination of the first transistor M1 of the first embodiment and the first transistor M1 of the second embodiment. That is, in the first transistor M1 of the present embodiment, the impurity concentration of the channel region is lower than the impurity concentration of the channel region (the P-type well layer 41: see FIG. 2A) of the third transistor M3, and it is replaced by the buried channel type MOSFET. Other transistors have the same structure as the third transistor M3.

The impurity concentration of a P-type well layer 82 forming the channel region of the first transistor M1 is lower than the impurity concentration of the channel region based on the scaling rule. In some embodiments, the impurity concentration of the P-type well layer 82 may be as low as possible within a range in which the device characteristics do not excessively deviate due to a reduction in the impurity concentration. In one example, the impurity concentration of the P-type well layer 82 is about ½ or less of the P-type impurity concentration of the P-type well layer 41 of the third transistor M3. In some embodiments, the impurity concentration of the P-type well layer 82 is about ¹⁄₁₀ of the impurity concentration of the P-type well layer 41 of the third transistor M3.

A buried channel layer 83 is formed in a region (channel region) facing the gate insulating film 42 in the P-type well layer 82. The buried channel layer 83 is a region (layer) having the same conductivity type as the source region 45 and the drain region 46. That is, the buried channel layer 83 is an N-type region (layer) that is the same as the source region 45 and the drain region 46 doped with an N-type impurity.

As described above, in the present embodiment, the channel region (the buried channel layer 83) of the first transistor M1 is arranged below the gate insulating film 42 in the P-type well layer 82 and between the source region 45 and the drain region 46. In the present embodiment, the channel region (the buried channel layer 83) of the first transistor M1 includes no interface between the P-type well layer 82 and the gate insulating film 42. Further, the impurity concentration of the channel region (the buried channel layer 83) of the first transistor M1 is higher than the impurity concentration of the P-type well layer 82. Also, the second transistor M2 has the same configuration as the first transistor M1.

Figure 10B:
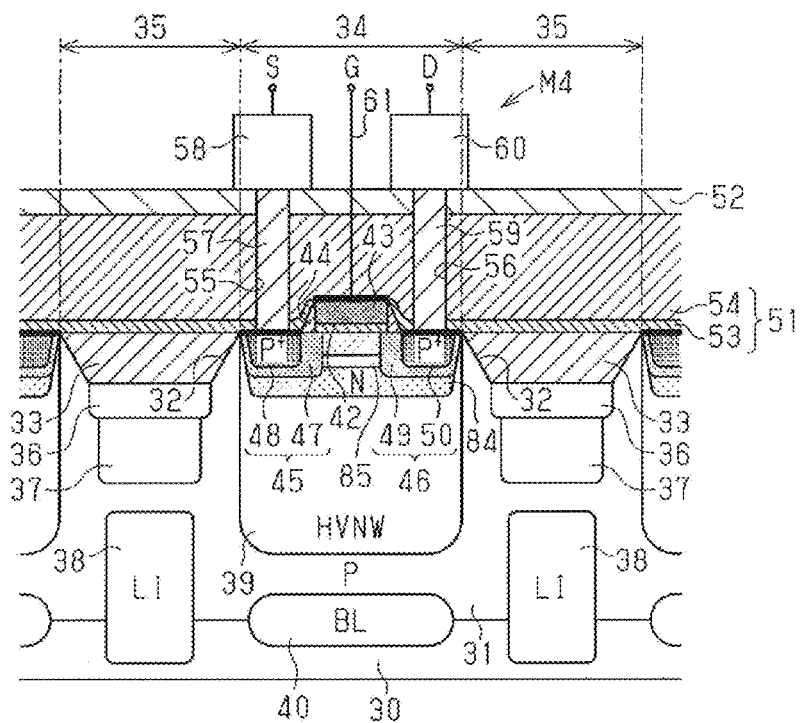
FIG. 10B is a cross-sectional view of a fourth transistor constituting a current mirror circuit of the operational amplifier.

As illustrated in FIG. 10B, a fourth transistor M4 of the present embodiment is a combination of the fourth transistor M4 of the first embodiment and the fourth transistor M4 of the second embodiment. That is, in the fourth transistor M4 of the present embodiment, the impurity concentration of the channel region is lower than the impurity concentration of the channel region (see the N-type well layer 63 of FIG. 2C) of the sixth transistor M6 and it is modified to have a buried channel type. Other transistors have the same structure as the sixth transistor M6.

The impurity concentration of an N-type well layer 84 of the fourth transistor M4 is lower than the N-type impurity concentration based on the scaling rule. In some embodiments, the impurity concentration of the N-type well layer 84 may be as low as possible within a range in which the device characteristics do not excessively deviate due to a reduction of the impurity concentration. The expression a range in which the device characteristics do not excessively deviate refers to, for example, a density higher than the upper limit value of the impurity concentration at which the threshold voltage deviates and the function of the current mirror circuit 13 (see FIG. 1) may not be established. In one example, the impurity concentration of the N-type well layer 84 is about ½ or less of the impurity concentration of the N-type well layer 63 of the sixth transistor M6. In some embodiments, the impurity concentration of the N-type well layer 84 is about 1/10 of the impurity concentration of the N-type well layer 63 of the sixth transistor M6.

A buried channel layer 85 is formed in a region (channel region) facing the gate insulating film 42 in the N-type well layer 84. The buried channel layer 85 is a region (layer) having the same conductivity type as the source region 64 and the drain region 65. That is, the buried channel layer 85 is a P-type region (layer) that is the same as the source region 64 and the drain region 65 doped with a P-type impurity.

As described above, in the present embodiment, the channel region (the buried channel layer 85) of the fourth transistor M4 is arranged below the gate insulating film 42 in the N-type well layer 84 and between the source region 64 and the drain region 65. In the present embodiment, the channel region (the buried channel layer 85) of the fourth transistor M4 includes no interface between the N-type well layer 84 and the gate insulating film 42. Further, the impurity concentration of the channel region (the buried channel layer 85) of the fourth transistor M4 is higher than the impurity concentration of the N-type well layer 84. Also, the fifth transistor M5 has the same configuration as the fourth transistor M4.

[Method of Manufacturing a Transistor]

A method of manufacturing a first transistor M1, a third transistor M3, a fourth transistor M4, and a sixth transistor M6 will be described with reference to FIGS. 11A to 11 C. Further, in FIGS. 11A to 11C, for convenience of description, it is assumed that the first transistor M1, the third transistor M3, the fourth transistor M4, and the sixth transistor M6 are formed to be adjacent to each other. The method of manufacturing a transistor according to the present embodiment is different from the method of manufacturing a transistor according to the first embodiment in a step of forming a well. In the following description, the well forming step will be mainly described.

In the well forming step, a step of forming a high pressure-resistant N-type well layer 39 in each of the device forming regions 34 of the P-type epitaxial layer 31 and a step of forming a P-type drift layer 37 in each of the device isolation regions 35 of the P-type epitaxial layer 31 are similar to those of the first embodiment.

Figure 11A:
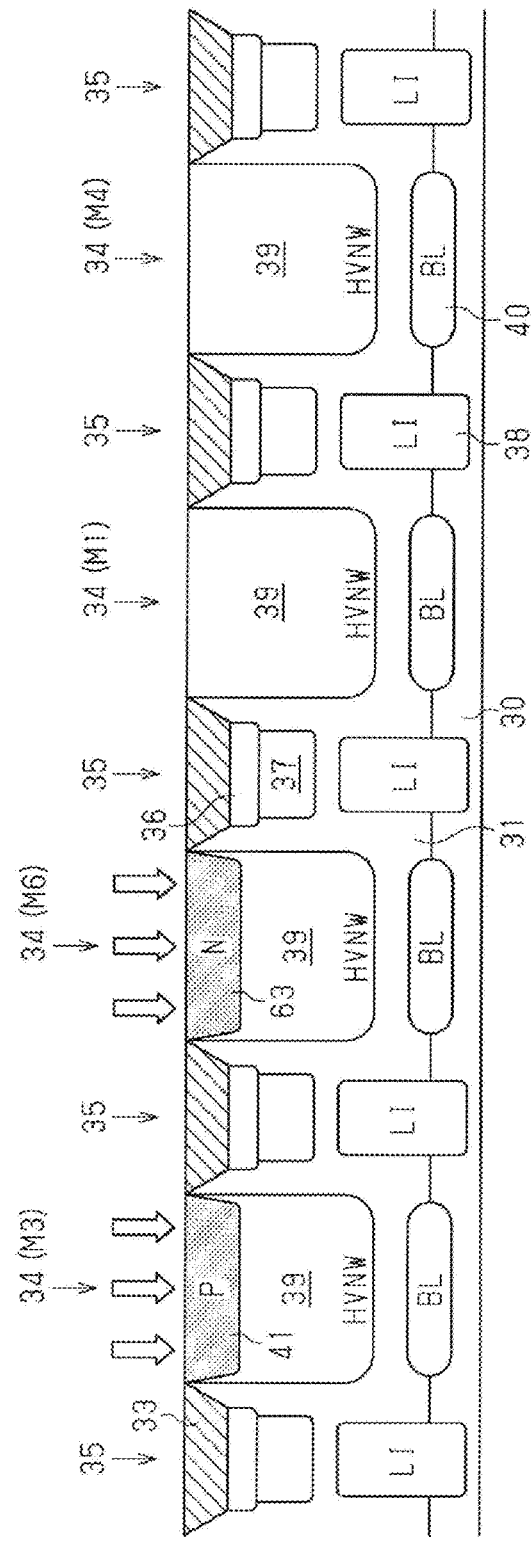
FIG. 11A is a cross-sectional view illustrating a process of manufacturing a first transistor, a third transistor, a fourth transistor, and a sixth transistor.

As illustrated in FIG. 11A, a P-type well layer 41 is formed in the surface layer portion of the N-type well layer 39 of the third transistor M3, and an N-type well layer 63 is formed in the surface layer portion of the sixth transistor M6. A method of forming a P-type well layer 41 and the N-type well layer 63 is similar to that of the first embodiment. That is, as illustrated in FIG. 11A, in the silicon substrate 30 as the semiconductor substrate, a step of forming the channel region in the region where the third transistor M3 is formed and the region where the sixth transistor M6 is formed is a second step. Specifically, by selectively performing ion implantation such that impurity ions are implanted into the region where the third transistor M3 is formed in the silicon substrate 30 as the semiconductor substrate while no impurity ions are implanted into the regions where the first transistor M1, the fourth transistor M4, and the sixth transistor M6 are formed, the channel region is formed in the region where the third transistor M3 is formed. Further, by selectively performing ion implantation such that impurity ions are implanted into the region where the sixth transistor M6 is formed in the silicon substrate 30 while no impurity ions are implanted into the regions where the first transistor M1, the third transistor M3, and the fourth transistor M4 are formed, the channel region is formed in the region where the sixth transistor M6 is formed.

As illustrated in FIG. 11B, a P-type well layer 82 is formed in the surface layer portion of the N-type well layer 39 of the first transistor M1, and an N-type well layer 84 is formed in the surface layer portion of the fourth transistor M4. That is, as illustrated in FIG. 11B, a step of forming the channel region in the region where the first transistor M1 is formed and the region where the fourth transistor M4 is formed in the silicon substrate 30 as the semiconductor substrate is a first step. Specifically, an ion implantation mask (not shown) having an opening that exposes the device forming region 34 of the first transistor M1 is formed so as to cover the device forming regions 34 and the device isolation regions 35 of the third transistor M3, the fourth transistor M4, and the sixth transistor M6. Then, P-type impurity ions are implanted through the opening of this ion implantation mask. That is, by selectively performing ion implantation such that impurity ions are implanted into the region where the first transistor M1 is formed in the silicon substrate 30 as the semiconductor substrate while no impurity ions are implanted into the regions where the third transistor M3, the fourth transistor M4, and the sixth transistor M6 are formed, the channel region is formed in the region where the first transistor M1 is formed. For example, boron ions are used as the P-type impurity ions. Here, the ion implantation is performed such that the impurity concentration of the P-type well layer 82 of the first transistor M1 is lower than the impurity concentration of the P-type well layer 41 of the third transistor M3. For example, the ion implantation is performed such that the impurity concentration of the P-type well layer 82 of the first transistor M1 is about 1/2 or less of the impurity concentration of the P-type well layer 41 of the third transistor M3. In some embodiments, the ion implantation may be performed such that the impurity concentration of the P-type well layer 82 of the first transistor M1 is about 1/10 of the impurity concentration of the P-type well layer 41 of the third transistor M3.

Next, an ion implantation mask (not shown) having an opening that exposes the device forming region 34 of the fourth transistor M4 is formed so as to cover the device forming regions 34 and the device isolation regions 35 of the first transistor M1, the third transistor M3, and the sixth transistor M6. Then, N-type impurity ions are implanted through the opening of the ion implantation mask. That is, by selectively performing ion implantation such that impurity ions are implanted into the region where the fourth transistor M4 is formed in the silicon substrate 30 as the semiconductor substrate while no impurity ions are implanted into the regions where the first transistor M1, the third transistor M3, and the sixth transistor M6 are formed, the channel region is formed in the region where the fourth transistor M4 is formed. For example, arsenic ions and phosphorus ions are used as the N-type impurity ions. Here, the ion implantation is performed such that the impurity concentration of the N-type well layer 84 of the fourth transistor M4 is lower than the impurity concentration of the N-type well layer 63 of the sixth transistor M6. For example, the ion implantation is performed such that the impurity concentration of the N-type well layer 84 of the fourth transistor M4 is about 1/2 or less of the impurity concentration of the N-type well layer 63 of the sixth transistor M6. In some embodiments, the ion implantation is performed such that the impurity concentration of the N-type well layer 84 of the fourth transistor M4 is about 1/10 of the impurity concentration of the N-type well layer 63 of the sixth transistor M6. In the present embodiment, the N-type well layer 84 is formed after the formation of the P-type well layer 82, but the P-type well layer 82 may also be formed after the formation of the N-type well layer 84.

As illustrated in FIG. 11C, a buried channel layer 83 is formed in the N-type well layer 39 of the first transistor M1, and a buried channel layer 85 is formed in the N-type well layer 39 of the fourth transistor M4. That is, as illustrated in FIG. 11C, a step of forming the buried channel layers 83 and 85 by implanting impurity ions into the regions where some of the plurality of transistors (the first transistor M1 and the fourth transistor M4) are formed in the silicon substrate 30 as the semiconductor substrate is a third step. Specifically, an ion implantation mask (not shown) having an opening that exposes the device forming region 34 of the first transistor M1 is formed so as to cover the device forming regions 34 and the device isolation regions 35 of the third transistor M3, the fourth transistor M4, and the sixth transistor M6. Then, N-type impurity ions are implanted through the opening of the ion implantation mask. For example, phosphorus ions and arsenic ions are used as the N-type impurity ions. Accordingly, the buried channel layer 83 is formed. Subsequently, the ion implantation mask is removed and an ion implantation mask (not shown) having an opening that exposes the device forming region 34 of the fourth transistor M4 is formed so as to cover the device forming regions 34 and the device isolation regions 35 of the first transistor M1, the third transistor M3, and the sixth transistor M6. Then, P-type impurity ions are implanted through the opening of this ion implantation mask. For example, $BF_2$ is used as the P-type impurity ions. Accordingly, the buried channel layer 85 is formed. In the present embodiment, the buried channel layer 85 is formed after the formation of the buried channel layer 83, but the buried channel layer 83 may also be formed after the formation of the buried channel layer 85.

Thereafter, the ion implantation mask is removed. Then, as in the first embodiment, the first transistor M1, the third transistor M3, the fourth transistor M4, and the sixth transistor M6 are manufactured through a gate forming step, a source/drain forming step, and a wiring step.

Further, the second transistor M2 is manufactured in the same manner as the first transistor M1, the fifth transistor M5 is manufactured in the same manner as the fourth transistor M4, and the seventh transistor M7 is manufactured in the same manner as the third transistor M3. In addition, the first transistor M1 and the second transistor M2 are simultaneously formed, the fourth transistor M4 and the fifth transistor M5 are simultaneously formed, and the third transistor M3 and the seventh transistor M7 are simultaneously formed.

According to the present embodiment, the same effects as those of the first embodiment and the second embodiment may be achieved.

(Fourth Embodiment)

An operational amplifier 1B according to a fourth embodiment of the present disclosure will be described with reference to FIG. 12.

The operational amplifier 1B amplifies a potential difference between an inverting input terminal INN and a non-inverting input terminal INP, and outputs an output signal Sout from an output terminal OUT. The operational amplifier 1B includes a differential stage 90 and an output stage 93. The differential stage 90 includes a differential pair 91 and a tail current source 92. The output stage 93 includes a cascode current mirror circuit 94 and a bias circuit 95. The operational amplifier 1 B is integrated into a single semiconductor substrate.

The differential pair 91 includes a first transistor MA1 connected to the non-inverting input terminal INP and a second transistor MA2 connected to the inverting input terminal INN. In the present embodiment, the differential pair 91 includes P-channel MOSFETs. The first transistor MA1 and the second transistor MA2 may have either a depletion type structure or an enhancement type structure. In the present embodiment, the first transistor MA1 and the second transistor MA2 have an enhancement type structure. A gate of the first transistor MA1 is connected to the non-inverting input terminal INP, and a gate of the second transistor MA2 is connected to the inverting input terminal INN. A source of the first transistor MA1 and a source of the second transistor MA2 are commonly connected.

The tail current source 92 includes a third transistor MA3 connected to the source of each of the transistors MA1 and MA2. The third transistor MA3 of the present embodiment is a P-channel MOSFET. A bias voltage Vbp1 from a first bias circuit (not shown) is input to a gate of the third transistor MA3. The tail current source 92 supplies a tail current It based on the bias voltage Vbp1.

The cascode current mirror circuit 94 is an active load connected to the differential pair 91. The cascode current mirror circuit 94 is formed by stacking transistors of the same type in two stages, and includes a fourth transistor MA4 to a seventh transistor MA7. In the present embodiment, the fourth transistor MA4 to the seventh transistor MA7 include N-channel MOSFETs. In particular, the fourth transistor MA4 and the fifth transistor MA5 have an enhancement type structure.

The fourth transistor MA4 is installed in series with the second transistor MA2. More specifically, the fourth transistor MA4 is installed between a drain of the second transistor MA2 and a second power line 3. A drain of the fourth transistor MA4 is connected to the drain of the second transistor MA2, and a source of the fourth transistor MA4 is connected to the second power line 3. The fifth transistor MA5 is installed in series with the first transistor MA1. More specifically, the fifth transistor MA5 is installed between a drain of the first transistor MA1 and the second power line 3. A drain of the fifth transistor MA5 is connected to the drain of the first transistor MA1, and a source of the fifth transistor MA5 is connected to the second power line 3. The sixth transistor MA6 is vertically stacked in the fourth transistor MA4 and the seventh transistor MA7 is vertically stacked in the fifth transistor MA5. More specifically, a source of the sixth transistor MA6 is connected to the drain of the fourth transistor MA4, and a source of the seventh transistor MA7 is connected to the drain of the fifth transistor MA5. Gates of the sixth transistor MA6 and the seventh transistor MA7 are appropriately biased by a bias voltage Vbn1 input from a second bias circuit (not shown). Gates of the fourth transistor MA4 and the fifth transistor MA5 are connected to a drain of the seventh transistor MA7. Further, when the first transistor MA1 and the second transistor MA2 are of a depletion type, an input full swing (rail-to-rail) may be realized by the circuit configuration illustrated in FIG. 12.

The bias circuit 95 is a constant current circuit that maintains the cascode current mirror circuit 94 in an appropriate bias state. In one example, the bias circuit 95 is formed by stacking transistors of the same type in two stages, and includes an eighth transistor MA8 to an eleventh transistor MA11. In the present embodiment, the eighth transistor MA8 to the eleventh transistor MA11 include P-channel MOSFETs. In particular, the eighth transistor MA8 and the ninth transistor MA9 have an enhancement type structure.

The eighth transistor MA8 and the ninth transistor MA9 constitute a current source for generating a predetermined current. A source of the eighth transistor MA8 and a source of the ninth transistor MA9 are connected to a first power line 2, and a gate of the eighth transistor MA8 and a gate of the ninth transistor MA9 are commonly connected and are connected to a third bias circuit (not shown). The gates of the eighth transistor MA8 and the ninth transistor MA9 are properly biased by a bias voltage Vbp2 input from the third bias circuit. The tenth transistor MA10 is vertically stacked in the eighth transistor MA8 and the eleventh transistor MA11 is vertically stacked in the ninth transistor MA9. More specifically, a source of the tenth transistor MA10 is connected to a drain of the eighth transistor MA8, and a source of the eleventh transistor MA11 is connected to a drain of the ninth transistor MA9. A drain of the tenth transistor MA10 is connected to the drain of the sixth transistor MA6, and a drain of the eleventh transistor MA11 is connected to the drain of the seventh transistor MA7. Further, the drain of the tenth transistor MA10 is connected to the output terminal OUT. A gate of the tenth transistor MA10 and a gate of the eleventh transistor MA11 are commonly connected and are connected to a fourth bias circuit (not shown). The gates of the tenth transistor MA10 and the eleventh transistor MA11 are appropriately biased by a bias voltage Vbp3 input from the fourth bias circuit.

The structures and manufacturing method of the N-channel MOSFETs and the P-channel MOSFETs of the first transistor MA1 to the eleventh transistor MA11 are similar to those of the N-channel MOSFETs and the P-channel MOSFETs of the first transistor M1 and the like of the first embodiment. The gate lengths of the first transistor MA1 and the second transistor MA2 constituting the differential pair 91 are shorter than the gate lengths of the fourth transistor MA4 to the seventh transistor MA7 constituting the cascode current mirror circuit 94. Since the fluctuation of mobility can be reduced by such a relationship of the gate lengths, the 1/f noise of the output signal Sout can be reduced.

Furthermore, in the present embodiment, in order to further reduce the 1/f noise of the output signal Sout of the output stage 93, the impurity concentrations of the channel regions in some of the transistors MA1 to MA11 are set lower than the impurity concentrations of the channel regions in the other transistors of the transistors MA1 to MA11. That is, the plurality of transistors of the operational amplifier 1B include high concentration transistors whose impurity concentrations of the channel regions are a first concentration and low concentration transistors whose impurity concentrations of the channel regions are a second concentration lower than the first concentration. Specifically, the impurity concentrations of the channel regions in transistors which are likely to be affected by the 1/f noise of the output signal Sout are set lower than the impurity concentrations of the channel regions in transistors which are unlikely to be affected by the 1/f noise of the output signal Sout. That is, the low concentration transistors are used for the transistors which are more likely to be affected by the 1/f noise of the operational amplifier 1, among the plurality of transistors, than the high concentration transistors, and the high concentration transistors are used for the transistors which are more unlikely to be affected by the 1/f noise of the operational amplifier 1, among the plurality of transistors, than the low concentration transistors. Specifically, in the operational amplifier 1B, the portions which are likely to be affected by the 1/f noise of the output signal Sout are the differential pair 91 of the differential stage 90, and a portion of the bias circuit 95 and a portion of the cascode current mirror circuit 94 in the output stage 93, and the portions which are unlikely to be affected by the 1/f noise of the output signal Sout are the tail current source 92, another portion of the bias circuit 95, and another portion of the cascode current mirror circuit 94.

In the present embodiment, the impurity concentrations of the channel regions in the transistors of the differential pair 91, a portion of the bias circuit 95, and a portion of the transistors of the cascode current mirror circuit 94 are set lower than the impurity concentrations of the channel regions in the transistors of the tail current source 92, another portion of the bias circuit 95, and another portion of the cascode current mirror circuit 94. That is, the transistors constituting the differential pair 91, a portion of the bias circuit 95, and a portion of the cascode current mirror circuit 94 are low concentration transistors, and the transistors constituting the tail current source 92, another portion of the bias circuit 95, and another portion of the cascode current mirror circuit 94 are high concentration transistors. Specifically, the impurity concentrations of the channel regions in the first transistor MA1, the second transistor MA2, the fourth transistor MA4, the fifth transistor MA5, the eighth transistor MA8, and the ninth transistor MA9 are set lower than the impurity concentrations of the channel regions in the third transistor MA3, the sixth transistor MA6, the seventh transistor MA7, the tenth transistor MA10, and the eleventh transistor MA11. That is, the first transistor MA1, the second transistor MA2, the fourth transistor MA4, the fifth transistor MA5, the eighth transistor MA8, and the ninth transistor MA9 are low concentration transistors, and the third transistor MA3, the sixth transistor MA6, the seven transistor MA7, the tenth transistor MA10, and the eleventh transistor MA11 are high concentration transistors. Further, in the present embodiment, the sixth transistor MA6 and the tenth transistor MA10 connected to the output terminal OUT form the last stage transistors.

In some embodiments, the impurity concentration of the channel region in each of the transistors MA1, MA2, MA4, MA5, MA8, and MA9 may be about ½ or less of the impurity concentration of the channel region in each of the transistors MA3, MA6, MA7, MA10, and MA11. In the present embodiment, the impurity concentration of the channel region in each of the transistors MA1, MA2, MA4, MA5, MA8, and MA9 is about ¹/₁₀ of the impurity concentration of the channel region in each of the transistors MA3, MA6, MA7, MA10, and MA11.

According to the present embodiment, the following effects may be achieved.

(4-1) The impurity concentrations of the channel regions of the first transistor MA1 and the second transistor MA2 constituting the differential pair 91 are lower than the impurity concentration of the channel region of the sixth transistor MA6 constituting the last stage. With this configuration, by lowering the impurity concentration of the channel region of each of the transistors MA1 and MA2 constituting the differential pair 91 which are likely to be affected by the 1/f noise of the output signal Sout of the operational amplifier 1B, the fluctuations of mobility can be suppressed and the fluctuation of the drain current can be suppressed. Thus, it is possible to effectively reduce the 1/f noise of the output signal Sout of the operational amplifier 1B.

(4-2) The impurity concentrations of the channel regions of the fourth transistor MA4 and the fifth transistor MA5 constituting the current source of the cascode current mirror circuit 94 is lower than the impurity concentration of the channel region of the sixth transistor MA6 constituting the last stage. With this configuration, by lowering the impurity concentration of the channel region of each of the transistors MA4 and MA5 constituting the current source of the cascode current mirror circuit 94 which are likely to be affected by the 1/f noise of the output signal Sout of the operational amplifier 1B, the fluctuation of mobility can be suppressed and fluctuation of the drain current can be suppressed. Thus, it is possible to effectively reduce the 1/f noise of the output signal Sout of the operational amplifier 1B.

(4-3) The impurity concentrations of the channel regions of the eighth transistor MA8 and the ninth transistor MA9 constituting the current source of the bias circuit 95 are lower than the impurity concentration of the channel region of the tenth transistor MA10 constituting the last stage. With this configuration, by lowering the impurity concentration of the N-type well layer 70 of each of the transistors MA8 and MA9 constituting the current source of the bias circuit 95 which are likely to be affected by the 1/f noise of the output signal Sout of the operational amplifier 1B, the fluctuation of mobility can be suppressed and the fluctuation of the drain current can be suppressed. Thus, it is possible to effectively reduce the 1/f noise of the output signal Sout of the operational amplifier 1B.

(4-4) The impurity concentrations of the channel regions of the first transistor MA1 and the second transistor MA2 which are the P-channel MOSFETs constituting the differential pair 91 and the impurity concentrations of the channel regions of the eighth transistor MA8 and the ninth transistor MA9 which are the P-channel MOSFETs constituting the current source of the bias circuit 95 are equal to each other. With this configuration, the step of forming the N-type well layer 70 of each of the transistors MA8 and MA9 constituting the current source of the bias circuit 95 and the step of forming the N-type well layer 70 of each of the transistors MA1 and MA2 constituting the differential pair 91 can be performed in batches. Thus, it is possible to simplify the process of manufacturing the operational amplifier 1B.

(4-5) The impurity concentration of the channel region of the third transistor MA3 which is the P-channel MOSFET constituting the tail current source 92 and the impurity concentrations of the channel regions of the tenth transistor MA10 and the eleventh transistor MA11 which are the P-channel MOSFETs of the bias circuit 95 are equal to each other. With this configuration, the step of forming the N-type well layer 63 of each of the transistors MA10 to MA11 and the step of forming the N-type well layer 63 of the third transistor MA3 can be performed in batches. Thus, it is possible to simplify the process of manufacturing the operational amplifier 1B.

Instead of lowering the impurity concentration of the channel region of each of the transistors MA1, MA2, MA4, MA5, MA8, and MA9, the buried channel type MOSFETs such as the transistors M1, M2, M4, rand M5 of the second embodiment may also be applied. Accordingly, the same effects as those of the second embodiment may be achieved. Furthermore, one or two of the pair of transistors MA1 and MA2 constituting the differential pair 91, the pair of transistors MA4 and MA5 constituting the current source of the cascode current mirror circuit 94, and the pair of transistors MA8 and MA9 constituting the current source of the bias circuit 95 may be replaced by the buried channel type MOSFETs of the second embodiment.

In addition to lowering the impurity concentration of the channel region of each of the transistors MA1, MA2, MA4, MA5, MA8, and MA9, the buried channel type MOSFETs may be applied. That is, the transistors MA1, MA2, MA4, MA5, MA8, and MA9 may have the same structure as the transistors M1, M2, M4, and M5 of the third embodiment. Accordingly, the same effects as those of the third embodiment may be achieved. Furthermore, one or two of the pair of transistors MA1 and MA2 constituting the differential pair 91, the pair of transistors MA4 and MA5 constituting the current source of the cascode current mirror circuit 94, and the pair of transistors MA8 and MA9 constituting the current source of the bias circuit 95 may be modified to have the same structure as each of the transistors M1, M2, M4, and M5 of the third embodiment. In addition, one or two of the pair of transistors MA1 and MA2 constituting the differential pair 91, the pair of transistors MA4 and MA5 constituting the current source of the cascode current mirror circuit 94, and the pair of transistors MA8 and MA9 constituting the current source of the bias circuit 95 may be modified to have the same structure as the structure of each of the buried channel type MOSFET of the second embodiment or the transistors M1, M2, M4, and M5 of the third embodiment. In short, the operational amplifier 1B may have a configuration in which structures similar to the low concentration transistors of the first embodiment, the MOSFETs of the second embodiment, and the transistors M1, M2, M4, and M5 of the third embodiment are mixed.

Figure 12:
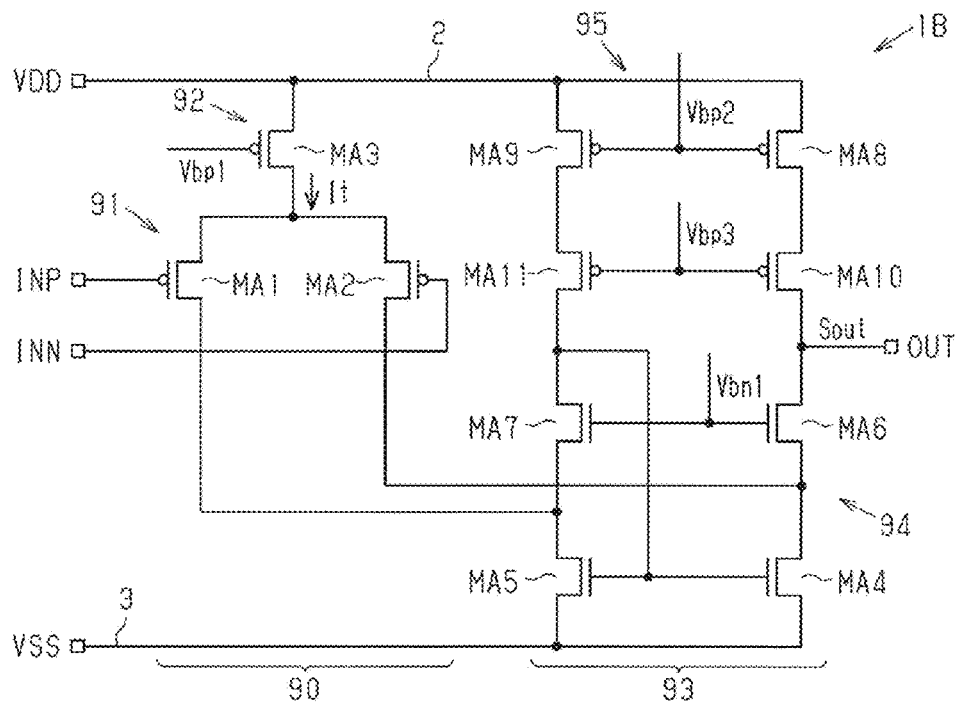
FIG. 12 is a circuit diagram of an operational amplifier in an integrated circuit according to a fourth embodiment of the present disclosure.
Figure 13:
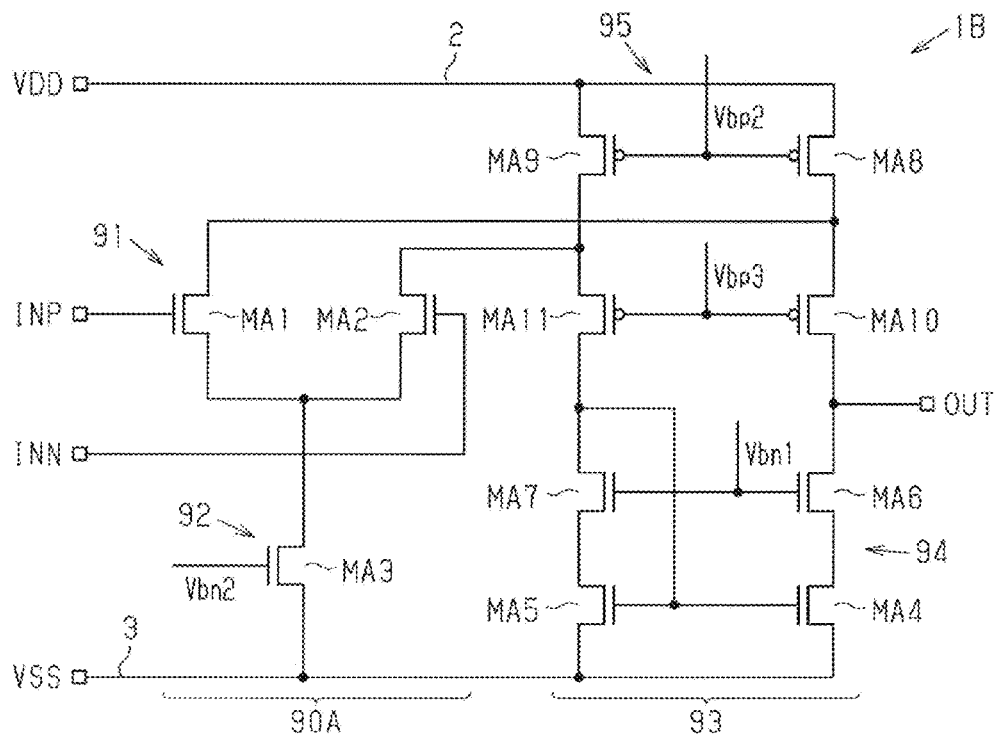
FIG. 13 is a circuit diagram of an operational amplifier according to an exemplary modification of the fourth embodiment.

Moreover, the operational amplifier 1B illustrated in FIG. 12 may be modified like a differential stage 90A illustrated in FIG. 13. Compared with the differential stage 90 of the operational amplifier 1B, the differential stage 90A mainly differs in the conductivity type of the channel regions in MOSFETs of a differential pair 91 and a tail current source 92.

A first transistor MA1 and a second transistor MA2 of the differential pair 91 and a third transistor MA3 of the tail current source 92 are N-channel MOSFETs. Drains of the first transistor MA1 and the second transistor MA2 are connected to the bias circuit 95. More specifically, the drain of the first transistor MA1 is connected to the drain of the eighth transistor MA8, and the drain of the second transistor MA2 is connected to the drain of the ninth transistor MA9. A source of the third transistor MA3 is connected to a second power line 3, and the drain of the third transistor MA3 is connected to sources of the first transistor MA1 and the second transistor MA2. In the third transistor MA3, a bias voltage Vbn2 is input from a first bias circuit (not shown). The first transistor MA1, the second transistor MA2, the fourth transistor MA4, and the fifth transistor MA5 may also have either a depletion type structure or an enhancement type structure. In FIG. 13, the first transistor MA1, the second transistor MA2, the fourth transistor MA4, and the fifth transistor MA5 have an enhancement type structure. Even in the operational amplifier 1B having such a configuration, the same effects as those of the operational amplifier 1B according to the present embodiment may be achieved. In addition, when the first transistor MA1 and the second transistor MA2 are of a depletion type, an input full swing (rail-to-rail) can be realized by the circuit configuration illustrated in FIG. 13.

Furthermore, as described above, each of the transistors MA1, MA2, MA4, MA5, MA8, and MA9 of the operational amplifier 1B illustrated in FIG. 13 may have the same structure as the structure of the transistors M1, M2, M4, and M5 of the second embodiment or the third embodiment. In addition, as described above, one or two of the pair of transistors MA1 and MA2 in the operational amplifier 1B illustrated in FIG. 13, the pair of transistors MA4 and MA5, and the pair of transistors MA8 and MA9 may have the same structure as the buried channel-type MOSFETs of the second embodiment or the transistors M1, M2, M4 and M5 of the third embodiment. In short, the operational amplifier 1B illustrated in FIG. 13 may have a configuration in which structures similar to the structures of the low concentration transistors of the first embodiment, the MOSFETs of the second embodiment, and the transistors M1, M2, M4, and M5 of the third embodiment are mixed.

(Fifth Embodiment)

An operational amplifier 1C according to a fifth embodiment of the present disclosure will be described with reference to FIG. 14.

The operational amplifier 1C amplifies a potential difference between an inverting input terminal INN and a non-inverting input terminal INP, and outputs an output signal Sout from an output terminal OUT. The operational amplifier 1C includes a differential amplification stage 100, an output stage 105 and a correction circuit 106, and is integrated into a single semiconductor substrate.

The differential amplification stage 100 has a differential pair 101, a tail current source 102, a phase compensation circuit 103, and a constant current circuit 104.

The differential pair 101 includes a first transistor MB1 and a second transistor MB2. In the present embodiment, the first transistor MB1 and the second transistor MB2 are P-channel MOSFETs. The first transistor MB1 and the second transistor MB2 may have either a depletion type structure or an enhancement type structure. In the present embodiment, the first transistor MB1 and the second transistor MB2 have an enhancement type structure. A gate of the first transistor MB1 is connected to the inverting input terminal INN and a gate of the second transistor MB2 is connected to the non-inverting input terminal INP. The differential pair 101 generates differential currents Imb1 and Imb2 depending on respective input voltages Vinn and Vinp of the inverting input terminal INN and the non-inverting input terminal INP.

The tail current source 102 supplies a tail current It to the differential pair 101. The tail current source 102 includes a third transistor MB3 which is a P-channel MOSFET. A gate of the third transistor MB3 is connected to a BIAS1 terminal. A source of the third transistor MB3 is connected to a first power line 2. A drain of the third transistor MB3 is connected to the phase compensation circuit 103.

The phase compensation circuit 103 is installed between the differential pair 101 and the tail current source 102. The phase compensation circuit 103 includes a first resistor R1, a second resistor R2, and a capacitor C1. The first resistor R1 is installed between the source of the first transistor MB1 and the tail current source 102 and the second resistor R2 is installed between the source of the second transistor MB2 and the tail current source 102. The capacitor C1 is connected between the source of the first transistor MB1 and the source of the second transistor MB2.

The constant current circuit 104 is connected to the drain of the first transistor MB1 and the drain of the second transistor MB2, and generates constant currents Imb4 and Imb5. The constant current circuit 104 includes a fourth transistor MB4 and a fifth transistor MB5. In the present embodiment, the fourth transistor MB4 and the fifth transistor MB5 are N-channel MOSFETs. In particular, the fourth transistor MB4 and the fifth transistor MB5 have an enhancement type structure. A gate of the fourth transistor MB4 and a gate of the fifth transistor MB5 are commonly connected. A drain of the fourth transistor MB4 is connected to the drain of the first transistor MB1 and a source of the fourth transistor MB4 is connected to a second power line 3. A drain of the fifth transistor MB5 is connected to the drain of the second transistor MB2, and a source of the fifth transistor MB5 is connected to the second power line 3. The fourth transistor MB4 and the fifth transistor MB5 are biased by a voltage corresponding to a voltage Vbias1 of a BIAS1 terminal such that the currents imb4 and imb5 proportional to the tail current It generated by the tail current source 102 flow.

In a specific configuration, the operational amplifier 1C includes an eleventh transistor MB11 and a twelfth transistor MB12. The twelfth transistor MB12 is a P-channel MOSFET, and the eleventh transistor MB11 is an N-channel MOSFET. A source of the twelfth transistor MB12 is connected to a first power line 2, and a drain of the twelfth transistor MB12 is connected to a drain of the eleventh transistor MB11. A gate of the twelfth transistor MB12 is connected to the BIAS1 terminal. A source of the eleventh transistor MB11 is connected to the second power line 3, a gate of the eleventh transistor MB11 is connected to the gates of the fourth transistor MB4 and the fifth transistor MB5, and is also connected to a drain of the eleventh transistor MB11. That is, the eleventh transistor MB11 forms a current mirror circuit together with the fourth transistor MB4 and the fifth transistor MB5. Since a current imb12 proportional to the tail current It flows through the twelfth transistor MB12, the currents imb4 and imb5 flowing through the fourth transistor MB4 and the fifth transistor MB5 forming the current mirror circuit together with the eleventh transistor MB11 have a proportional relationship with the tail current It.

The output stage 105 is connected to the drain of the first transistor MB1 and the drain of the second transistor MB2, and generates an output signal Sout. The output stage 105 includes four transistors of a sixth transistor MB6 to a ninth transistor MB9. In the present embodiment, the sixth transistor MB6 and the seventh transistor MB7 are N-channel MOSFETs, and the eighth transistor MB8 and the ninth transistor MB9 are P-channel MOSFETs. In particular, the eighth transistor MB8 and the ninth transistor MB9 have an enhancement type structure.

Gates of the sixth transistor MB6 and the seventh transistor MB7 are connected to a BIAS2 terminal to which a predetermined bias voltage Vbias2 is applied. A source of the sixth transistor MB6 is connected to the drain of the first transistor MB1 and a source of the seventh transistor MB7 is connected to the drain of the second transistor MB2. A drain of the sixth transistor MB6 is connected to a drain of the eighth transistor MB8, and the drain of the seventh transistor MB7 is connected to a drain of the ninth transistor MB9. The drain of the sixth transistor MB6 is also connected to the output terminal OUT. In the present embodiment, the sixth transistor MB6 forms a last stage transistor.

The eighth transistor MB8 and the ninth transistor MB9 constitute a current mirror circuit. Specifically, the gate of the eighth transistor MB8 and the gate of the ninth transistor MB9 are commonly connected, and the gate of the ninth transistor MB9 is connected to the drain of the ninth transistor MB9. A source of the eighth transistor MB8 and a source of the ninth transistor MB9 are connected to the first power line2.

The correction circuit 106 corrects a current flowing through the constant current circuit 104 based on a source voltage Vs1 of the first transistor MB1 and a source voltage Vs2 of the second transistor MB2. Two outputs of the correction circuit 106 are connected to the drain of the first transistor MB1 and the drain of the second transistor MB2, and it generates differential correction currents Icmp1 and Icmp2 corresponding to a potential difference between the source voltage Vs1 of the first transistor MB1 and the source voltage Vs2 of the second transistor MB2.

The correction circuit 106 includes a correction differential pair 107 and a correction current source 108.

The correction differential pair 107 includes a PNP-type first correction transistor Q1 and a second correction transistor Q2. The PNP type bipolar transistor has the same polarity as that of the P-channel MOSFET of the differential pair 101. The source voltage Vs1 of the first transistor MB1 is input to a base of the first correction transistor Q1 and the source voltage Vs2 of the second transistor MB2 is input to a base of the second correction transistor Q2. A collector of the first correction transistor Q1 is connected to the drain of the first transistor MB1 and a collector of the second correction transistor Q2 is connected to the drain of the second transistor MB2. Emitters of the first correction transistor Q1 and the second correction transistor Q2 are connected to the correction current source 108.

The correction current source 108 includes a tenth transistor MB10 which is a P-channel MOSFET. A source of the tenth transistor MB10 is connected to the first power line 2, and a drain of the tenth transistor MB10 is connected to the correction differential pair 107. A gate of the tenth transistor MB10 is connected to the BIAS1 terminal. Therefore, a constant current I2 generated by the correction current source 108 has a proportional relationship with the tail current It of the tail current source 102.

Next, an operation of the operational amplifier 1C will be described.

It is assumed that a mismatch occurs between a resistance value of the first resistor R1 and a resistance value of the second resistor R2, and R1=R and R2=R+ΔR. In this case, the differential current Imb1 of the first transistor MB1 increases by ΔI (Imb1=I/2+ΔI) and the differential current Imb2 of the second transistor MB2 decreases by ΔI (Imb2=I/2−ΔI). Therefore, when the source voltage Vs2 of the second transistor MB2 becomes lower than the source voltage Vs1 of the first transistor MB1, the correction current Icmp2 flowing through the second correction transistor Q2 of the correction differential pair 107 increases (Icmp2=I2/2+ΔI') and the correction current Icmp1 flowing through the first correction transistor Q1 decreases (Icmp1=I2/2−ΔI').

The correction currents of the correction circuit 106 are superimposed on the differential current flowing from the differential pair 101 to the constant current circuit 104. Therefore, the corrected differential currents are Imb1+Icmp1 and Imb2+Icmp2. That is, the increment ΔI of the current Imb1 of the first transistor MB1 is canceled out by the decrement ΔI' of the current Icmp1 of the first correction transistor Q1, and the decrement ΔI of the current Imb2 of the second transistor MB2 is canceled out by the increment ΔI' of the current Icmp2 of the second correction transistor Q2. In this manner, the correction circuit 106 converts the difference between the source voltages Vs1 and Vs2 due to the mismatch between the first resistor R1 and the second resistor R2, namely an input offset voltage Vos of the operational amplifier 1C, into the differential correction currents Icmp1 and Icmp2, in which feedback is applied such that the drain currents Imb1+Icmp1 and Imb2+Icmp2 flowing into the constant current circuit 104 are constant.

The structures and manufacturing method of the N-channel MOSFETs and the P-channel MOSFETs of the first transistor MB1 to the twelfth transistor MB12 are similar to those of the N-channel MOSFETs and the P-channel MOSFETs of the first transistor M1 and the like of the first embodiment. The gate lengths of the first transistor MB1 and the second transistor MB2 constituting the differential pair 101 are shorter than the gate lengths of the eighth transistor MB8 and the ninth transistor MB9 constituting the current mirror circuit. Furthermore, the gate lengths of the first transistor MB1 and the second transistor MB2 are shorter than the gate lengths of the fourth transistor MB4, the fifth transistor MB5, and the eleventh transistor MB11 constituting the current mirror circuit. Since the fluctuation of mobility can be reduced by such a relationship of the gate length, the 1/f noise of the output signal Sout can be reduced.

Moreover, in the present embodiment, in order to further reduce the 1/f noise of the output signal Sout of the output stage 105, the impurity concentrations of the channel regions in some of the first transistor MB1 to the twelfth transistor MB12 are set lower than the impurity concentrations of the channel regions in the other transistors. That is, the plurality of transistors of the operational amplifier 1C include high concentration transistors whose impurity concentrations of the channel regions are a first concentration and low concentration transistors whose impurity concentrations of the channel regions are a second concentration lower than the first concentration. Specifically, the impurity concentrations of the channel regions in transistors which are likely to be affected by the 1/f noise of the output signal Sout is set lower than the impurity concentrations of the channel regions in transistors which are unlikely to be affected by the 1/f noise of the output signal Sout. That is, the low concentration transistors are used for the transistors which are more likely to be affected by the 1/f noise of the operational amplifier 1C, among the plurality of transistors, than the high concentration transistors, and the high concentration transistors are used for the transistors which are more unlikely to be affected by the 1/f noise of the operational amplifier 1C, among the plurality of transistors, than the low concentration transistors. Specifically, in the operational amplifier 1C, the portions which are likely to be affected by the 1/f noise of the output signal Sout are the differential pair 101, the constant current circuit 104 and a portion of the output stage 105, and the portions which are unlikely to be affected by the 1/f noise of the output signal Sout are the tail current source 102, another portion of the output stage 105, and the correction circuit 106.

In the present embodiment, the impurity concentrations of the channel regions in some of the transistors of the differential pair 101, the constant current circuit 104, and the output stage 105 are set lower than the impurity concentrations of the channel regions in the transistors of the tail current source 102, another portion of the output stage 105, and the correction circuit 106. That is, the transistors constituting the differential pair 101, the constant current circuit 104, and a portion of the output stage 105 are low concentration transistors, and the transistors constituting the tail current source 102, another portion of the output stage 105, and the correction circuit 106 are high concentration transistors. Specifically, the impurity concentrations of the channel regions in the first transistor MB1, the second transistor MB2, the fourth transistor MB4, the fifth transistor MB5, the eighth transistor MB8, the ninth transistor MB9, and the eleventh transistor MB11 are set lower than the impurity concentrations of the channel regions in the third transistor MB3, the sixth transistor MB6, the seventh transistor MB7, the tenth transistor MB10, and the twelfth transistor MB12. That is, the first transistor MB1, the second transistor MB2, the fourth transistor MB4, the fifth transistor MB5, the eighth transistor MB8, the ninth transistor MB9, and the eleventh transistor MB11 are low concentration transistors, and the third transistor MB3, the six transistor MB6, the seventh transistor MB7, the tenth transistor MB10, and the twelfth transistor MB12 are high concentration transistors.

In some embodiments, the impurity concentration of the channel region in each of the transistors MB1, MB2, MB4, MB5, MB8, MB9, and MB11 may be about ½ or less of the impurity concentration of the channel region in each of the transistors MB 3, MB6, MB7, MB10, and MB12. In the present embodiment, the impurity concentration of the channel region in each of the transistors MB1, MB2, MB4, MB5, MB8, MB9, and MB11 is about ¹⁄₁₀ of the impurity concentration of the channel region in each of the transistors MB3, MB6, MB7, MB10, and MB12.

According to the present embodiment, the following effects may be achieved.

(5-1) The operational amplifier 1C includes the correction circuit 106. With this configuration, since the correction current flows in the differential current flowing from the differential pair 101 to the constant current circuit 104 by means of the correction circuit 106, it is possible to reduce the input offset voltage Vos of the differential amplifier 101 due to the mismatch between the first resistor R1 and the second resistor R2 for phase compensation.

(5-2) The impurity concentrations of the channel regions of the first transistor MB1 and the second transistor MB2 constituting the differential pair 101 are lower than the impurity concentration of the channel region of the sixth transistor MB6 constituting the last stage. With this configuration, by lowering the impurity concentration of the channel region of each of the transistors MB1 and MB2 constituting the differential pair 101 which are likely to be affected by the 1/f noise of the output signal Sout of the operational amplifier 1C, the fluctuation of mobility can be suppressed and the fluctuation of the drain current can be suppressed. Thus, it is possible to effectively suppress the 1/f noise of the output signal Sout of the operational amplifier 1C.

(5-3) The impurity concentrations of the channel regions of the fourth transistor MB4 and the fifth transistor MB5 constituting the current source of the constant current circuit 104 are lower than the impurity concentration of the channel region of the sixth transistor MB6 constituting the last stage. With this configuration, by lowering the impurity concentration of the channel region of each of the transistors MB4 and MB5 constituting the current source of the constant current circuit 104 which are likely to be affected by the 1/f noise of the output signal Sout of the operational amplifier 1C, the fluctuation of mobility can be suppressed and the fluctuation of the drain current can be suppressed. Thus, it is possible to effectively suppress the 1/f noise of the output signal Sout of the operational amplifier 1C.

(5-4) The impurity concentrations of the channel regions of the eighth transistor MB8 and the ninth transistor MB9 constituting the current mirror circuit are lower than the impurity concentration of the channel region of the sixth transistor MB6 constituting the last stage. With this configuration, by lowering the impurity concentration of each of the transistors MB8 and MB9 of the current mirror circuit which are likely to be affected by the 1/f noise of the output signal Sout of the operational amplifier 1C, the fluctuation of mobility can be suppressed and the fluctuation of the drain current can be suppressed. Therefore, it is possible to effectively suppress the 1/f noise of the output signal Sout of the operational amplifier 1C.

(5-5) The impurity concentration of the channel region of the third transistor MB3 constituting the tail current source 102, the impurity concentration of the channel region of the tenth transistor MB10 constituting the correction current source 108, and the impurity concentration of the channel region of the twelfth transistor MB12 are equal to one another. With this configuration, the step of forming the N-type well layer 63 of the third transistor MB 3 constituting the tail current source 102, the step of forming the N-type well layer 63 of the tenth transistor MB10 constituting the correction current source 108, and the step of forming the N-type well layer 63 of the twelfth transistor MB12 can be performed in batches. Thus, it is possible to simplify the process of manufacturing the operational amplifier 1C.

Instead of lowering the impurity concentration of the channel region of each of the transistors MB1, MB2, MB4, MB5, MB8, MB9, and MB11, the buried channel type MOSFETs such as the transistors M1, M2, M4, and M5 of the second embodiment may also be applied. Accordingly, the same effects as those of the second embodiment may be achieved. In addition, one or two of the pair of transistors MB1 and MB2 constituting the differential pair 101, the pair of transistors MB8 and MB9 constituting the current mirror circuit, and the pair of transistors MB4, MB5 and MB11 constituting the current mirror circuit may be replaced by the buried channel type MOSFETs of the second embodiment.

In addition to lowering the impurity concentration of the channel region of each of the transistors MB1, MB2, MB4, MB5, MB8, MB9, and MB11, the buried channel-type MOSFETs may also be applied. That is, each of the transistors MB1, MB2, MB4, MB5, MB8, MB9, and MB11 may have the same structure as each of the transistors M1, M2, M4, and M5 of the third embodiment. Accordingly, the same effects as those of the third embodiment may be achieved. In addition, one or two of the pair of transistors MB1 and MB2 constituting the differential pair 101, the pair of transistors MB8 and MB9 constituting the current mirror circuit, and the pair of transistors MB4, MB5 and MB11 constituting the current mirror circuit may be modified to have the same structure as each of the transistors M1, M2, M4, and M5 of the third embodiment. Also, one or two of the pair of transistors MB1 and MB2 constituting the differential pair 101, the pair of transistors MB8 and MB9 constituting the current mirror circuit, and the pair of transistors MB4, MB5 and MB11 constituting the current mirror circuit may be modified to have the same structure as each of the buried channel type MOSFETs of the second embodiment or the transistors M1, M2, M4, and M5 of the third embodiment. In short, the operational amplifier 1C may have a configuration in which structures similar to the structures of the low concentration transistors of the first embodiment, the MOSFETs of the second embodiment, and each of the transistors M1, M2, M4, and M5 of the third embodiment are mixed.

Figure 14:
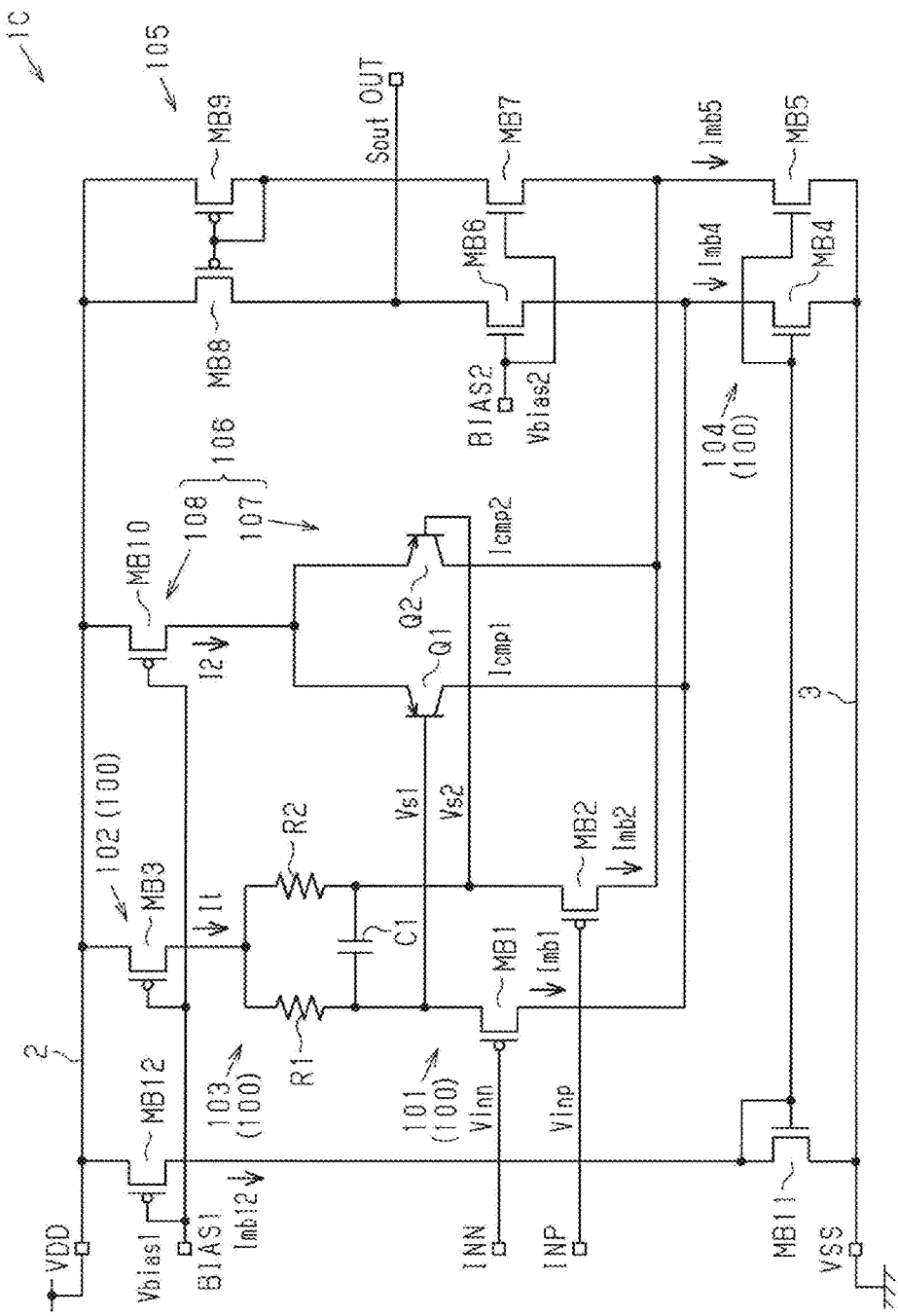
FIG. 14 is a circuit diagram of an operational amplifier in an integrated circuit according to a fifth embodiment of the present disclosure.
Figure 15:
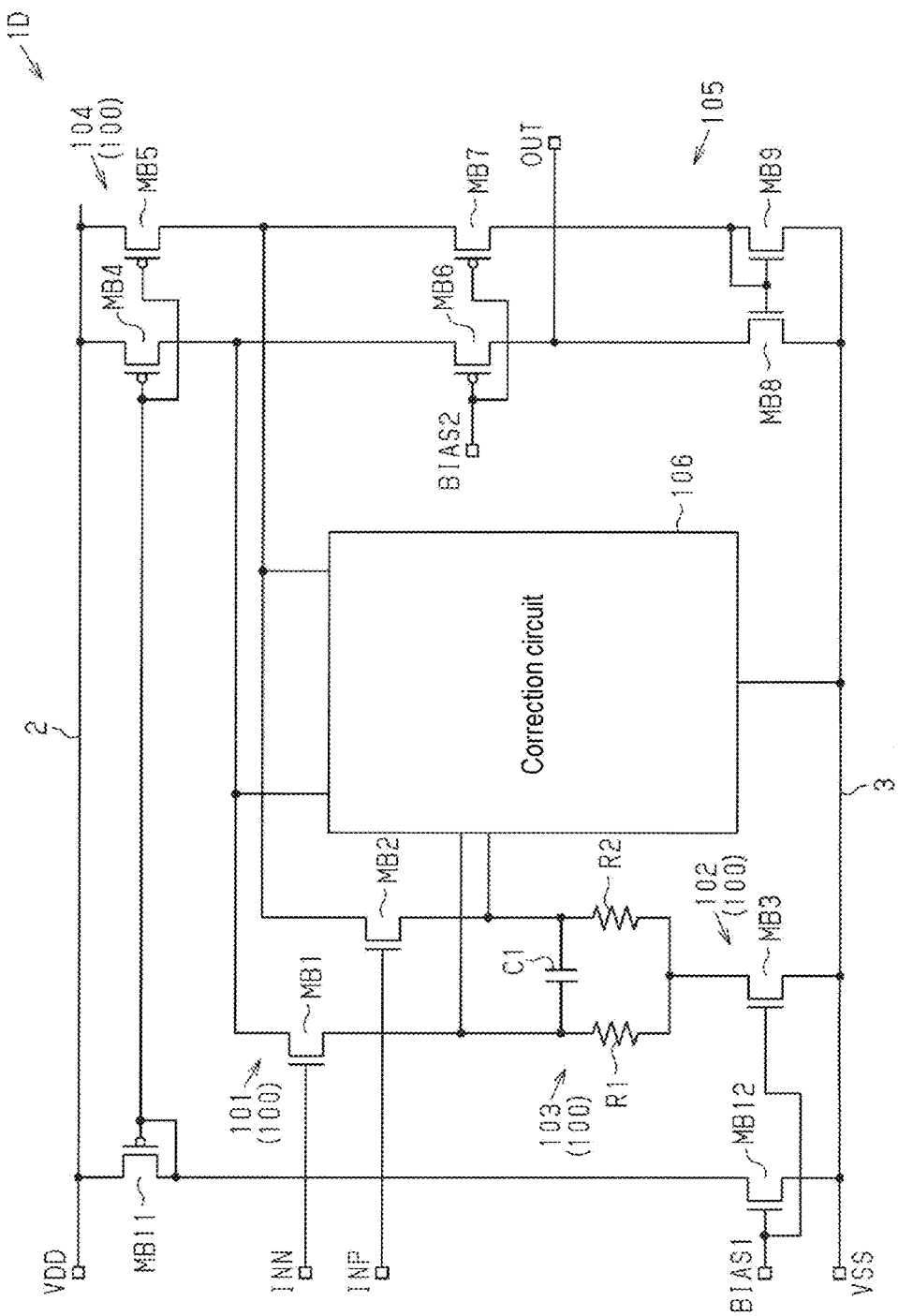
FIG. 15 is a circuit diagram of an operational amplifier according to an exemplary modification of the fifth embodiment.

Furthermore, the operational amplifier 1C illustrated in FIG. 14 may be modified like an operational amplifier 1D illustrated in FIG. 15. Compared with the operational amplifier 1C, the operational amplifier 1D mainly differs in the conductivity type of the channel regions in the MOSFETs of the differential amplification stage 100 and the output stage 105. In FIG. 15, for convenience of description, the correction circuit 106 is illustrated in a simplified manner.

The first transistor MB1 and the second transistor MB2 of the differential pair 101 and the third transistor MB 3 of the tail current source 102 are N-channel MOSFETs, and the fourth transistor MB4 and the fifth transistor MB5 of the constant current circuit 104 are P-channel MOSFETs. In the output stage 105, the sixth transistor MB6 and the seventh transistor MB7 are P-channel MOSFETs, and the eighth transistor MB8 and the ninth transistor MB9 are N-channel MOSFETs. Further, the eleventh transistor MB11 is a p-channel MOSFET and the twelfth transistor MB12 is an n-channel MOSFET.

A drain of the first transistor MB1 is connected to a drain of the fourth transistor MB4 and a drain of the second transistor MB2 is connected to a drain of the fifth transistor MB5. A source of the first transistor MB1 is connected to the first resistor R1 and a source of the second transistor MB2 is connected to the second resistor R2. A drain of the third transistor MB3 is connected to the first resistor R1 and the second resistor R2, and a source of the third transistor MB3 is connected to a second power line 3. Sources of the fourth transistor MB4, the fifth transistor MB5, and the eleventh transistor MB11 are connected to a first power line 2. Sources of the eighth transistor M8, the ninth transistor MB9 and the twelfth transistor MB12 are connected to a second power line 3. A drain of the eighth transistor MB8 is connected to a drain of the sixth transistor MB6, a drain of the ninth transistor MB9 is connected to a drain of the seventh transistor MB7, and a drain of the twelfth transistor MB12 is connected to a drain of the eleventh transistor MB11. Even in the operational amplifier 1D having such a configuration, the same effects as those of the operational amplifier 1C according to the present embodiment may be achieved. Each of the transistors MB1, MB2, MB4, MB5, MB8, MB9, and MB11 of the operational amplifier 1D illustrated in FIG. 15 may have the same structure as each of the buried channel-type MOSFETs of the second embodiment or the transistors M1, M2, M4, and M5 of the third embodiment. In addition, one or two of the pair of transistors MB1 and MB2 constituting the differential pair 101, the pair of transistors MB8 and MB9 constituting the current mirror circuit, and the pair of transistors MB4, MB5, and MB11 constituting the current mirror circuit may have the same structure as each of the buried channel type MOSFETs of the second embodiment or the transistors M1, M2, M4, and M5 of the third embodiment. In short, the operational amplifier 1D may have a configuration in which structures similar to the structures of the low concentration transistors of the first embodiment, the MOSFETs of the second embodiment, and the transistors M1, M2, M4, and M5 of the third embodiment are mixed.

(Sixth Embodiment)

Figure 16:
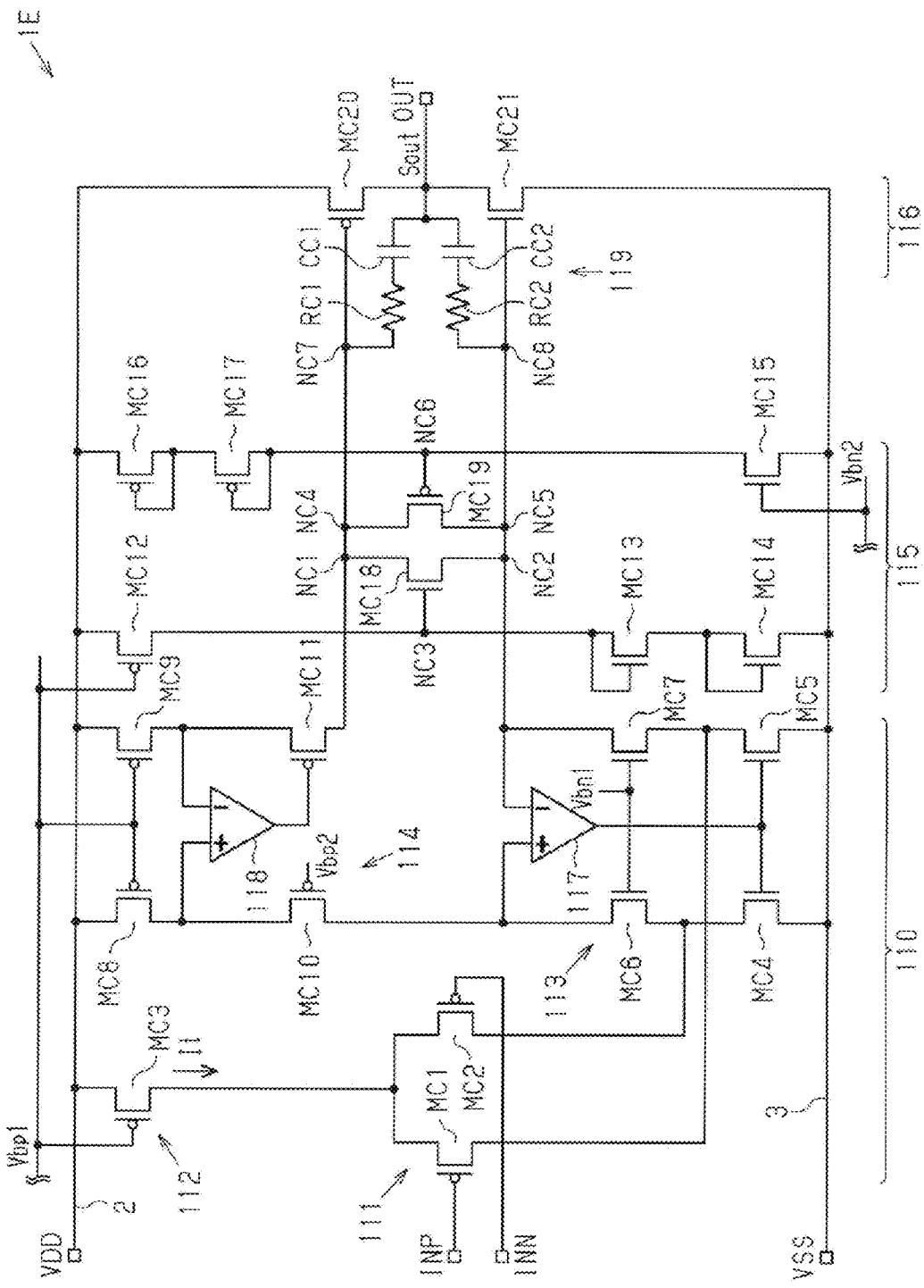
FIG. 16 is a circuit diagram of an operational amplifier in an integrated circuit according to a sixth embodiment of the present disclosure.

An operational amplifier 1E according to a sixth embodiment of the present disclosure will be described with reference to FIG. 16.

The operational amplifier 1E amplifies a potential difference between an inverting input terminal INN and a non-inverting input terminal INP, and outputs an output signal Sout from an output terminal OUT. The operational amplifier 1E includes a differential amplification stage 110, a class AB bias circuit 115, and an output stage 116 which is a last stage. The differential amplification stage 110 includes a differential pair 111, a tail current source 112, a cascode current mirror circuit 113, and a bias circuit 114. The operational amplifier 1E is integrated into a single semiconductor substrate.

The differential pair 111 includes a first transistor MC1 connected to the non-inverting input terminal INP and a second transistor MC2 connected to the inverting input terminal INN. The differential pair 111 of the present embodiment is configured by P-channel MOSFETs. The first transistor MC1 and the second transistor MC2 may have either a depletion type structure or an enhancement type structure. In the present embodiment, the first transistor MC1 and the second transistor MC2 have an enhancement type structure. A gate of the first transistor MC1 is connected to the non-inverting input terminal INP, and a gate of the second transistor MC2 is connected to the inverting input terminal INN. A source of the first transistor MC1 and a source of the second transistor MC2 are commonly connected.

The tail current source 112 includes a third transistor MC3 connected to the differential pair 111. The third transistor MC3 of the present embodiment is a P-channel MOSFET. A drain of the third transistor MC3 is connected to the source of each of the transistors MC1 and MC2, and a source of the third transistor MC3 is connected to a first power line 2. A bias voltage Vbp1 from a first bias circuit (not shown) is input to a gate of the third transistor MC3. The tail current source 112 supplies a tail current It based on the bias voltage Vbp1.

The cascode current mirror circuit 113 is an active load connected to the differential pair 111. The cascode current mirror circuit 113 is configured by stacking transistors of the same type in two stages, and includes a fourth transistor MC4 to a seventh transistor MC7. In the present embodiment, the fourth transistor MC4 to the seventh transistor MC7 are formed of N-channel MOSFETs. In particular, the fourth transistor MC4 and the fifth transistor MC5 have an enhancement type structure.

The fourth transistor MC4 is installed in series with the second transistor MC2. More specifically, the fourth transistor MC4 is installed between a drain of the second transistor MC2 and a second power line 3. The fifth transistor MC5 is installed in series with the first transistor MC1. More specifically, the fifth transistor MC5 is installed between a drain of the first transistor MC1 and the second power line 3. The sixth transistor MC6 is vertically stacked on the fourth transistor MC4, and the seventh transistor MC7 is vertically stacked on the fifth transistor MC5. More specifically, a source of the sixth transistor MC6 is connected to a drain of the fourth transistor MC4, and a source of the seventh transistor MC7 is connected to a drain of the fifth transistor MC5. Gates of the sixth transistor MC6 and the seventh transistor MC7 are commonly connected and are connected to a second bias circuit (not shown). The gates of the sixth transistor MC6 and the seventh transistor MC7 are appropriately biased by a bias voltage Vbn1 from the second bias circuit. Gates of the fourth transistor MC4 and the fifth transistor MC5 are connected to a drain of the sixth transistor MC6. Further, when the first transistor MC1 and the second transistor MC2 are of a depletion type, an input full swing (rail-to-rail) can be realized by the circuit configuration illustrated in FIG. 16.

In addition, the fourth transistor MC4 to the seventh transistor MC7 are connected to a first comparator 117. Specifically, the drain of the sixth transistor MC6 is connected to a non-inverting input terminal of the first comparator 117, the drain of the seventh transistor MC7 is connected to an inverting input terminal of the first comparator 117, and the gates of the fourth transistor MC4 and the fifth transistor MC5 are connected to an output terminal of the first comparator 117. Accordingly, the first comparator 117 outputs an output signal to the gates of the fourth transistor MC4 and the fifth transistor MC5 such that a drain voltage of the sixth transistor MC6 and a drain voltage of the seventh transistor MC7 matches each other.

The bias circuit 114 is a constant current circuit that maintains the cascode current mirror circuit 113 in an appropriate bias state. In one example, the bias circuit 114 is configured by stacking transistors of the same type in two stages, and includes an eighth transistor MC8 to an eleventh transistor MC11. In the present embodiment, the eighth transistor MC8 to the eleventh transistor MC11 are P-channel MOSFETs. In particular, the eighth transistor MC8 and the ninth transistor MC9 have an enhancement type structure. The eighth transistor MC8 and the ninth transistor MC9 constitute a current source for generating a predetermined current. Gates of the eighth transistor MC8 and the ninth transistor MC9 are appropriately biased by the first bias circuit. A gate of the tenth transistor MC10 is connected to a third bias circuit (not shown). The gate of the tenth transistor MC10 is appropriately biased by a bias voltage Vbp2 from the third bias circuit. In addition, the eighth transistor MC8, the ninth transistor MC9, and the eleventh transistor MC11 are connected to a second comparator 118. Specifically, drain of the eighth transistor MC8 is connected to a non-inverting input terminal of the second comparator 118, a drain of the ninth transistor MC9 is connected to an inverting input terminal of the second comparator 118, and a gate of the eleventh transistor MC11 is connected to an output terminal of the second comparator 118. Accordingly, when a difference between a drain voltage of the eighth transistor MC8 and a drain voltage of the ninth transistor MC9 is equal to or greater than a predetermined value, the second comparator 118 turns on the eleventh transistor MC11, thereby stopping the supply of current to the class AB bias circuit 115 and the output stage 116 via the eleventh transistor MC11.

The class AB bias circuit 115 includes a twelfth transistor MC12 to a nineteenth transistor MC19 and is an output buffer circuit that draws out a large driving current during operation from a small bias current during biasing.

The twelfth transistor MC12 to the fourteenth transistor MC14 are connected in series between the first power line 2 and the second power line 3. The twelfth transistor MC12 is a P-channel MOSFET, and the thirteenth transistor MC13 and the fourteenth transistor MC14 are N-channel MOSFETs. A source of the twelfth transistor MC12 is connected to the first power line 2, and the bias voltage Vbp1 is input from the first bias circuit to a gate of the twelfth transistor MC12. A drain of the thirteenth transistor MC13 is connected to a drain of the twelfth transistor MC12, a source of the thirteenth transistor MC13 is connected to a drain of the fourteenth transistor MC14, and a gate of the thirteenth transistor MC13 is connected to the drain of the thirteenth transistor MC13. A gate of the fourteenth transistor MC14 is connected to the drain of the fourteenth transistor MC14, and a source of the fourteenth transistor MC14 is connected to the second power line 3.

The fifteenth transistor MC15 to the seventeenth transistor MC17 are connected in series between the first power line 2 and the second power line 3. The fifteenth transistor MC15 to seventeenth transistor MC17 are installed on the output stage 116 side with respect to the twelfth transistor MC12 to the fourteenth transistor MC14. The fifteenth transistor MC15 is an N-channel MOSFET, and the sixteenth transistor MC16 and the seventeenth transistor MC17 are P-channel MOSFETs. A source of the fifteenth transistor MC15 is connected to the second power line 3, and a gate of the fifteenth transistor MC15 is connected to a fourth bias circuit (not shown). The gate of the fifteenth transistor MC15 is appropriately biased by a bias voltage Vbn2 input from the fourth bias circuit. A source of the sixteenth transistor MC16 is connected to the first power line 2, a drain of the sixteenth transistor MC16 is connected to a source of the seventeenth transistor MC17, and a gate of the sixteenth transistor MC16 is connected to the drain of the sixteenth transistor MC16. A gate of the seventeenth transistor MC17 is connected to a drain of the seventeenth transistor MC17, and the drain of the seventeenth transistor MC17 is connected to a drain of the fifteenth transistor MC15.

The eighteenth transistor MC18 and the nineteenth transistor MC19 are connected to the bias circuit 114, the cascode current mirror circuit 113, and the output stage 116. The eighteenth transistor MC18 is an N-channel MOSFET and the nineteenth transistor MC19 is a P-channel MOSFET. A drain of the eighteenth transistor MC18 is connected to a node NC1 between the drain of the eleventh transistor MC11 and the output stage 116, and a source of the eighteenth transistor MC18 is connected to a node NC2 between the drain of the seventh transistor MC7 and the output stage 116. A gate of the eighteenth transistor MC18 is connected to a node NC3 between the drain of the twelfth transistor MC12 and the drain of the thirteenth transistor MC13. A source of the nineteenth transistor MC19 is connected to a node NC4 between the drain of the eleventh transistor MC11 and the output stage 116, and a drain of the nineteenth transistor MC19 is connected to a node NC5 between the drain of the seventh transistor MC7 and the output stage 116. A gate of the nineteenth transistor MC19 is connected to a node NC6 between the drain of the fifteenth transistor MC15 and the drain of the seventeenth transistor MC17. The node NC4 is closer to the output stage 116 than the node NC1 and the node NC5 is closer to the output stage 116 than the node NC2.

The output stage 116 is a source-grounded circuit using a twentieth transistor MC20 and a twenty-first transistor MC21, amplifies an output signal Sout of the cascode current mirror circuit 113 which is the active load, and outputs it from the output terminal OUT.

In the present embodiment, the twentieth transistor MC20 is a P-channel MOSFET and the twenty-first transistor MC21 is an N-channel MOSFET. A source of the twentieth transistor MC20 is connected to the first power line 2, and a drain of the twentieth transistor MC20 is connected to the output terminal OUT. A gate of the twentieth transistor MC20 is connected to the drain of the eleventh transistor MC11. A source of the twenty-first transistor MC21 is connected to the second power line 3, and a drain of the twenty-first transistor MC21 is connected to the output terminal OUT. A gate of the twenty-first transistor MC21 is connected to the drain of the seventh transistor MC7.

The output stage 116 further includes a phase compensation circuit 119. The phase compensation circuit 119 includes a first resistor RC1, a second resistor RC2, a first capacitor CC1, and a second capacitor CC2. The first resistor RC1 and the first capacitor CC1 are connected in series. A first terminal of the first resistor RC1 is connected to a node NC7 between the drain of the eleventh transistor MC11 and the gate of the twentieth transistor MC20 and a second terminal of the first resistor RC1 is connected to a first terminal of the first capacitor CC1. A second terminal of the first capacitor CC1 is connected to the output terminal OUT. The second resistor RC2 and the second capacitor CC2 are connected in series. A first terminal of the second resistor RC2 is connected to a node NC8 between the drain of the seventh transistor MC7 and the gate of the twenty-first transistor MC21 and a second terminal of the second resistor RC2 is connected to a first terminal of the second capacitor CC2. The second terminal of the second capacitor CC2 is connected to the output terminal OUT.

The structures and manufacturing method of the N-channel MOSFETs and the P-channel MOSFETs of the first transistor MC1 to the twenty-first transistor MC21 are similar to those of the N-channel MOSFETs and the P-channel MOSFETs of the first transistor M1 and the like of the first embodiment. The gate lengths of the first transistor MC1 and the second transistor MC2 constituting the differential pair 111 are shorter than the gate lengths of the fourth transistor MC4 to the seventh transistor MC7 constituting the cascode current mirror circuit 113. Since the fluctuation of mobility can be reduced by such a relationship of the gate lengths, the 1/f noise of the output signal Sout can be reduced.

Furthermore, in the present embodiment, in order to further reduce the 1/f noise of the output signal Sout of the output stage 116, the impurity concentrations of the channel regions in some of the first transistor MC1 to the twenty-first transistor MC21 are set lower than the impurity concentrations of the channel regions in the other transistors. That is, the plurality of transistors of the operational amplifier 1E include high concentration transistors whose impurity concentrations of the channel regions are a first concentration and low concentration transistors whose impurity concentrations of the channel regions are a second concentration lower than the first concentration. Specifically, the impurity concentrations of the channel regions in transistors which are likely to be affected by the 1/f noise of the output signal Sout are set lower than the impurity concentrations of the channel regions in transistors which are unlikely to be affected by the 1/f noise of the output signal Sout. That is, the low concentration transistors are used for the transistors which are more likely to be affected by the 1/f noise of the operational amplifier 1E, among the plurality of transistors, than the high concentration transistors, and the high concentration transistors are used for the transistors which are unlikely to be affected by the 1/f noise of the operational amplifier 1E among the plurality of transistors. Specifically, in the operational amplifier 1E, the portions which are likely to be affected by the 1/f noise of the output signal Sout are the differential pair 111, a portion of the cascode current mirror circuit 113, and a portion of the bias circuit 114. On the other hand, the portions which are unlikely to be affected by the 1/f noise of the output signal Sout are the tail current source 112, another portion of the cascode current mirror circuit 113, another portion of the bias circuit 114, the class AB bias circuit 115, and the output Stage 116.

In the present embodiment, the impurity concentrations of the channel regions in transistors of the differential pair 111, a portion of the cascode current mirror circuit 113, and a portion of the bias circuit 114 are set lower than the impurity concentrations of the channel regions in transistors of the tail current source 112, another portion of the cascode current mirror circuits 113, another portion of the bias circuit 114, the class AB bias circuit 115, and the output stage 116. That is, the transistors of the differential pair 111, a portion of the cascode current mirror circuit 113, and a portion of the bias circuit 114 are low concentration transistors, and the transistors of the tail current source 112, another portion of the cascode current mirror circuit 113, another portion of the bias circuit 114, the class AB bias circuit 115, and the output stage 116 are high concentration transistors. Specifically, the impurity concentrations of the channel regions in the first transistor MC1, the second transistor MC2, the fourth transistor MC4, the fifth transistor MC5, the eighth transistor MC8, and the ninth transistor MC9 are set lower than the impurity concentrations of the channel regions in the third transistor MC3, the sixth transistor MC6, the seventh transistor MC7, and the tenth transistor MC10 to the twenty-first transistor MC21.

In some embodiments, the impurity concentration of the channel region in each of the transistors MC1, MC2, MC4, MC5, MC8, and MC9 may be about ½ or less of the impurity concentration of the channel region in each of the transistors MC3, MC6, MC7, and MC10 to MC21. In the present embodiment, the impurity concentration of the channel region in each of the transistors MC1, MC2, MC4, MC5, MC8, and MC9 is about 1/10 of the impurity concentration of the channel region in each of the transistors MC3, MC6, MC7, and MC10 to MC21.

According to the present embodiment, the following effects may be achieved.

(6-1) The impurity concentrations of the channel regions in the first transistor MC1 and the second transistor MC2 constituting the differential pair 111 are lower than the impurity concentrations of the channel regions in the twentieth transistor MC20 and the twenty-first transistor MC21 constituting the output stage 116 which is the last stage. With this configuration, by lowering the impurity concentration of the channel region of each of the transistors MC1 and MC2 constituting the differential pair 111 which are likely to be affected by the 1/f noise of the output signal Sout of the operational amplifier 1E, the fluctuation of mobility can be suppressed and the fluctuation of the drain current can be suppressed. Thus, it is possible to effectively suppress the 1/f noise of the output signal Sout of the operational amplifier 1E.

(6-2) The impurity concentrations of the channel regions in the fourth transistor MC4 and the fifth transistor MC5 constituting the current source of the cascode current mirror circuit 113 are lower than the impurity concentrations of the channel regions in the twentieth transistor MC20 and the twenty-first transistor MC21 constituting the output stage 116 which is the last stage. With this configuration, by lowering the impurity concentration of the channel region of each of the transistors MC4 and MC5 constituting the current source of the cascode current mirror circuit 113 which are likely to be affected by the 1/f noise of the output signal Sout of the operational amplifier 1E, the fluctuation of mobility can be suppressed and the fluctuation of the drain current can be suppressed. Thus, it is possible to effectively suppress the 1/f noise of the output signal Sout of the operational amplifier 1E.

(6-3) The impurity concentrations of the channel regions in the eighth transistor MC8 and the ninth transistor MC9 constituting the current source of the bias circuit 114 are lower than the impurity concentrations of the channel regions in the twentieth transistor MC20 and the twenty-first transistor MC21 constituting the output stage 116 which is the last stage. With this configuration, by lowering the impurity concentration of the channel region of each of the transistors MC8 and MC9 constituting the current source of the bias circuit 114 which are likely to be affected by the 1/f noise of the output signal Sout of the operational amplifier 1E, the fluctuation of mobility can be suppressed and the fluctuation of the drain current can be suppressed. Thus, it is possible to effectively suppress the 1/f noise of the output signal Sout of the operational amplifier 1E.

(6-4) The impurity concentrations of the channel regions in the eighth transistor MC8 and the ninth transistor MC9 constituting the current source of the bias circuit 114 and the impurity concentrations of the channel regions in the first transistor MC1 and the second transistor MC2 constituting the differential pair 111 are equal to each other. With this configuration, the step of forming the N-type well layer 70 of each of the transistors MC1 and MC2 constituting the differential pair 111 and the step of forming the N-type well layer 70 of each of the transistors MC8 and MC9 constituting the current source of the bias circuit 114 can be performed in batches. Thus, it is possible to simplify the process of manufacturing the operational amplifier 1E.

Instead of lowering the impurity concentration of the channel region of each of the transistors MC1, MC2, MC4, MC5, MC8, and MC9, the buried channel type transistors such as the transistors M1, M2, M4, and M5 of the second embodiment MOSFET may also be applied. Accordingly, the same effects as those of the second embodiment may be achieved. In addition, one or two of the pair of transistors MC1 and MC2 constituting the differential pair 111, the pair of transistors MC4 and MC5 constituting the current source of the cascode current mirror circuit 113, and the pair of transistors MC8 and MC9 constituting the current source of the bias circuit 114 may be replaced by the buried channel type MOSFETs of the second embodiment.

In addition to lowering the impurity concentration of the channel region of each of the transistors MC1, MC2, MC4, MC5, MC8, and MC9, the buried channel type MOSFETs may also be applied. That is, each of the transistors MC1, MC2, MC4, MC5, MC8, and MC9 may have the same structure as each of the transistors M1, M2, M4, and M5 of the third embodiment. Accordingly, the same effects as those of the third embodiment may be achieved. In addition, one or two of the pair of transistors MC1 and MC2 constituting the differential pair 111, the pair of transistors MC4 and MC5 constituting the current source of the cascode current mirror circuit 113, and the pair of transistors MC8 and MC9 constituting the current source of the bias circuit 114 may be modified to have the same structure as each of the transistors M1, M2, M4, and M5 of the third embodiment. Furthermore, one or two of the pair of transistors MC1 and MC2 constituting the differential pair 111, the pair of transistors MC4 and MC5 constituting the current source of the cascode current mirror circuit 113, and the pair of transistors MC8 and MC9 constituting the current source of the bias circuit 114 may be modified to have the same structure as each of the buried channel type MOSFETs of the second embodiment or the structure of each of the transistors M1, M2, M4, and M5 of the third embodiment. In short, the operational amplifier 1E may have a configuration in which structures similar to the structures of the low concentration transistors of the first embodiment, the MOSFETs of the second embodiment, and the transistors M1, M2, M4, and M5 of the third embodiment are mixed.

(Seventh Embodiment)

Figure 17:
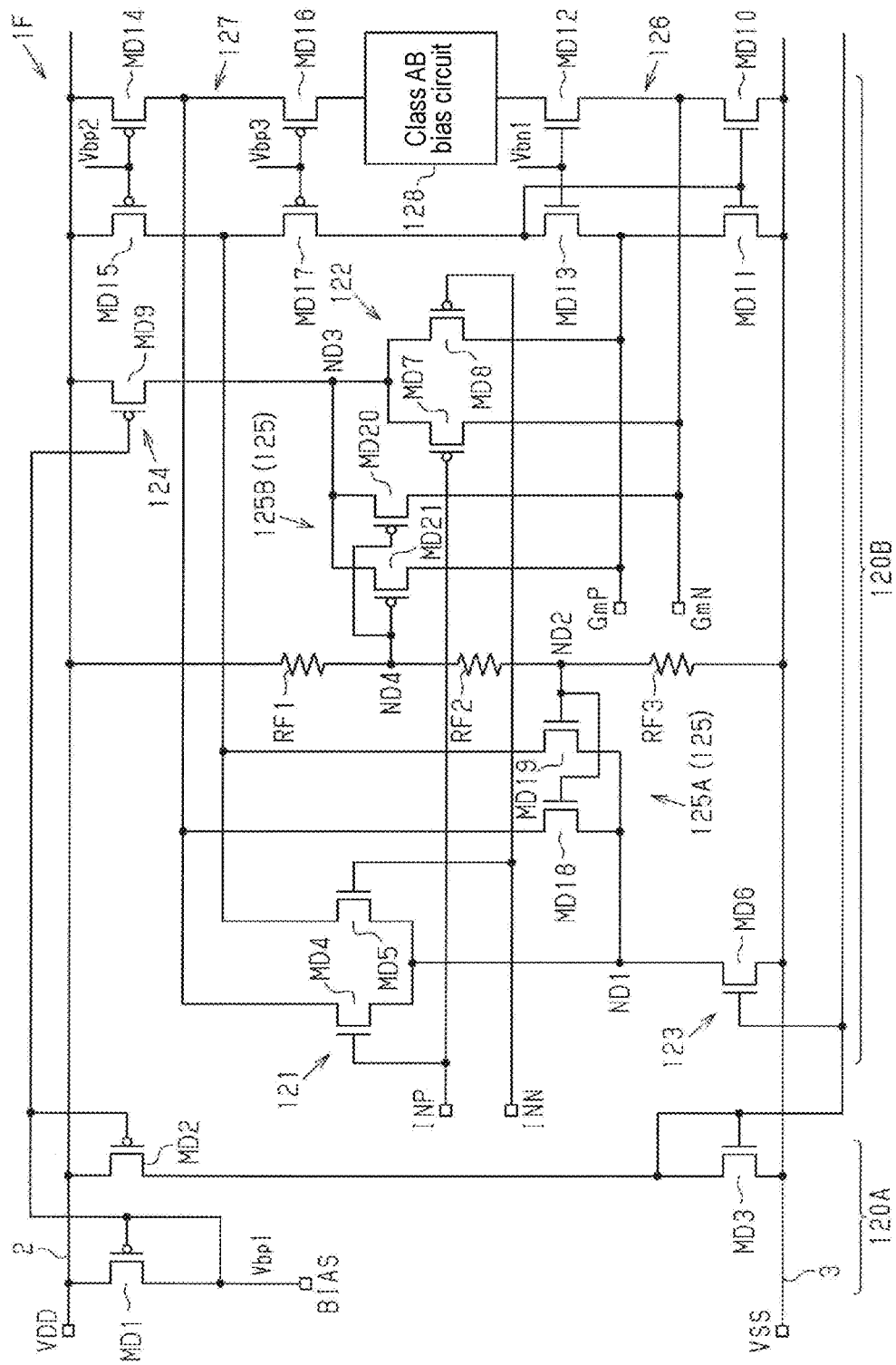
FIG. 17 is a circuit diagram of an operational amplifier in an integrated circuit according to a seventh embodiment of the present disclosure.

An operational amplifier 1F according to a seventh embodiment of the present disclosure will be described with reference to FIG. 17.

The operational amplifier 1F amplifies a potential difference between an inverting input terminal INN and a non-inverting input terminal INP, and outputs an output signal Sout from an output terminal (not shown). The operational amplifier 1F has a constant current generating part 120A and a differential amplification stage 120B. The operational amplifier 1F is integrated into a single semiconductor substrate.

The constant current generating part 120A includes a first transistor MD1 to a third transistor MD3. In the present embodiment, the first transistor MD1 and the second transistor MD2 are P-channel MOSFETs, and the third transistor MD3 is an N-channel MOSFET. A source of the first transistor MD1 and a source of the second transistor MD2 are connected to a first power line 2. A drain of the first transistor MD1 is connected to a bias terminal BIAS. A drain of the second transistor MD2 is connected to a drain of the third transistor MD3. A source of the third transistor MD3 is connected to a second power line 3, and a gate of the third transistor MD3 is connected to the drain of the third transistor MD3. A bias voltage Vbp1 is input to the source and a gate of the first transistor MD1 and a gate of the second transistor MD2 by a first bias circuit (not shown) connected to the bias terminal BIAS.

The differential amplification stage 120B includes a first differential pair 121, a second differential pair 122, a first tail current source 123, a second tail current source 124, a current switching part 125, a cascode current mirror circuit 126, a bias circuit 127, and a class AB bias circuit 128.

The first differential pair 121 has a fourth transistor MD4 and a fifth transistor MD5. The fourth transistor MD4 and the fifth transistor MD5 of the present embodiment are N-channel MOSFETs. The fourth transistor MD4 and the fifth transistor MD5 may have either a depletion type structure or an enhancement type structure. In the present embodiment, the fourth transistor MD4 and the fifth transistor MD5 have an enhancement type structure. A source of the fourth transistor MD4 and a source of the fifth transistor MD5 are commonly connected. A drain of the fourth transistor MD4 and a drain of the fifth transistor MD5 are connected to a bias circuit 127. A gate of the fourth transistor MD4 is connected to the non-inverting input terminal INP, and a gate of the fifth transistor MD5 is connected to the inverting input terminal INN.

The first tail current source 123 includes a sixth transistor MD6 connected to the first differential pair 121. The sixth transistor MD6 of the present embodiment is an N-channel MOSFET. A drain of the sixth transistor MD6 is connected to the sources of the fourth transistor MD4 and the fifth transistor MD5, and a source of the sixth transistor MD6 is connected to the second power line 3. A gate of the sixth transistor MD6 is connected to the gate of the third transistor MD3. Accordingly, a current mirror circuit is formed by the third transistor MD3 and the sixth transistor MD6.

The second differential pair 122 includes a seventh transistor MD7 and an eighth transistor MD8. In the present embodiment, the seventh transistor MD7 and the eighth transistor MD8 are P-channel MOSFETs. The seventh transistor MD7 and the eighth transistor MD8 may have either a depletion type structure or an enhancement type structure. In the present embodiment, the seventh transistor MD7 and the eighth transistor MD8 have an enhancement type structure. A source of the seventh transistor MD7 and a source of the eighth transistor MD8 are commonly connected. Drains of the seventh transistor MD7 and the eighth transistor MD8 are connected to the cascode current mirror circuit 126. A gate of the seventh transistor MD7 is connected to the non-inverting input terminal INP, and a gate of the eighth transistor MD8 is connected to the inverting input terminal INN.

The second tail current source 124 includes a ninth transistor MD9 connected to the second differential pair 122. The ninth transistor MD9 of the present embodiment is a P-channel MOSFET. A drain of the ninth transistor MD9 is connected to the sources of the seventh transistor MD7 and the eighth transistor MD8, and a source of the ninth transistor MD9 is connected to the first power line 2. A gate of the ninth transistor MD9 is connected to the gate of the second transistor MD2. Accordingly, a current mirror circuit is configured by the second transistor MD2 and the ninth transistor MD9. Further, a bias voltage Vbp1 is input from a first bias circuit to the gate of the second transistor MD2.

The cascode current mirror circuit 126 is connected to the second differential pair 122. The cascode current mirror circuit 126 is configured by stacking transistors of the same type in two stages, and includes a tenth transistor MD10 to a thirteenth transistor MD13. In the present embodiment, the tenth transistor MD10 to the thirteenth transistor MD13 include N-channel MOSFETs. In particular, the tenth transistor MD10 and the eleventh transistor MD11 have an enhancement type structure.

The tenth transistor MD10 is installed in series with the seventh transistor MD7. More specifically, the tenth transistor MD10 is installed between the drain of the seventh transistor MD7 and the second power line 3. The eleventh transistor MD11 is installed in series with the eighth transistor MD8. More specifically, the eleventh transistor MD11 is installed between the drain of the eighth transistor MD8 and the second power line 3. The twelfth transistor MD12 is vertically stacked on the tenth transistor MD10 and the thirteenth transistor MD13 is vertically stacked on the eleventh transistor MD11. More specifically, a source of the tenth transistor MD10 and a source of the eleventh transistor MD11 are connected to the second power line 3. A drain of the tenth transistor MD10 is connected to a source of the twelfth transistor MD12 and a drain of the eleventh transistor MD11 is connected to a source of the thirteenth transistor MD13. Gates of the twelfth transistor MD12 and the thirteenth transistor MD13 are connected to a second bias circuit (not shown). The gates of the twelfth transistor MD12 and the thirteenth transistor MD13 are appropriately biased by a bias voltage Vbn1 input from the second bias circuit. The gate of the tenth transistor MD10 and the gate of the eleventh transistor MD11 are connected to a drain of the thirteenth transistor MD13. With this connection, a low voltage and input full swing (rail-to-rail) can be realized even when the fourth transistor MD4, the fifth transistor MD5, the seventh transistor MD7, and the eighth transistor MD8 are of an enhancement type.

The bias circuit 127 is a constant current circuit that maintains the cascode current mirror circuit 126 in an appropriate bias state. In one example, the bias circuit 127 is configured by stacking transistors of the same type in two stages, and includes a fourteenth transistor MD14 to a seventeenth transistor MD17. In the present embodiment, the fourteenth transistor MD14 to the seventeenth transistor MD17 are P-channel MOSFETs. In particular, the fourteenth transistor MD14 and fifteenth transistor MD15 are of an enhancement type.

The fourteenth transistor MD14 and the fifteenth transistor MD15 constitute a current source for generating a predetermined current. The fourteenth transistor MD14 is installed in series with the fourth transistor MD4. More specifically, the fourteenth transistor MD14 is installed between the drain of the fourth transistor MD4 and the first power line 2. The fifteenth transistor MD15 is installed in series with the fifth transistor MD5. More specifically, the fifteenth transistor MD15 is installed between the drain of the fifth transistor MD5 and the first power line 2. Gates of the fourteenth transistor MD14 and the fifteenth transistor MD15 are connected to a second bias circuit (not shown). The gates of the fourteenth transistor MD14 and the fifteenth transistor MD15 are appropriately biased by a bias voltage Vbp2 input from a third bias circuit. The sixteenth transistor MD16 is vertically stacked on the fourteenth transistor MD14, and the seventeenth transistor MD17 is vertically stacked on the fifteenth transistor MD15. More specifically, a drain of the sixteenth transistor MD16 is connected to a source of the fourteenth transistor MD14, and a drain of the seventeenth transistor MD17 is connected to a source of the fifteenth transistor MD15. Gates of the sixteenth transistor MD16 and the seventeenth transistor MD17 are connected to a fourth bias circuit (not shown). The gates of the sixteenth transistor MD16 and the seventeenth transistor MD17 are appropriately biased by a bias voltage Vbp3 input from the third bias circuit.

The current switching part 125 includes a first resistor RF1, a second resistor RF2 and a third resistor RF3, which are three resistors connected in series between the first power line 2 and the second power line 3. A first terminal of the first resistor RF1 is connected to the first power line 2 and a second terminal of the first resistor RF1 is connected to a first terminal of the second resistor RF2. A second terminal of the second resistor RF2 is connected to a first terminal of the third resistor RF3 and a second terminal of the third resistor RF3 is connected to the second power line 3.

In addition, the current switching part 125 includes a first switching part 125A connected to the first differential pair 121 and a second switching part 125B connected to the second differential pair 122.

The first switching part 125A includes an eighteenth transistor MD18 and a nineteenth transistor MD19. In the present embodiment, the eighteenth transistor MD18 and the nineteenth transistor MD19 are enhancement type N-channel MOSFETs. A drain of the eighteenth transistor MD18 is connected to the drain of the fourth transistor MD4, and a drain of the nineteenth transistor MD19 is connected to the drain of the fifth transistor MD5. A source of the eighteenth transistor MD18 and a source of the nineteenth transistor MD19 are commonly connected and are connected to a node ND1 between the sources of the fourth transistor MD4 and the fifth transistor MD5 and the drain of the sixth transistor MD6. A gate of the eighteenth transistor MD18 and a gate of the nineteenth transistor MD19 are commonly connected and are connected to a node ND2 between the second resistor RF2 and the third resistor RF3.

The second switching part 125B includes a twentieth transistor MD20 and a twenty-first transistor MD21. In the present embodiment, the twentieth transistor MD20 and the twenty-first transistor MD21 are enhancement type P-channel MOSFETs. A drain of the twentieth transistor MD20 is connected to the drain of the seventh transistor MD7 and a drain of the twenty-first transistor MD21 is connected to the drain of the eighth transistor MD8. A source of the twentieth transistor MD20 and a source of the twenty-first transistor MD21 are commonly connected and are connected to a node ND3 between the drain of the ninth transistor MD9 and the sources of the seventh transistor MD7 and the eighth transistor MD8. A gate of the twentieth transistor MD20 and a gate of the twenty-first transistor MD21 are commonly connected and are connected to a node ND4 between the first resistor RF1 and the second resistor RF2. In addition, a drain of the twentieth transistor MD20 is connected to a first switching terminal GmP, and a drain of the twenty-first transistor MD21 is connected to a second switching terminal GmN. The first switching terminal GmP is connected to the drain of the seventh transistor MD7, and the second switching terminal GmN is connected to the drain of the eighth transistor MD8.

The class AB bias circuit 128 is installed between the cascode current mirror circuit 126 and the bias circuit 127. More specifically, the class AB bias circuit 128 is installed between the drain of the sixteenth transistor MD16 of the bias circuit 127 and the drain of the twelfth transistor MD12 of the cascode current mirror circuit 126. The class AB bias circuit 128 is an output buffer circuit which includes a plurality of transistors and draws out a large driving current during operation from a small bias current during biasing. The class AB bias circuit 128 is connected to an output stage (not shown) of the operational amplifier 1F.

The structures and manufacturing method of the N-channel MOSFETs and the P-channel MOSFETs of the first transistor MD1 to the twenty-first transistor MD21 are similar to those of the N-channel MOSFETs and the P-channel MOSFETs of the first transistor M1 and the like of the first embodiment. The gate lengths of the fourth transistor MD4 and the fifth transistor MD5 constituting the first differential pair 121 are shorter than the gate lengths of the fourteenth transistor MD14 to the seventeenth transistor MD17 constituting the bias circuit 127. The gate lengths of the seventh transistor MD7 and the eighth transistor MD8 constituting the second differential pair 122 are also shorter than the gate lengths of the tenth transistor MD10 to the thirteenth transistor MD13 constituting the cascode current mirror circuit 126. In some embodiments, the gate lengths of the seventh transistor MD7 and the eighth transistor MD8 constituting the second differential pair 122 may be equal to the gate lengths of the fourth transistor MD4 and the fifth transistor MD5 constituting the first differential pair 121. Further, in some embodiments, the gate lengths of the tenth transistor MD10 to the thirteenth transistor MD13 constituting the cascode current mirror circuit 126 may be equal to the gate lengths of the fourteenth transistor MD14 to the seventeenth transistor MD17 constituting the bias circuit 127. Since the fluctuation of mobility can be reduced by such a relationship of the gate lengths, the 1/f noise of the output signal Sout can be reduced.

Furthermore, in the present embodiment, in order to further reduce the 1/f noise of the output signal Sout of the operational amplifier 1F, the impurity concentrations of the channel regions in some of the first transistor MD1 to the twenty-first transistor MD21 are set lower than the impurity concentrations of the channel regions in the other transistors. That is, the plurality of transistors of the operational amplifier 1F include high concentration transistors whose impurity concentrations of the channel regions are a first concentration and low concentration transistors whose impurity concentrations of the channel regions are a second concentration lower than the first concentration. Specifically, the impurity concentrations of the channel regions in transistors which are likely to be affected by the 1/f noise of the output signal Sout among the transistors MD1 to MD21 are set lower than the impurity concentrations of the channel regions in transistors which are unlikely to be affected by the 1/f noise of the output signal Sout. That is, the low concentration transistors are used for the transistors which are more likely to be affected by the 1/f noise of the operational amplifier 1F, among the plurality of transistors, than the high concentration transistors, and the high concentration transistors are used for the transistors which are more unlikely to be affected by the 1/f noise of the operational amplifier 1F, among the plurality of transistors, than the low concentration transistors. More specifically, in the operational amplifier 1F, the portions which are likely to be affected by the 1/f noise of the output signal Sout are the first differential pair 121, the second differential pair 122, the current switching part 125, a portion of the cascode current mirror circuit 126, and a portion of the bias circuit 127. On the other hand, in the operational amplifier 1F, the portions which are unlikely to be affected by the 1/f noise of the output signal Sout are the constant current generating part 120A, the first tail current source 123, the second tail current source 124, and the class AB bias circuit 128.

In the present embodiment, the impurity concentrations of the channel regions in the transistors forming the first differential pair 121, the second differential pair 122, the current switching part 125, a portion of the cascode current mirror circuit 126, and a portion of the bias circuit 127 are set lower than the impurity concentrations of the channel regions constituting the constant current generating part 120A, the first tail current source 123, the second tail current source 124, and the class AB bias circuit 128. That is, the transistors of the first differential pair 121, the second differential pair 122, the current switching part 125, a portion of the cascode current mirror circuit 126, and a portion of the bias circuit 127 are low concentration transistors and the transistors of the constant current generating part 120A, the first tail current source 123, the second tail current source 124, and the class AB bias circuit 128 are high concentration transistors. Specifically, the impurity concentrations of the channel regions in the fourth transistor MD4, the fifth transistor MD5, the seventh transistor MD7, the eighth transistor MD8, the tenth transistor MD10, the eleventh transistor MD11, the fourteenth transistor MD14, the fifteenth transistor MD15, and the eighteenth transistor MD18 to the twenty-first transistor MD21 are set lower than the impurity concentrations of the channel regions in the first to third transistors MD1 to MD3, the sixth transistor MD6, the ninth transistor MD9, the twelfth transistor MD12, the thirteenth transistor MD13, the sixteenth transistor MD16, and the seventieth transistor MD17. That is, the fourth transistor MD4, the fifth transistor MD5, the seventh transistor MD7, the eighth transistor MD8, the tenth transistor MD10, the eleventh transistor MD11, the fourteenth transistor MD14, the fifteenth transistor MD15, and the eighteenth transistor MD18 to the twenty-first transistor MD21 are low concentration transistors. On the other hand, the first transistor MD1 to the third transistor MD3, the sixth transistor MD6, the ninth transistor MD9, the twelfth transistor MD12, the thirteenth transistor MD13, the sixteenth transistor MD16, and the seventeenth transistor MD17 are high concentration transistors.

In some embodiments, the impurity concentration of the channel region in each of the transistors MD4, MD5, MD7, MD8, MD10, MD11, MD14, MD15, and MD18 to MD21 may be about ½ or less of the impurity concentration of the channel region in each of the transistors MD1 to MD3, MD6, MD9, MD12, MD13, MD16, and MD17. In the present embodiment, the impurity concentration of the channel region in each of the transistors MD4, MD5, MD7, MD8, MD10, MD11, MD14, MD15, and MD18 to MD21 is about ⅒ of the impurity concentration of the channel region in each of the transistors MD1 to MD3, MD6, MD9, MD12, MD13, MD16, and MD17.

According to the present embodiment, the following effects may be achieved.

(7-1) The impurity concentrations of the channel regions in the fourth transistor MD4 and the fifth transistor MD5 constituting the first differential pair 121 are lower than the impurity concentration of the channel region in the sixth transistor MD6 constituting the first tail current source 123. Further, the impurity concentrations of the channel regions in the seventh transistor MD7 and the eighth transistor MD8 constituting the second differential pair 122 are lower than the impurity concentration of the channel region in the ninth transistor MD9 constituting the second tail current source 124. With this configuration, by lowering the impurity concentration of the channel region of each of the transistors MD4, MD5, MD7, and MD8 constituting each of the differential pairs 121 and 122 which are likely to be affected by the 1/f noise of the output signal Sout of the operational amplifier 1F, the fluctuation of the mobility can be suppressed and the fluctuation of the drain current can be suppressed. Thus, it is possible to effectively suppress the 1/f noise of the output signal Sout of the operational amplifier 1F.

(7-2) The impurity concentrations of the channel regions in the tenth transistor MD10 and the eleventh transistor MD11 constituting the current source of the cascode current mirror circuit 126 are lower than the impurity concentration of the channel region in the sixth transistor MD6 constituting the first tail current source 123. With this configuration, by lowering the impurity concentration of the channel region of each of the transistors MD10 and MD11 constituting the current source of the cascode current mirror circuit 126 which are likely to be affected by the 1/f noise of the output signal Sout of the operational amplifier 1F, the fluctuation of mobility can be suppressed and the fluctuation of the drain current can be suppressed. Thus, it is possible to effectively suppress the 1/f noise of the output signal Sout of the operational amplifier 1F.

(7-3) The impurity concentrations of the channel regions in the fourteenth transistor MD14 and the fifteenth transistor MD15 constituting the current source of the bias circuit 127 are lower than the impurity concentration of the channel region in the ninth transistor MD9 constituting the second tail current source 124. With this configuration, by lowering the impurity concentration of the channel region of each of the transistors MD14 and MD15 constituting the current source of the bias circuit 127 which are likely to be affected by the 1/f noise of the output signal Sout of the operational amplifier 1F, the fluctuation of mobility can be suppressed and the fluctuation of the drain current can be suppressed. Thus, it is possible to effectively suppress the 1/f noise of the output signal Sout of the operational amplifier 1F.

(7-4) The impurity concentrations of the channel regions in the eighteenth transistor MD18 and the nineteenth transistor MD19 constituting the first switching part 125A of the current switching part 125 are lower than the impurity concentration of the channel region in the sixth transistor MD6 constituting the first tail current source 123. Further, the impurity concentrations of the channel regions in the twentieth transistor MD20 and the twenty-first transistor MD21 constituting the second switching part 125B are lower than the impurity concentration of the channel region in the ninth transistor MD9 constituting the second tail current source 124. With this configuration, by lowering the impurity concentration of the channel region of each of the transistors MD18 to MD21 constituting the current switching part 125 which are likely to be affected by the 1/f noise of the output signal Sout of the operational amplifier 1F, the fluctuation of mobility can be suppressed and the fluctuation of the drain current can be suppressed. Thus, it is possible to effectively suppress the 1/f noise of the output signal Sout of the operational amplifier 1F.

(7-5) The impurity concentration of the channel region of each of the transistors MD10 and MD11 constituting the current source of the cascode current mirror circuit 126 and the impurity concentration of the channel region of each of the transistors MD1 and MD2 constituting the first differential pair 121, and the impurity concentration of the channel region of each of the transistors MD18 and MD19 constituting the first switching part 125A are equal to one another. With this configuration, the step of forming the P-type well layer 62 of each of the transistors MD1 and MD2, the step of forming the P-type well layer 62 of each of the transistors MD10 and MD11, and the step of forming the P-type well layer 62 of each of the transistors MD18 and MD19 may be performed in batches. Thus, it is possible to simplify the process of manufacturing the operational amplifier 1F.

(7-6) The impurity concentration of the channel region of each of the transistors MD14 and MD15 constituting the current source of the bias circuit 127, the impurity concentration of the channel region of each of the transistors MD7 and MD8 constituting the second differential pair 122, and the impurity concentration of the channel region of each of the transistors MD20 and MD21 constituting the second switching part 125 B are equal to one another. With this configuration, the step of forming the N-type well layer 70 of each of the transistors MD14 and MD15, the step of forming the N-type well layer 70 of each of the transistors MD7 and MD8, and the step of forming the N-type well layer 70 of each of the transistors MD20 and MD21 can be performed in batches. Thus, it is possible to simplify the process of manufacturing the operational amplifier 1F.

Instead of lowering the impurity concentration of the channel region of each of the transistors MD4, MD5, MD7, MD8, MD10, MD11, MD14, MD15, and MD18 to MD21, the buried channel type MOSFETs such as the transistors M1, M2, M4, and M5 of the second embodiment may also be applied. Accordingly, the same effects as those of the second embodiment may be achieved. In addition, each of the transistors MD4 and MD5 constituting the first differential pair 121, each of the transistors MD7 and MD8 constituting the second differential pair 122, each of the transistors MD10 and MD11 constituting the current source of the cascode current mirror circuit 126, each of the transistors MD14 and MD15 constituting the current source of the bias circuit 127, each of the transistors MD18 and MD19 constituting the first switching part 125A, and each of the transistors MD20 and MD21 constituting the second switching part 125B may be modified such that the low concentration transistors of the first embodiment and the buried channel type MOSFETs of the second embodiment are mixed.

In addition to lowering the impurity concentration of the channel region of each of the transistors MD4, MD5, MD7, MD8, MD10, MD11, MD14, MD15, and MD18 to MD21, the buried channel type MOSFETs may also be applied. That is, each of the transistors MD4, MD5, MD7, MD8, MD10, MD11, MD14, MD15, and MD18 to MD21 may have the same structure as each of the transistors M1, M2, M4, and M5 of the third embodiment. Accordingly, the same effects as those of the third embodiment may be achieved. Further, each of the transistors MD4 and MD5 constituting the first differential pair 121, each of the transistors MD7 and MD8 constituting the second differential pair 122, each of the transistors MD10 and MD11 constituting the current source of the cascode current mirror circuit 126, each of the transistors MD14 and MD15 constituting the current source of the bias circuit 127, each of the transistors MD18 and MD19 constituting the first switching part 125A, and each of the transistors MD20 and MD21 constituting the second switching part 125B may be modified such that structures similar to the structures of the low concentration transistors of the first embodiment and the transistors M1, M2, M4, and M5 of the third embodiment are mixed. Furthermore, each of the transistors MD4 and MD5 constituting the first differential pair 121, each of the transistors MD7 and MD8 constituting the second differential pair 122, each of the transistors MD10 and MD11 constituting the current source of the cascode current mirror circuit 126, each of the transistors MD14 and MD15 constituting the current source of the bias circuit 127, each of the transistors MD18 and MD19 constituting the first switching part 125A, and each of the transistors MD20 and MD21 constituting the second switching part 125B may be modified such that structures similar to the structures of the low concentration transistors of the first embodiment, the buried channel type MOSFETs of the second embodiment, and the transistors M1, M2, M4, and M5 of the third embodiment are mixed. In short, the operational amplifier 1F may have a configuration in which structures similar to the structures of the low concentration transistors of the first embodiment, the MOSFETs of the second embodiment, and the transistors M1, M2, M4, and M5 of the third embodiment are mixed.

In the current switching part 125, a specific circuit configuration is optional as long as it can realize the function thereof, and therefore, it is not limited to the circuit configuration of the present embodiment.

(Eighth Embodiment)

Figure 18:
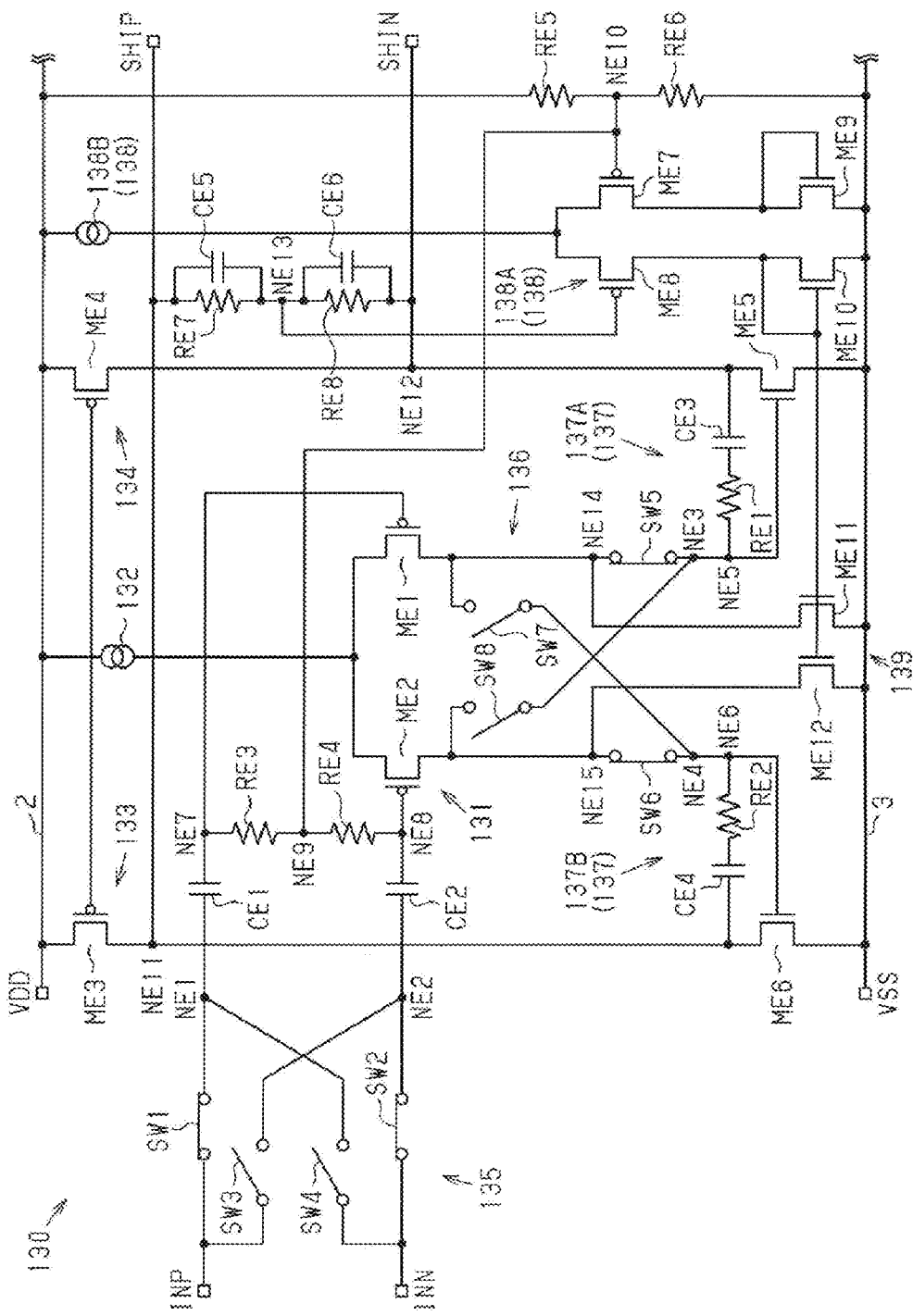
FIG. 18 is a circuit diagram of an integration circuit in an integrated circuit according to an eighth embodiment of the present disclosure.

An integration circuit 130 which is an example of an integrated circuit according to an eighth embodiment of the present disclosure will be described with reference FIG. 18. The integration circuit 130 of the present embodiment integrates a differential input current input to a non-inverting input terminal INP and an inverting input terminal INN, samples and holds the same at a predetermined period, and generates a differential voltage signal.

The integration circuit 130 includes a differential pair 131, a tail current source 132, constant current sources 133 and 134, a first selector 135, a second selector 136, an integrator 137, a sample-and-hold circuit (not shown), a common feedback circuit 138, and a current mirror circuit 139.

The differential pair 131 includes a first transistor ME1 and a second transistor ME2. In the present embodiment, the first transistor ME1 and the second transistor ME2 include P-channel MOSFETs. The first transistor ME1 and the second transistor ME2 may have either a depletion type structure or an enhancement type structure. In the present embodiment, the first transistor ME1 and the second transistor ME2 have an enhancement type structure. A source of the first transistor ME1 and a source of the second transistor ME2 are commonly connected.

The tail current source 132 includes a transistor (not shown) connected to the differential pair 131. The transistor of the present embodiment is a P-channel MOSFET. A drain of the transistor is connected to the source of each of the transistors ME1 and ME2, and a source of the transistor is connected to a first power line 2. A bias voltage from a first bias circuit (not shown) is input to a gate of the transistor. The tail current source 132 supplies a tail current It based on the bias voltage.

The constant current source 133 includes a third transistor ME3, and the constant current source 134 includes a fourth transistor ME4. The third transistor ME3 and the fourth transistor ME4 of the present embodiment are enhancement type P-channel MOSFETs. A source of the third transistor ME3 and a source of the fourth transistor ME4 are connected to the first power line 2, and a gate of the third transistor ME3 and a gate of the fourth transistor ME4 are commonly connected. For example, the bias voltage from the first bias circuit may be input to the gates of the third transistor ME3 and the fourth transistor ME4.

The first selector 135 is installed in front of the differential pair 131. The first selector 135 switches a first state in which a gate of the first transistor ME1 of the differential pair 131 and the non-inverting input terminal INP are connected and a gate of the second transistor ME2 and the inverting input terminal INN are connected and a second state in which the gate of the first transistor ME1 and the inverting input terminal INN are connected and the gate of the second transistor ME2 and the non-inverting input terminal INP are connected. In FIG. 18, the first state is illustrated. The first selector 135 includes a first switch SW1 to a fourth switch SW4, a first capacitor CE1, and a second capacitor CE2. The first capacitor CE1 and the second capacitor CE2 are capacitors for DC blocking. The first capacitor CE1 is installed between the first switch SW1 and the first transistor ME1 and the second capacitor CE2 is installed between the second switch SW2 and the second transistor ME2. Each of the switches SW1 to SW4 may be a CMOS switch (CMOS transfer gate). A first terminal of the first switch SW1 and a first terminal of the third switch SW3 are connected to the non-inverting input terminal INP and a first terminal of the second switch SW2 and a first terminal of the fourth switch SW4 are connected to the inverting input terminal INN. A second terminal of the first switch SW1 is connected to a node NE1 between the first switch SW1 and the first capacitor CE1. A second terminal of the second switch SW2 is connected to a node NE2 between the second switch SW2 and the second capacitor CE2. A second terminal of the third switch SW3 is connected to the node NE2, and a second terminal of the fourth switch SW4 is connected to the node NE1. The first selector 135 is in the first state when the first switch SW1 and the second switch SW2 are turned on and the third switch SW3 and the fourth switch SW4 are turned off, and is in the second state when the first switch SW1 and the second switch SW2 are turned off and the third switch SW3 and the fourth switch SW4 are turned on.

The second selector 136 is installed after the differential pair 131. The second selector 136 switches between a first state in which a drain of the first transistor ME1 is connected to a first circuit 137A of the integrator 137 and a drain of the second transistor ME2 is connected to a second circuit 137B of the integrator 137 and a second state in which the drain of the first transistor ME1 is connected to the second circuit 137B and the drain of the second transistor ME2 is connected to the first circuit 137A. The second selector 136 includes a fifth switch SW5 to an eighth switch SW8. Each of the switches SW5 to SW8 may be a CMOS switch (CMOS transfer gate). A first terminal of the fifth switch SW5 and a first terminal of the seventh switch SW7 are connected to the drain of the first transistor ME1 and a first terminal of the sixth switch SW6 and a first terminal of the eighth switch SW8 are connected to the drain of the second transistor ME2. A second terminal of the fifth switch SW5 is connected to a node NE3 between the first transistor ME1 and the first circuit 137A. A second terminal of the sixth switch SW6 is connected to a node NE4 between the second transistor ME2 and the second circuit 137B. A second terminal of the seventh switch SW7 is connected to the node NE4, and a second terminal of the eighth switch SW8 is connected to the node NE3. The second selector 136 is in the first state when the fifth switch SW5 and the sixth switch SW6 are turned on and the seventh switch SW 7 and the eighth switch SW 8 are turned off, and is in the second state when the fifth switch SW5 and the sixth switch SW6 are turned off and the seventh switch SW7 and the eighth switch SW8 are turned on.

The integrator 137 includes the first circuit 137A and the second circuit 137B. The integrator 137 integrates a first differential input current flowing from the differential pair 131 to the first circuit 137A to generate a first differential voltage signal. The integrator 137 integrates a second differential input current flowing from the differential pair 131 to the second circuit 137B to generate a second differential voltage signal.

The first circuit 137A includes a fifth transistor ME5, a resistor RE1, and a capacitor CE3. The fifth transistor ME5 of the present embodiment is an enhancement type N-channel MOSFET. A drain of the fifth transistor ME5 is connected to the drain of the fourth transistor ME4, a source of the fifth transistor ME5 is connected to a second power line 3, and a gate of the fifth transistor ME5 is connected to the node NE3. The resistor RE1 and the capacitor CE3 are connected in series to form an RC circuit. A first terminal of the resistor RE1 is connected to a node NE5 between the node NE3 and the gate of the fifth transistor ME5. A second terminal of the resistor RE1 is connected to a first terminal of the capacitor CE3. A second terminal of the capacitor CE3 is connected to the drain of the fifth transistor ME5.

The second circuit 137B includes a sixth transistor ME6, a resistor RE2, and a capacitor CE4. The sixth transistor ME6 of the present embodiment is an enhancement type N-channel MOSFET. A drain of the sixth transistor ME6 is connected to the drain of the third transistor ME3, a source of the sixth transistor ME6 is connected to the second power line 3, and a gate of the sixth transistor ME6 is connected to the node NE4. The resistor RE2 and the capacitor CE4 are connected in series to form an RC circuit. A first terminal of the resistor RE2 is connected to a node NE6 between the node NE4 and the gate of the sixth transistor ME6. A second terminal of the resistor RE2 is connected to a first terminal of the capacitor CE4. A second terminal of the capacitor CE4 is connected to a drain of the sixth transistor ME6.

The common feedback circuit 138 adjusts the bias state of the differential pair 131 such that a midpoint voltage between the first differential output voltage and the second differential output voltage of the integrator 137 approaches a target voltage. The common feedback circuit 138 includes a differential pair 138A, a tail current source 138B, six resistors RE3 to RE8, and two capacitors CE5 and CE6.

The differential pair 138A has a seventh transistor ME7 and an eighth transistor ME8. The seventh transistor ME7 and the eighth transistor ME8 of the present embodiment are P-channel MOSFETs. A source of the seventh transistor ME7 and a source of the eighth transistor ME8 are commonly connected. The common feedback circuit 138 further includes a ninth transistor ME9 and a tenth transistor ME10. The ninth transistor ME9 and the tenth transistor ME10 are enhancement type N-channel MOSFETs. A drain of the ninth transistor ME9 is connected to a drain of the seventh transistor ME7 and a drain of the tenth transistor ME10 is connected to a drain of the eighth transistor ME8. A source of the ninth transistor ME9 and a source of the tenth transistor ME10 are connected to the second power line 3. A gate of the ninth transistor ME9 is connected to the drain of the ninth transistor ME9. A gate of the tenth transistor ME10 is connected to a drain of the tenth transistor ME10.

The tail current source 138B includes a transistor connected to the differential pair 138A. The transistor of the present embodiment is a P-channel MOSFET. A drain of the transistor is connected to the source of each of the transistors ME7 and ME8, and a source of the transistor is connected to the first power line 2. A bias voltage from a first bias circuit (not shown) is input to a gate of the transistor. The tail current source 138B supplies a tail current based on the bias voltage.

The resistor RE3 and the resistor RE4 are connected in series. A first terminal of the resistor RE3 is connected to a node NE7 between the capacitor CE1 and the gate of the first transistor ME1. A second terminal of the resistor RE3 is connected to a first terminal of the resistor RE4. A second terminal of the resistor RE4 is connected to a node NE8 between the capacitor CE2 and the gate of the second transistor ME2. The resistor RE5 and the resistor RE6 are connected in series between the first power line 2 and the second power line 3. A first terminal of the resistor RE 5 is connected to the first power line 2, and a second terminal of the resistor RE5 is connected to a first terminal of the resistor RE6. A second terminal of the resistor RE6 is connected to the second power line 3. A gate of the seventh transistor ME7 is connected to a node NE9 between the second terminal of the resistor RE3 and the first terminal of the resistor RE4 and to a node NE10 between the second terminal of the resistor RE5 and the first terminal of the resistor RE6.

The resistor RE7 and the resistor RE8 are connected in series. A first terminal of the resistor RE7 is connected to a non-inverting input terminal SHIP of the sample-and-hold circuit, and a second terminal of the resistor RE7 is connected to a first terminal of the resistor RE8. A second terminal of the resistor RE8 is connected to an inverting input terminal SHIN of the sample-and-hold circuit. The capacitor CE5 is connected in parallel with the resistor RE7 and the capacitor CE6 is connected in parallel with the resistor RE8. The non-inverting input terminal SHIP is connected to a node NE11 between the drain of the third transistor ME3 and the drain of the sixth transistor ME6. The inverting input terminal SHIN is connected to a node NE12 between the drain of the fourth transistor ME4 and the drain of the fifth transistor ME5. A gate of the eighth transistor ME8 is connected to a node NE13 between the second terminal of the resistor RE7 and the first terminal of the resistor RE8.

The current mirror circuit 139 includes an eleventh transistor ME11 and a twelfth transistor ME12. The eleventh transistor ME11 and twelfth transistor ME12 of the present embodiment are enhancement type N-channel MOSFETs. A source of the eleventh transistor ME11 and a source of the twelfth transistor ME12 are connected to the second power line 3, and a gate of the eleventh transistor ME11 and a gate of the twelfth transistor ME12 are commonly connected to the gate of the tenth transistor ME10. A drain of the eleventh transistor ME11 is connected to a node NE14 between the drain of the first transistor ME1 and the fifth switch SW5. A drain of the twelfth transistor ME12 is connected to a node NE15 between the drain of the second transistor ME2 and the sixth switch SW6.

The structures and manufacturing method of the N-channel MOSFETs and the P-channel MOSFETs of the first transistor ME1 to the twelfth transistor ME12 are similar to those of the N-channel MOSFETs and the P-channel MOSFETs of the first transistor M1 and the like of the first embodiment. The gate lengths of the first transistor ME1 and the second transistor ME2 constituting the differential pair 131 are shorter than the gate lengths of the eleventh transistor ME11 and the twelfth transistor ME12 constituting the current mirror circuit 139. Since the fluctuation of mobility can be reduced by such a relationship of the gate lengths, the 1/f noise of the output signal Sout can be reduced.

Furthermore, in the present embodiment, in order to further reduce the 1/f noise of the output signal Sout of the integration circuit 130, the impurity concentrations of the channel regions in some of the first transistor ME1 to the twelfth transistor ME12 are set lower than the impurity concentrations of the channel regions in the other transistors. That is, the plurality of transistors of the integration circuit 130 include high concentration transistors whose impurity concentrations of the channel regions are a first concentration and low concentration transistors whose impurity concentrations of the channel regions are a second concentration lower than the first concentration. Specifically, the impurity concentrations of the channel regions in transistors which are likely to be affected by the 1/f noise of the output signal Sout among the transistors ME1 to ME12 are set lower than the impurity concentrations of the channel regions in transistors which are unlikely to be affected by the 1/f noise of the output signal Sout among the transistors ME1 to ME12. That is, the low concentration transistors are used for the transistors which are more likely to be affected by the 1/f noise of the integration circuit 130, among the plurality of transistors, than the high concentration transistors, and the high concentration transistors are used for the transistors which are more unlikely to be affected by the 1/f noise of the integration circuit 130, among the plurality of transistors, than the low concentration transistors. Specifically, the portions which are likely to be affected by the 1/f noise of the output signal Sout are the differential pair 131, the constant current sources 133 and 134, the integrator 137, a portion of the common feedback circuit 138, and the current mirror circuit 139, and the portion which is unlikely to be affected by the 1/f noise of the output signal Sout is the differential pair 138A of the common feedback circuit 138.

In the present embodiment, the impurity concentrations of the channel regions in the transistors of the differential pair 131, the constant current sources 133 and 134, the integrator 137, a portion of the common feedback circuit 138, and the current mirror circuit 139 are set lower than the impurity concentrations of the channel regions in the transistors of the differential pair 138A of the common feedback circuit 138. That is, the transistors constituting the differential pair 131, the constant current sources 133 and 134, the integrator 137, a portion of the common feedback circuit 138, and the current mirror circuit 139 are low concentration transistors, and the transistors constituting the differential the pair 138A of the common feedback circuit 138 are high concentration transistors. Specifically, the impurity concentrations of the channel regions in the first transistor ME1 to the sixth transistor ME6 and the ninth transistor ME9 to the twelfth transistor ME12 are set lower than the impurity concentrations of the channel regions in the seventh transistor ME7 and the eighth transistor ME8. That is, the first transistor ME1 to the sixth transistor ME6 and the ninth transistor ME9 to the twelfth transistor ME12 are low concentration transistors, and the seventh transistor ME7 and the eighth transistor ME8 are high concentration transistors.

In some embodiments, the impurity concentration of the channel region in each of the transistors ME1 to ME6 and ME 9 to ME12 may be about ½ or less of the impurity concentration of the channel region in each of the transistors ME7 and ME8. In the present embodiment, the impurity concentration of the channel region in each of the transistors ME1 to ME6 and ME 9 to ME12 is about ⅒ of the impurity concentration of the channel region in each of the transistors ME7 and ME8.

According to the present embodiment, the following effects may be achieved.

(8-1) The impurity concentrations of the channel regions in the first transistor ME1 and the second transistor ME2 constituting the differential pair 131 are lower than the impurity concentrations of the channel regions in the seventh transistor ME7 and the eighth transistor ME8 constituting the differential pair 138A of the common feedback circuit 138. With this configuration, by lowering the impurity concentration of the channel region of each of the transistors ME1 and ME2 constituting the differential pair 131 which are likely to be affected by the 1/f noise of the output signal Sout of the integration circuit 130, the fluctuation of mobility can be suppressed and the fluctuation of the drain current can be suppressed. Thus, it is possible to effectively reduce the 1/f noise of the output signal Sout of the integration circuit 130.

(8-2) The impurity concentrations of the channel regions in the third transistor ME3 and the fourth transistor ME4 constituting the constant current sources 133 and 134 are lower than the impurity concentrations of the channel regions in the seventh transistor ME7 and the transistor ME8 constituting the differential pair 138A of the common feedback circuit 138. With this configuration, by lowering the impurity concentration of the channel region of each of the transistors ME3 and ME4 constituting the constant current sources 133 and 134 which are likely to be affected by the 1/f noise of the output signal Sout of the integration circuit 130, the fluctuation of mobility can be suppressed and the fluctuation of the drain current can be suppressed. Thus, it is possible to effectively reduce the 1/f noise of the output signal Sout of the integration circuit 130.

(8-3) The impurity concentrations of the channel regions in the eleventh transistor ME11 and the twelfth transistor ME12 constituting the current mirror circuit 139 are lower than the impurity concentrations of the channel regions in the seventh transistor ME7 and the eighth transistor ME8 constituting the differential pair 138A of the common feedback circuit 138. With this configuration, by lowering the impurity concentration of the channel region of each of the transistors ME11 and ME12 constituting the current mirror circuit 139 which are likely to be affected by the 1/f noise of the output signal Sout of the integration circuit 130, the fluctuation mobility can be suppressed and the fluctuation of the drain current can be suppressed. Thus, it is possible to effectively reduce the 1/f noise of the output signal Sout of the integration circuit 130.

(8-4) The impurity concentrations of the channel regions in the fifth transistor ME5 and the sixth transistor ME6 constituting the integrator 137 are lower than the impurity concentrations of the channel regions in the seventh transistor ME7 and the eighth transistor ME8 constituting the differential pair 138A of the common feedback circuit 138. With this configuration, by lowering the impurity concentration of the channel region of each of the transistors ME5 and ME6 constituting the integrator 137 which are likely to be affected by the 1/f noise of the output signal Sout of the integration circuit 130, the fluctuation of mobility can be suppressed and the fluctuation of the drain current can be suppressed. Thus, it is possible to effectively reduce the 1/f noise of the output signal Sout of the integration circuit 130.

(8-5) The impurity concentration of the channel region of each of the transistors ME3, ME4 constituting the constant current sources 133 and 134 and the impurity concentrations of the channel regions of the first transistor ME1 and the second transistor ME2 constituting the differential pair 131 are equal to each other. With this configuration, since the step of forming the N-type well layer 70 of each of the transistors ME3 and ME4 and the step of forming the N-type well layer 70 of each of the transistors ME1 and ME2 may be performed in batches, it is possible to simplify the process of manufacturing the integration circuit 130.

(8-6) The impurity concentration of the channel region of each of the transistors ME11 and ME12 constituting the current mirror circuit 139, the impurity concentration of the channel region of each of the transistors ME5 and ME6 constituting the integrator 137, and the impurity concentration of the channel region of each of the transistors ME9 and ME10 constituting the current source of the common feedback circuit 138 are equal to one another. With this configuration, since the step of forming the P-type well layer 62 of each of the transistors ME11 and ME12, the step of forming the P-type well layer 62 of each of the transistors ME5 and ME6, and the step of forming the P-type well layer 62 of each of the transistors ME9 and ME10 may be performed in batches, it is possible to simplify the process of manufacturing the integration circuit 130.

Instead of lowering the impurity concentration of the channel region of each of the transistors ME1 to ME6 and ME 9 to ME12, the buried channel type MOSFETs such as the transistors M1, M2, M4, and M5 of the second embodiment may also be applied. Accordingly, the same effects as those of the second embodiment may be achieved. Furthermore, one or two of the pair of transistors ME1 and ME2 constituting the differential pair 131, the pair of transistors ME11 and ME12 constituting the current mirror circuit 139, and the pair of transistors ME3 and ME4 constituting the constant current sources 133 and 134 may be replaced by the buried channel type MOSFETs of the second embodiment.

In addition to lowering the impurity concentration in the channel region of each of the transistors ME1 to ME6 and ME 9 to ME12, the buried channel type MOSFETs may be applied. That is, each of the transistors ME1 to ME6 and ME9 to ME12 may be modified to have the same structure as each of the transistors M1, M2, M4, and M5 of the third embodiment. Accordingly, the same effects as those of the third embodiment may be achieved. In addition, one or two of the pair of transistors ME1 and ME2 constituting the differential pair 131, the pair of transistors ME11 and ME12 constituting the current mirror circuit 139, and the pair of transistors ME3 and ME4 constituting the constant current sources 133 and 134 may be modified to have the same structure as each of the transistors M1, M2, M4, and M5 of the third embodiment. Moreover, one or two of the pair of transistors ME1 and ME2 constituting the differential pair 131, the pair of transistors ME11 and ME12 constituting the current mirror circuit 139, and the pair of transistors ME3 and ME4 constituting the constant current sources 133 and 134 may be modified to have the same structure as the buried channel type MOSFETs of the second embodiment or each of the transistors M1, M2, M4, and M5 of the third embodiment. In short, the integration circuit 130 may have a configuration in which structures similar to the structures of the low concentration transistors of the first embodiment, the MOSFETs of the second embodiment, and the transistors M1, M2, M4, and M5 of the third embodiment are mixed.

Exemplary Modifications

The description of each of the aforementioned embodiments is merely an example of an aspect that the integrated circuit and the method of manufacturing an integrated circuit according to the present disclosure may take and is not intended to limit the aspect. The integrated circuit and the method of manufacturing an integrated circuit according to the present disclosure may take, for example, an aspect that the modifications of the embodiments set forth below and at least two modifications which are not inconsistent with each other may be combined.

The first to third embodiments may be combined with each other. For example, in the first embodiment, one of the pair of first transistor M1 and second transistor M2 and the pair of fourth transistor M4 and fifth transistor M5 may be replaced by the transistors as the buried channel type MOSFETs of the second embodiment. In the third embodiment, one of the pair of first transistor M1 and second transistor M2 and the pair of fourth transistor M4 and fifth transistor M5 may also be replaced by the low concentration transistors of the first embodiment or the buried channel type MOSFETs of the second embodiment. In short, the operational amplifier 1 (integrated circuit) may have a configuration in which structures similar to the structures of the low concentration transistors of the first embodiment, the MOSFETs of the second embodiment, and the transistors M1, M2, M4, and M5 of the third embodiment are mixed.

In each of the aforementioned embodiments, while the device isolation region 35 in the silicon substrate 30 has the STI structure, the present disclosure is not limited thereto but may have a local oxidation of silicon (LOCOS) structure.

In each of the aforementioned embodiments, a so-called double-diffused drain (DDD) type MOSFET in which the source region 45 of the N-channel MOSFETs among the plurality of transistors of the integrated circuit includes the low concentration source region 47 and the high concentration source region 48, and the drain region 46 includes the low concentration drain region 49 and the high concentration drain region 50 is adopted. However, the structure of the N-channel MOSFET is not limited thereto. For example, the source region 45 of the N-channel MOSFET may include only the high concentration source region 48 and the drain region 46 may include only the high concentration drain region 50. Similarly, the source region 64 and the drain region 65 of the P-channel MOSFET, among the plurality of transistors of the integrated circuit, may include only the high concentration source region 67 and only the high concentration drain region 69, respectively.

The gate insulating film 42 is not limited to a silicon oxide film but may be formed of a high dielectric constant material (high-k material). As the high dielectric constant material, for example, $HfO_2$, HfSiON, SiON, $Si_3N_4$, $Al_2O_3$, $Ta_2O_5$, $TiO_2$, $La_2O_3$, $CeO_2$, $ZrO_2$, $SrTiO_3$, $Pr_2O_3$ or the like is considered.

Furthermore, when the high dielectric constant material is adopted as the gate insulating film 42, there is a possibility that scattering is likely to occur at the interface between the channel region and the gate insulating film 42 depending on the high dielectric constant material, deteriorating the 1/f noise characteristics. To this end, since the deterioration of the 1/f noise characteristics due to the scattering at the interface can be suppressed, for example, by adopting the buried channel type MOSFETs as in the second embodiment, it is possible to suppress the aforementioned possibility caused by adopting the high dielectric constant material as the gate insulating film 42.

In the first embodiment described above, the impurity concentration of the P-type well layer 62 (the N-type well layer 70) in some of the plurality of transistors of the integrated circuit was set lower than the impurity concentration of the P-type well layer 41 (the N-type well layer 63) in the other transistors, but the structures of the plurality of transistors are not limited thereto. For example, as illustrated in FIG. 19, a P-type epitaxial layer 31 may be used as a conductive region forming a channel region of a first transistor M1 (N-channel MOSFET) as an example of some transistors described above, a high pressure-resistant N-type well layer 39 may be used as a conductive region forming a channel region of a fourth transistor M4 (P-channel MOSFET) as an example of some transistors described above.

Figure 19:
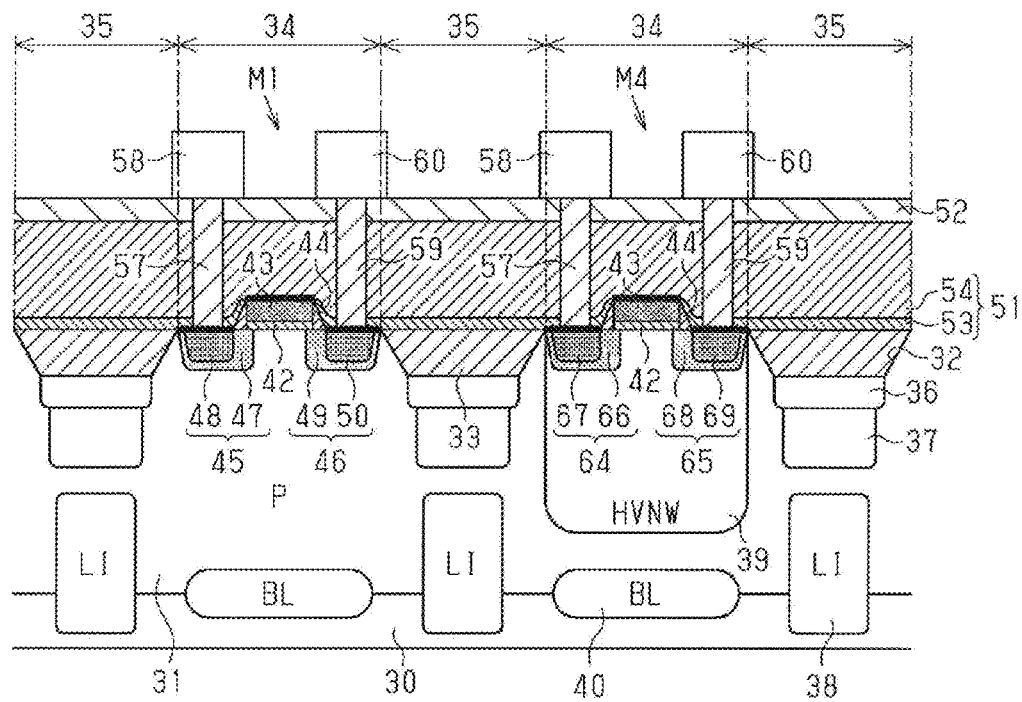
FIG. 19 is a cross-sectional view of a first transistor constituting a differential pair of the operational amplifier and a fourth transistor constituting a current mirror circuit in an integrated circuit according to an exemplary modification.

In the first transistor M1 of FIG. 19, a source region 45 and a drain region 46 are formed in the surface layer portion of the P-type epitaxial layer 31. That is, a channel region is formed in the P-type epitaxial layer 31. The channel region of the first transistor M1 in FIG. 19 is arranged below the gate insulating film 42 in the P-type epitaxial layer 31 and between the source region 45 and the drain region 46. The channel region of the first transistor M1 in FIG. 19 includes an interface between the P-type epitaxial layer 31 and the gate insulating film 42. Further, the impurity concentration of the channel region of the first transistor M1 is equal to the impurity concentration of the P-type epitaxial layer 31.

The impurity concentration of the P-type epitaxial layer 31 in the first transistor M1 of FIG. 19 is, for example, lower than the impurity concentration of the P-type well layer 41 (see FIG. 2A) of the third transistor M3. In one example, the impurity concentration of the P-type epitaxial layer 31 is about ½ or less of the impurity concentration of the P-type well layer 41 of the third transistor M3. In some embodiments, the impurity concentration of the P-type epitaxial layer 31 may be about ¹/₁₀ of the impurity concentration of the P-type well layer 41 of the third transistor M3.

In the fourth transistor M4 of FIG. 19, the source region 64 and the drain region 65 are formed in the surface layer portion of the N-type well layer 39. That is, a channel region is formed in the N-type well layer 39. The channel region of the fourth transistor M4 in FIG. 19 is arranged below the gate insulating film 42 in the N-type well layer 39 and between the source region 64 and the drain region 65. The channel region of the fourth transistor M4 in FIG. 19 includes an interface between the N-type well layer 39 and the gate insulating film 42. Further, the impurity concentration of the channel region of the fourth transistor M4 is equal to the impurity concentration of the N-type well layer 39.

For example, the impurity concentration of the N-type well layer 39 in the fourth transistor M4 of FIG. 19 is lower than the impurity concentration of the N-type well layer 63 (see FIG. 2C) of the sixth transistor M6. In one example, the impurity concentration of the N-type well layer 39 is about ½ or less of the impurity concentration of the N-type well layer 63 of the sixth transistor M6. In some embodiments, the impurity concentration of the N-type well layer 39 is about ¹/₁₀ of the impurity concentration of the N-type well layer 63 of the sixth transistor M6.

[Method of Manufacturing a Transistor]

Next, a method of manufacturing the first transistor M1 and the fourth transistor M4 of FIG. 19 will be described with reference to FIGS. 20A to 20 H. Further, in the method of manufacturing these transistors, since an epitaxial layer forming step, an isolation forming step, and a wiring step are similar to those in the first embodiment, a description thereof will be omitted and a part different from the first embodiment in the well forming step, the gate forming step, and the source/drain forming step will be mainly described.

Figure 20A:
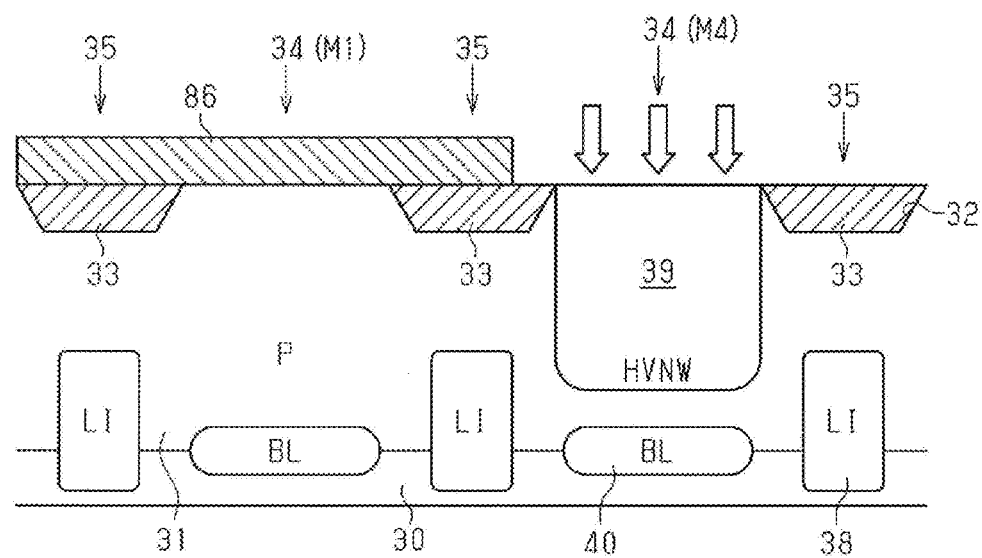
FIG. 20A is a cross-sectional view illustrating a process of manufacturing the first transistor and the fourth transistor.

As illustrated in FIG. 20A, in the well forming step, an N-type well layer 39 is formed in a device forming region 34 corresponding to the fourth transistor M4, while the N-type well layer 39 is not formed in the device forming region 34 corresponding to the first transistor M1. Specifically, an ion implantation mask 86, which covers the device forming region 34 and the device isolation region 35 corresponding to the first transistor M1 while opening the device forming region 34 corresponding to the fourth transistor M4, is formed, and the fourth transistor N-type impurity ions are implanted into each device forming region 34 corresponding to the fourth transistor M4. For example, phosphorus ions are used as the N-type impurity ions. Thereafter, the ion implantation mask 86 is removed.

Figure 20B:
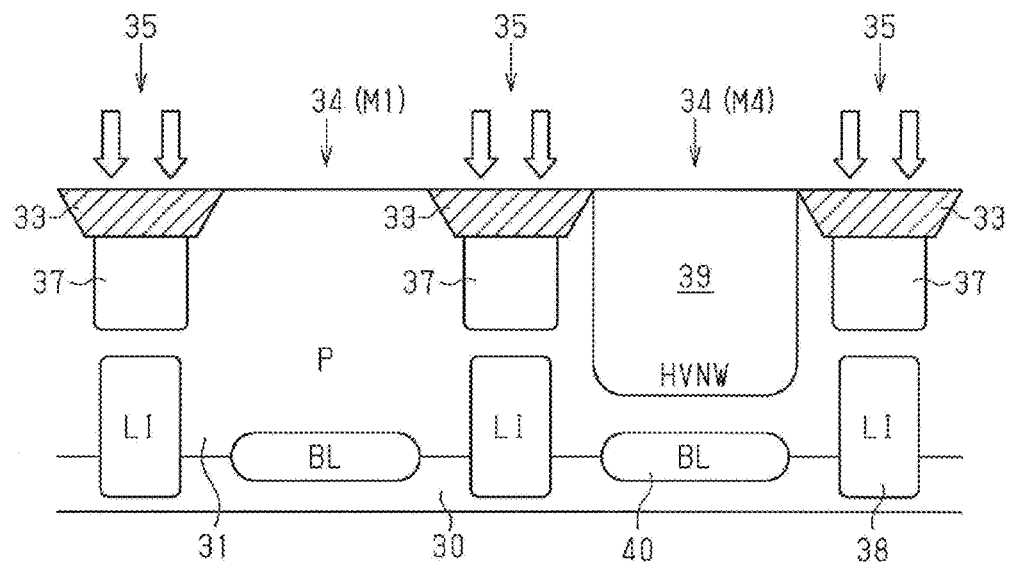
FIG. 20B is a cross-sectional view illustrating a next step of the process of manufacturing each transistor of FIG. 20A.
Figure 20C:
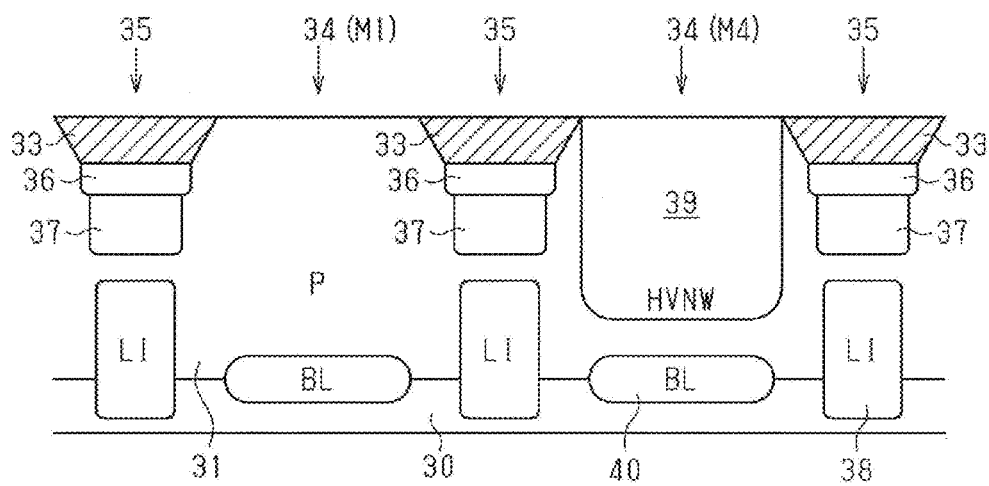
FIG. 20C is a cross-sectional view illustrating a next step of the process of manufacturing each transistor of FIG. 20B.
Figure 20D:
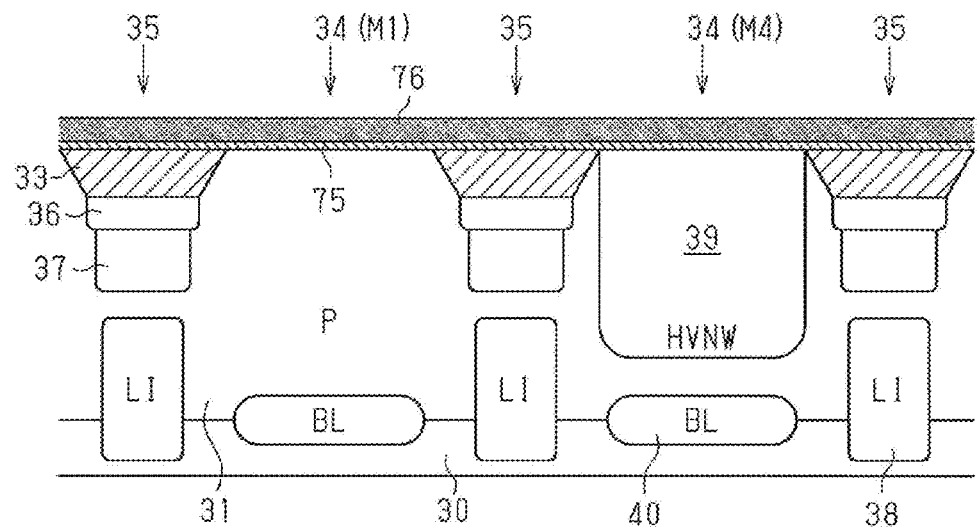
FIG. 20D is a cross-sectional view illustrating a next step of the process of manufacturing each transistor of FIG. 20C.
Figure 20E:
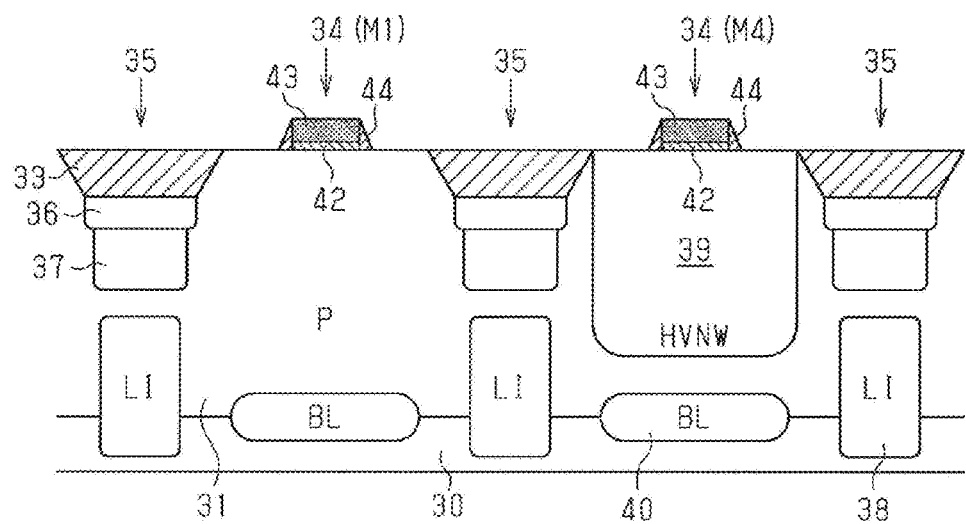
FIG. 20E is a cross-sectional view illustrating a next step of the process of manufacturing each transistor of FIG. 20D.

Next, as illustrated in FIGS. 20B and 20C, as in the first embodiment (see FIG. 3F), a P-type well layer 36 is formed in each device isolation region 35 after the formation of the P-type drift layer 37. Then, as illustrated in FIG. 20D, a thermal oxide film 75 is formed on the surface of each device forming region 34 of the P-type epitaxial layer 31 by, for example, a thermal oxidation method. Subsequently, a polysilicon film 76 is formed so as to cover the thermal oxide film 75 and the silicon oxide film 33. Then, as illustrated in FIG. 20E, unnecessary portions of the thermal oxide film 75 and the polysilicon film 76 are removed in the device forming regions 34 corresponding to the first transistor M1 and the fourth transistor M4 by, for example, photolithography and etching, to form gate insulating films 42 and gate electrodes 43 patterned into a predetermined shape. Then, a nitride film (not shown) is formed on the P-type epitaxial layer 31 by, for example, a CVD method, and thereafter, the nitride film is selectively etched such that a sidewall 44 is formed on the side surface of each of the gate electrodes 43.

Figure 20F:
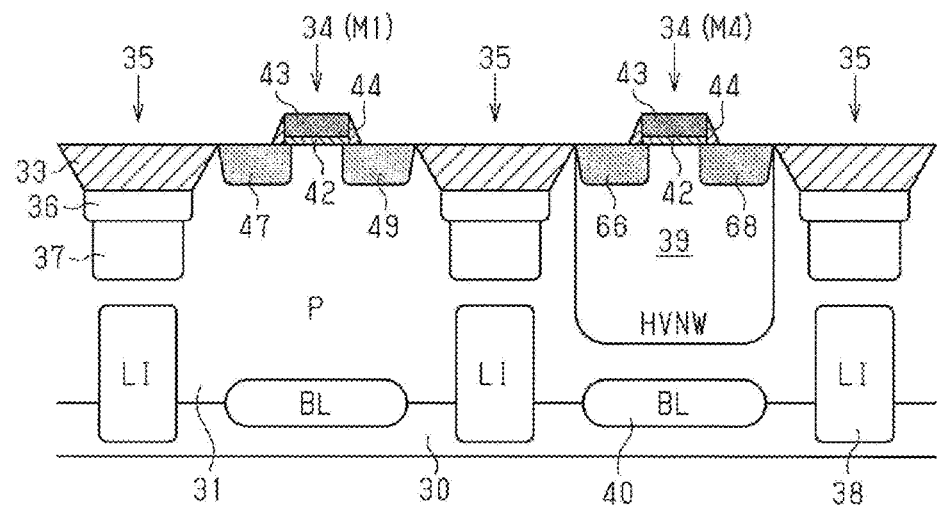
FIG. 20F is a cross-sectional view illustrating a next step of the process of manufacturing each transistor of FIG. 20E.

As illustrated in FIG. 20F, a low concentration source region 47 and a low concentration drain region 49 are formed in the device forming region 34 (the P-type epitaxial layer 31) of the first transistor M1, and a low concentration source region 66 and a low concentration drain region 68 are formed in the device forming region 34 (the N-type well layer 39) of the fourth transistor M4. Specifically, an ion implantation mask (not shown) having an opening that exposes the device forming region 34 of the first transistor M1 is formed so as to cover the device forming region 34 and the device isolation region 35 of the fourth transistor M4. Then, N-type impurity ions are implanted through the opening of the ion implantation mask. Next, the ion implantation mask is removed, and an ion implantation mask (not shown) having an opening that exposes the device forming region 34 (the N-type well layer 39) of the fourth transistor M4 is formed so as to cover the device forming region 34 and the device isolation region 35 of the first transistor M1. Then, P-type impurity ions are implanted through the opening of this ion implantation mask. In this modification, the low concentration source region 66 and the low concentration drain region 68 are formed after the formation of the low concentration source region 47 and the low concentration drain region 49, but the low concentration source region 47 and the low concentration drain region 49 may also be formed after the formation of the low concentration source region 66 and the low concentration drain region 68.

Figure 20G:
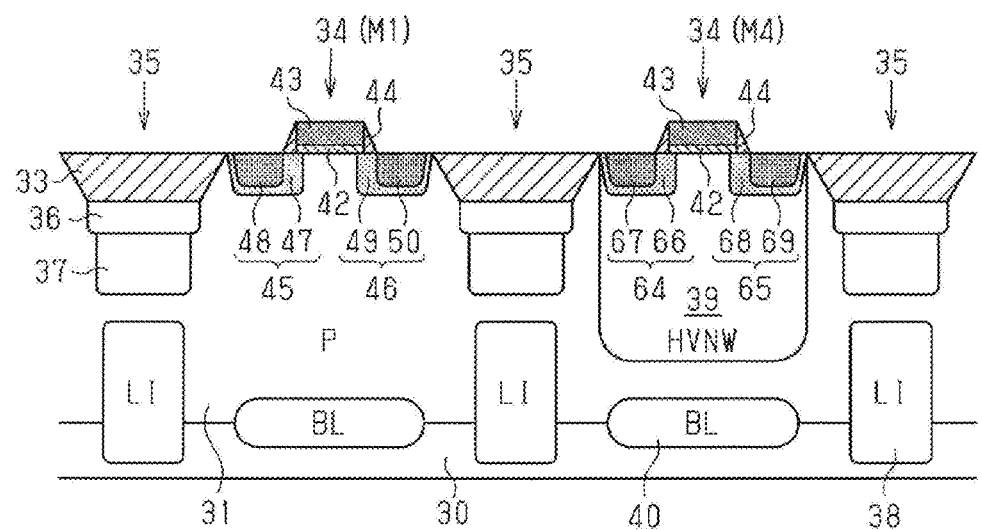
FIG. 20G is a cross-sectional view illustrating a next step of the process of manufacturing each transistor of FIG. 20F.

As illustrated in FIG. 20G, a high concentration source region 48 and a high concentration drain region 50 are formed in the device forming region 34 (the P-type epitaxial layer 31) of the first transistor M1, and a high concentration source region 67 and a high concentration drain region 69 are formed in the device forming region 34 (the N-type well layer 39) of the fourth transistor M4. Specifically, an ion implantation mask (not shown) having an opening that exposes the P-type epitaxial layer 31 in the device forming region 34 of the first transistor M1 is formed so as to cover the N-type well layer 39 and the device isolation region 35 of the device forming region 34 of the fourth transistor M4. Then, N-type impurity ions are implanted through the opening of the ion implantation mask. For example, arsenic ions are used as the N-type impurity ions. Subsequently, the ion implantation mask is removed and an ion implantation mask (not shown) having an opening that exposes the device forming region 34 of the fourth transistor M4 is formed so as to cover the device forming region 34 and the device isolation region 35 of the first transistor M1. Then, P-type impurity ions are implanted through the opening of this ion implantation mask. For example, boron ions are used as the P-type impurity ions. In this modification, the high concentration source region 67 and the high concentration drain region 69 are formed after the formation of the high concentration source region 48 and the high concentration drain region 50, but the high concentration source region 48 and the high concentration drain region 50 may also be formed after the formation of the high concentration source region 67 and the high concentration drain region 69.

Figure 20H:
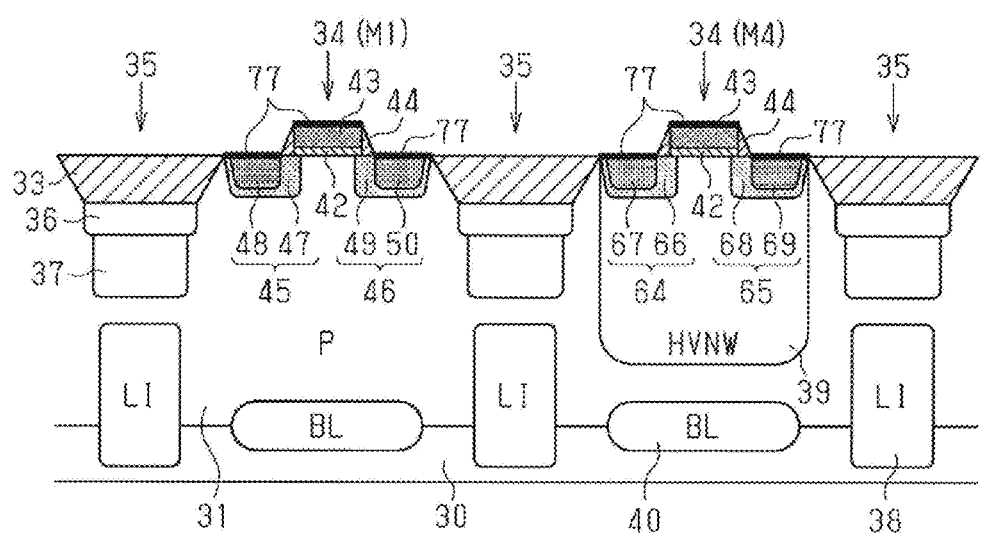
FIG. 20H is a cross-sectional view illustrating a next step of the process of manufacturing each transistor of FIG. 20G.

As illustrated in FIG. 20H, silicide layers 77 are formed on the surfaces of the high concentration source region 48, the high concentration drain region 50, and the gate electrode 43 formed in the device forming region 34 (the P-type epitaxial layer 31) of the first transistor M1. In addition, silicide layers 77 are formed on the surfaces of the high concentration source region 67, the high concentration drain region 69, and the gate electrode 43 formed in the device forming region 34 (the N-type well layer 39) of the fourth transistor M4. Specifically, after a cobalt film (not shown) is formed in the area of the P-type epitaxial layer 31 by, for example, a PVD method, heat treatment is performed. Accordingly, the cobalt films of the high concentration source regions 48 and 67, the high concentration drain regions 50 and 69, and the gate electrode 43 in the respective device forming regions 34 are modified into the silicide layers 77, while the cobalt films on the silicon oxide films 33 in the respective device isolation regions 35 remain cobalt. Then, the cobalt on each of the silicon oxide films 33 is selectively removed by, for example, chemical treatment.

In the modification of FIG. 19, the structure may be modified to have the same structure as each of the transistors M1, M2, M4, and M5 of the third embodiment. That is, in the first transistor M1 of FIG. 19, a buried channel layer (not shown) may be formed in the P-type epitaxial layer 31. The buried channel layer is a region (layer) having the same conductivity type as that of the source region 45 and the drain region 46. That is, the buried channel layer is a region (layer) having the same N type as the source region 45 and the drain region 46 doped with an N-type impurity. The channel region (the buried channel layer) of the first transistor M1 includes no interface between the P-type epitaxial layer 31 and the gate insulating film 42. Furthermore, the impurity concentration of the channel region (the buried channel layer) of the first transistor M1 is higher than the impurity concentration of the P-type epitaxial layer 31. The second transistor M2 also has the same configuration as the first transistor M1.

In addition, in the fourth transistor M4 of FIG. 19, a buried channel layer (not shown) may be formed in the N-type well layer 39. The buried channel layer is a region (layer) having the same conductivity type as that of the source region 64 and the drain region 65. That is, the buried channel layer is a P-type region (layer) that is the same as the source region 64 and the drain region 65 doped with a P-type impurity. The channel region (buried channel layer) of the fourth transistor M4 includes no interface between the N-type well layer 39 and the gate insulating film 42. Furthermore, the impurity concentration of the channel region (the buried channel layer) of the fourth transistor M4 is higher than the impurity concentration of the N-type well layer 39. The fifth transistor M5 also has the same configuration as the fourth transistor M4.

<Aspects of the Present Disclosure>

Next, some aspects of the present disclosure that can be derived from the embodiments and the modifications described above will be additionally stated as supplementary notes.

(Supplementary Note A1)

There is provided an integrated circuit including a plurality of miniaturized transistors,
  wherein the plurality of transistors include:
  buried channel type MOSFETs; and
  surface channel type MOSFETs, and
  wherein the buried channel type MOSFETs are used for transistors which are more likely to be affected by a 1/f noise of the integrated circuit than the surface channel type MOSFETs.

(Supplementary Note A2)

In the circuit of Supplementary Note A1, the integrated circuit includes an operational amplifier,
  the operational amplifier includes a differential pair, and
  transistors constituting the differential pair, among the plurality of transistors, are the buried channel type MOSFETs.

(Supplementary Note A3)

In the circuit of Supplementary Note A1 or A2, the operational amplifier includes a current mirror circuit, and
  transistors constituting the current mirror circuit, among the plurality of transistors, are the buried channel type MOSFETs.

(Supplementary Note A4)

In the circuit of Supplementary Note A3, the transistors constituting the current mirror circuit are enhancement type MOSFETs.

(Supplementary Note A5)

In the circuit of any one of Supplementary Notes A2 to A4, the operational amplifier includes a last stage, and
  transistors constituting the last stage, among the plurality of transistors, are the surface channel type MOSFETs.

(Supplementary Note A6)

In the circuit of any one of Supplementary Notes A2 to A5, the operational amplifier includes a tail current source, and
  a transistor constituting the tail current source, among the plurality of transistors, is the surface channel type MOSFET.

(Supplementary Note A7)

In the circuit of any one of Supplementary Notes A2 to A6, the operational amplifier includes a constant current circuit, and
  transistors constituting a current source of the constant current circuit, among the plurality of transistors, are the buried channel type MOSFETs.

(Supplementary Note A8)

In the circuit of Supplementary Note A7, the transistors constituting the current source of the constant current circuit are enhancement type MOSFETs.

(Supplementary Note A9)

In the circuit of any one of Supplementary Notes A2 to A8, the differential pair includes a first differential pair and a second differential pair,
  the operational amplifier further includes a current switching part that switches between a supply of current to the first differential pair and a supply of current to the second differential pair, and
  transistors constituting the current switching part, among the plurality of transistors, are the buried channel type MOSFETs.

(Supplementary Note B1)

There is provided an integrated circuit including a plurality of miniaturized transistors, wherein the plurality of transistors include:
buried channel type MOSFETs; and
surface channel type MOSFETs, and
wherein impurity concentrations of channel regions in the buried channel type MOSFETs are lower than impurity concentrations of channel regions in the surface channel type MOSFETs.

(Supplementary Note B2)

In the circuit of Supplementary Note B1, transistors which are likely to be affected by a 1/f noise of the integrated circuit, among the plurality of transistors, are the buried channel type MOSFETs, and transistors which are unlikely to be affected by the 1/f noise of the integrated circuit, among the plurality of transistors, are the surface channel type MOSFETs.

(Supplementary Note B3)

In the circuit of Supplementary Note B1 or B2, the integrated circuit includes an operational amplifier,
the operational amplifier includes a differential pair, and
transistors constituting the differential pair, among the plurality of transistors, are the buried channel type MOSFETs.

(Supplementary Note B4)

In the circuit of Supplementary Note B3, the operational amplifier includes a current mirror circuit, and
transistors constituting the current mirror circuit, among the plurality of transistors, are the buried channel type MOSFETs.

(Supplementary Note B5)

In the circuit of Supplementary Note B4, the transistors constituting the current mirror circuit are enhancement type MOSFETs.

(Supplementary Note B6)

In the circuit of Supplementary Note B4 or B5, the transistors constituting the differential pair and the transistors constituting the current mirror circuit are the buried channel type MOSFETs having the same conductivity type.

(Supplementary Note B7)

In the circuit of any one of Supplementary Notes B3 to B6, the operational amplifier includes a last stage, and
transistors constituting the last stage, among the plurality of transistors, are the surface channel type MOSFETs.

(Supplementary Note B8)

In the circuit of any one of Supplementary Notes B3 to B7, the operational amplifier includes a tail current source, and
a transistor constituting the tail current source, among the plurality of transistors, is the surface channel type MOSFET.

(Supplementary Note B9)

In the circuit of Supplementary Note B8, the transistor constituting the tail current source and the transistors constituting the last stage are the surface channel type MOSFETs having the same conductivity type.

(Supplementary Note B10)

In the circuit of any one of Supplementary Notes B3 to 9, the operational amplifier includes a constant current circuit, and
transistors constituting a current source of the constant current circuit, among the plurality of transistors, are the buried channel type MOSFETs.

(Supplementary Note B11)

In the circuit of Supplementary Note B10, the transistors constituting the current source of the constant current circuit are enhancement type MOSFETs.

(Supplementary Note B12)

In the circuit of Supplementary Note B10 or B11, the transistors constituting the current source of the constant current circuit and the transistors constituting the differential pair are the buried channel type MOSFETs having the same conductivity type.

(Supplementary Note B13)

In the circuit of any one of Supplementary Notes B3 to B12, the differential pair includes a first differential pair and a second differential pair,
the operational amplifier further includes a current switching part that switches between a supply of current to the first differential pair and a supply of current to the second differential pair, and
transistors constituting the current switching part, among the plurality of transistors, are the buried channel type MOSFETs.

(Supplementary Note B14)

In the circuit of Supplementary Note B13, the transistors constituting the current switching part are enhancement type MOSFETs.

(Supplementary Note B15)

In the circuit of Supplementary Note B13 or B14, any one of the transistors constituting the current switching part, transistors constituting the first differential pair, and transistors constituting the second differential pair is the buried channel type MOSFETs having the same conductivity type.

(Supplementary Note B16)

In the circuit of any one of Supplementary Notes B1 to B15, the impurity concentrations of the channel regions in the buried channel type MOSFETs are about ½ of the impurity concentrations of the channel regions in the surface channel type MOSFETs.

According to integrated circuit and the method of manufacturing the integrated circuit of the present disclosure in some embodiments, it is possible to reduce the 1/f noise.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An integrated circuit comprising:
a plurality of miniaturized transistors, the plurality of miniaturized transistors including: high concentration transistors which include channel regions having impurity concentrations of a first concentration; and low concentration transistors which include channel regions having impurity concentrations of a second concentration lower than the first concentration,
wherein the low concentration transistors are used for transistors which are more likely to be affected by a 1/f noise of the integrated circuit, among the plurality of transistors, than the high concentration transistors.

2. The integrated circuit of claim 1, wherein a shallow trench isolation (STI) structure is used in the plurality of transistors.

3. An integrated circuit comprising:
a plurality of miniaturized transistors, the plurality of miniaturized transistors including: high concentration transistors which include channel regions having impurity concentrations of a first concentration; and low concentration transistors which include channel regions having impurity concentrations of a second concentration lower than the first concentration; and
an operational amplifier,
wherein the operational amplifier includes a differential pair, and
wherein transistors constituting the differential pair are the low concentration transistors among the plurality of transistors.

4. The integrated circuit of claim 3, wherein the operational amplifier includes a current mirror circuit, and
wherein transistors constituting the current mirror circuit are the low concentration transistors among the plurality of transistors.

5. The integrated circuit of claim 4, wherein the low concentration transistors constituting the current mirror circuit are enhancement type MOSFETs.

6. The integrated circuit of claim 3, wherein the operational amplifier includes a last stage, and
wherein transistors constituting the last stage are the high concentration transistors among the plurality of transistors.

7. The integrated circuit of claim 3, wherein the operational amplifier includes a tail current source, and
wherein a transistor constituting the tail current source is the high concentration transistor among the plurality of transistors.

8. The integrated circuit of claim 6, wherein the operational amplifier includes a tail current source,
wherein a transistor constituting the tail current source is the high concentration transistor among the plurality of transistors, and
wherein the transistor constituting the tail current source and the transistors constituting the last stage are the high concentration transistors having the same conductivity type.

9. The integrated circuit of claim 3, wherein the operational amplifier includes a
wherein transistors constituting a current source of the constant current circuit are the low concentration transistors among the plurality of transistors.

10. The integrated circuit of claim 9, wherein the low concentration transistors constituting the current source of the constant current circuit are enhancement type MOSFETs.

11. The integrated circuit of claim 9, wherein the transistors constituting the current source of the constant current circuit and the transistors constituting the differential pair are the low concentration transistors having the same conductivity type.

12. The integrated circuit of claim 3, wherein the differential pair includes a first differential pair and a second differential pair,
wherein the operational amplifier further includes a current switch that switches between a supply of current to the first differential pair and a supply of current to the second differential pair, and
wherein transistors constituting the current switch are the low concentration transistors among the plurality of transistors.

13. The integrated circuit of claim 12, wherein the low concentration transistors constituting the current switch are enhancement type MOSFETs.

14. The integrated circuit of claim 12, wherein any one of the transistors constituting the current switch, transistors constituting the first differential pair, and transistors constituting the second differential pair is the low concentration transistors having the same conductivity type.

15. An integrated circuit comprising:
a plurality of miniaturized transistors, the plurality of miniaturized transistors including: high concentration transistors which include channel regions having impurity concentrations of a first concentration; and low concentration transistors which include channel regions having impurity concentrations of a second concentration lower than the first concentration,
wherein the plurality of transistors includes: buried channel type MOSFETs; and surface channel type MOSFETs, and
wherein the buried channel type MOSFETs are used for transistors which are more likely to be affected by the 1/f noise of the integrated circuit than the surface channel type MOSFETs.

16. The integrated circuit of claim 15 further comprising an operational amplifier,
wherein the operational amplifier includes a differential pair, and
wherein transistors constituting the differential pair are the buried channel type MOSFETs among the plurality of transistors.

17. The integrated circuit of claim 16, wherein the operational amplifier includes a current mirror circuit, and
wherein transistors constituting the current mirror circuit are the buried channel type MOSFETs among the plurality of transistors.

18. The integrated circuit of claim 17, wherein the transistors constituting the current mirror circuit are enhancement type MOSFETs.

19. The integrated circuit of claim 16, wherein the operational amplifier includes a last stage, and
wherein transistors constituting the last stage are the surface channel type MOSFETs among the plurality of transistors.

20. The integrated circuit of claim 16, wherein the operational amplifier includes a tail current source, and
wherein a transistor constituting the tail current source is the surface channel type MOSFET among the plurality of transistors.

21. The integrated circuit of claim 16, wherein the operational amplifier includes a constant current circuit, and
wherein transistors constituting a current source of the constant current circuit are the buried channel type MOSFETs among the plurality of transistors.

22. The integrated circuit of claim 21, wherein the transistors constituting the current source of the constant current circuit are enhancement type MOSFETs.

23. The integrated circuit of claim 16, wherein the differential pair includes a first differential pair and a second differential pair,
wherein the operational amplifier further includes a current switch that switches between a supply of current to the first differential pair and a supply of current to the second differential pair, and
wherein transistors constituting the current switch are the buried channel type MOSFETs among the plurality of transistors.

24. A method of manufacturing an integrated circuit including a plurality of transistors including a first transistor and a second transistor which are miniaturized, the method comprising:
selectively performing an ion implantation such that impurity ions are implanted into a region where the first transistor is formed while no impurity ions are implanted into a region where the second transistor is formed in a semiconductor substrate, to form a first channel region in the region where the first transistor is formed; and selectively performing an ion implantation such that impurity ions are implanted into the region where the second transistor is formed while no impurity ions are implanted into the region where the first transistor is formed in the semiconductor substrate, to form a second channel region in the region where the second transistor is formed, wherein an impurity concentration of the first channel region is set lower than an impurity concentration of the second channel region, wherein the integrated circuit includes an operational amplifier, wherein the operational amplifier includes a differential pair, wherein the first transistor includes transistors constituting the differential pair, and wherein the first channel region includes channel regions of the transistors constituting the differential pair.

25. The method of claim 24, wherein the operational amplifier includes a current mirror circuit, wherein the first transistor includes transistors constituting the current mirror circuit, and wherein the first channel region includes channel regions of the transistors constituting the current mirror circuit.

26. The method of claim 24, wherein the operational amplifier includes a last stage, wherein the second transistor includes transistors constituting the last stage, and wherein the second channel region includes channel regions of the transistors constituting the last stage.

27. The method of claim 24, wherein the operational amplifier includes a tail current source, wherein the second transistor includes a transistor constituting the tail current source, and wherein the second channel region includes a channel region of the transistor constituting the tail current source.

28. The method of claim 24, wherein the operational amplifier includes a constant current circuit, wherein the first transistor includes transistors constituting a current source of the constant current circuit, and wherein the first channel region includes channel regions in the transistors constituting the current source of the constant current circuit.

29. The method of claim 24, wherein the differential pair includes a first differential pair and a second differential pair, wherein the operational amplifier further includes a current switch that switches between a supply of current to the first differential pair and a supply of current to the second differential pair, wherein the first transistor includes transistors constituting the current switch, and wherein the first channel region includes channel regions in the transistors constituting the current switch.

30. The method of claim 25, further comprising:

implanting impurity ions into a region where some of the plurality of transistors are formed in the semiconductor substrate to form a buried channel layer, wherein, in the act of implanting impurity ions into the region where some of the plurality of transistors are formed in the semiconductor substrate to form the buried channel layer, the buried channel layer is formed by implanting impurity ions into a region where the transistors constituting the differential pair and the current mirror circuit are formed.

31. The method of claim 28, further comprising:

implanting impurity ions into a region where some of the plurality of transistors are formed in the semiconductor substrate to form a buried channel layer, wherein in the act of implanting impurity ions into the region where some of the plurality of transistors is formed in the semiconductor substrate to form the buried channel layer, the buried channel layer is formed by implanting impurity ions into a region where transistors constituting the current source of the constant current circuit are formed.

32. The method of claim 29, further comprising:

implanting impurity ions into a region where some of the plurality of transistors are formed in the semiconductor substrate to form a buried channel layer, wherein in the act of implanting impurity ions into the region where some of the plurality of transistors are formed in the semiconductor substrate to form the buried channel layer, the buried channel layer is formed by implanting impurity ions into a region where the transistors constituting the current switch are formed.

* * * * *